(12) United States Patent
de Corral

(10) Patent No.: US 9,143,162 B2
(45) Date of Patent: Sep. 22, 2015

(54) TECHNIQUES FOR COMPRESSING MASS SPECTROMETRY DATA IN REAL-TIME

(71) Applicant: Waters Technologies Corporation, Milford, MA (US)

(72) Inventor: Jose de Corral, Grafton, MA (US)

(73) Assignee: Waters Technologies Corporation, Milford, MA (US)

(*) Notice: Subject to any disclaimer, the term of this patent is extended or adjusted under 35 U.S.C. 154(b) by 0 days.

(21) Appl. No.: 14/526,574

(22) Filed: Oct. 29, 2014

(65) Prior Publication Data

US 2015/0123825 A1  May 7, 2015

Related U.S. Application Data

(60) Provisional application No. 61/900,207, filed on Nov. 5, 2013, provisional application No. 61/920,918, filed on Dec. 26, 2013.

(51) Int. Cl.
  *H03M 7/30* (2006.01)
  *H01J 49/26* (2006.01)

(52) U.S. Cl.
  CPC . *H03M 7/30* (2013.01); *H01J 49/26* (2013.01)

(58) Field of Classification Search
  CPC .................. H03M 7/30; H01J 49/26
  See application file for complete search history.

(56) References Cited

U.S. PATENT DOCUMENTS

| | | | | |
|---|---|---|---|---|
| 5,428,357 A | * | 6/1995 | Haab et al. | 341/155 |
| 5,995,989 A | * | 11/1999 | Gedcke et al. | 708/300 |
| 8,140,300 B2 | * | 3/2012 | Dunne et al. | 702/186 |
| 8,634,072 B2 | * | 1/2014 | Trainer | 356/335 |
| 8,761,465 B2 | * | 6/2014 | Hunt et al. | 382/128 |
| 2008/0221711 A1 | * | 9/2008 | Trainer | 700/54 |
| 2013/0080073 A1 | * | 3/2013 | de Corral | 702/23 |

FOREIGN PATENT DOCUMENTS

| | | |
|---|---|---|
| WO | WO 2005/079263 A2 | 9/2005 |
| WO | WO 2006/133191 A2 | 12/2006 |
| WO | WO 2007/140327 A2 | 12/2007 |
| WO | WO 2013/144642 A2 | 10/2013 |

* cited by examiner

*Primary Examiner* — Howard Williams
(74) *Attorney, Agent, or Firm* — Muirhead and Saturnelli, LLC

(57) ABSTRACT

Techniques are described for performing data compression of a first data set including data points in a plurality of dimensions. First processing is performed to determine a second set of final sums. For each data point in the first data set, a corresponding final sum of the second set is determined that is a sum of intensities associated with a first portion of data points, wherein the first portion of data points for which the intensities are summed for said each data point are included within a geometric shape centered on said each data point. Second processing is performed to determine a final set of final combined keep values. Each of the final combined keep values corresponds to a different one of the data points in the first data set and denotes whether to keep or otherwise remove the different one of the data points from the first data set.

34 Claims, 29 Drawing Sheets

TECHNIQUES FOR COMPRESSING MASS SPECTROMETRY DATA IN REAL-TIME

CROSS REFERENCE TO RELATED APPLICATIONS

This application claims priority to U.S. Provisional Application No. 61/900,207, filed Nov. 5, 2013 and U.S. Provisional Application No. 61/920,918, filed Dec. 26, 2013, both of which are hereby incorporated by reference herein.

TECHNICAL FIELD

This application generally relates to techniques for data compression.

BACKGROUND INFORMATION

Mass spectrometry (MS) is used widely for identifying and quantifying molecular species in a sample. During analysis, molecules from the sample are ionized to form ions. A detector produces a signal relating to the mass of the molecule and charge carried on the molecule and a mass-to-charge ratio (m/z) for each of the ions is determined.

A chromatographic separation technique may be performed prior to injecting the sample into a mass spectrometer. Chromatography is a technique for separating compounds, such as those held in solution, where the compounds will exhibit different affinity for a separation medium in contact with the solution. As the solution flows through such an immobile medium, the compounds separate from one another. Common chromatographic separation instruments include gas chromatographs (GC) and liquid chromatographs (LC). When coupled to a mass spectrometer, the resulting systems are referred to as GC/MS or LC/MS systems. GC/MS or LC/MS systems are typically on-line systems in which the output of the GC or LC is coupled directly to the MS.

In an LC/MS system, a sample is injected into the liquid chromatograph at a particular time. The liquid chromatograph causes the sample to elute over time resulting in an eluent that exits the liquid chromatograph. The eluent exiting the liquid chromatograph is continuously introduced into the ionization source of the mass spectrometer. As the separation progresses, the composition of the mass spectrum generated by the MS evolves and reflects the changing composition of the eluent.

Mass spectral data is typically generated by the impact of ions on the one or more ion detectors of the MS instrument, which provide signals which can be processed to provide information as to the mass to charge (m/z) ratios and the number of ions (e.g. by the intensity of the ion count) at a particular m/z, the information typically being provided in the form of a mass spectrum. Mass spectra may be further analysed to elucidate structural information about the compounds analysed.

Typically, at regularly spaced time intervals, a computer-based system samples and records the spectrum. The response (or intensity) of an ion is the height or area of the peak as may be seen in the spectrum. The spectra generated by conventional LC/MS systems may be further analyzed. Mass or mass-to-charge (m/z) ratio estimates for an ion are derived through examination of a spectrum that contains the ion. Chromatographic retention time estimates for an ion are derived by examination of a chromatogram that contains the ion.

Two stages of mass analysis (MS/MS also referred to as tandem mass spectrometry) may also be performed. One particular mode of MS/MS is known as product ion scanning where parent or precursor ions of a particular m/z value are selected in the first stage of mass analysis by a first mass filter/analyzer. The selected precursor ions are then passed to a collision cell where they are fragmented to produce product or fragment ions. The product or fragment ions are then mass analyzed by a second mass filter/analyzer.

In connection with sample analysis, ion mobility spectrometry (IMS) may be used in combination with MS. The foregoing may be denoted as IMS-MS or IMS/MS for the combination of ion mobility spectrometry and mass spectrometry. Such an analyzer included in a system performing IMS/MS may include first separating ions according to their mobilities (IMS) followed by the mass analyzer separating ions according to their mass to charge (m/z) ratio (e.g., followed by MS). Chromatographic separation, such as by LC or GC, may be performed prior to and coupled with IMS/MS. Such experiments using LC and GC may be, respectively, be referred to as performing LC/IMS/MS and GC/IMS/MS.

SUMMARY OF THE INVENTION

In accordance with one aspect of the invention is a method of performing data compression comprising: receiving a first data set including a plurality of data points in a plurality of dimensions, wherein each data point in the first data set has an associated intensity; performing first processing to determine a second set of final sums for the plurality of data points in the first data set, wherein, for each data point in the first data set, a corresponding final sum of the second set is determined that is a sum of intensities associated with a first portion of data points, wherein the first portion of data points for which the intensities are summed for said each data point are included within a geometric shape centered on said each data point, the first processing further including: for each of the plurality of dimensions, determining a plurality of partial sums; and performing second processing to determine a final set of final combined keep values, wherein each of the final combined keep values in the final set corresponds to a different one of the plurality of data points in the first data set and denotes whether to keep or otherwise remove said different one of the plurality of data points from the first data set, the second processing further including: for each of the plurality of dimensions, determining a plurality of combined keep values. The first processing may include determining, in parallel, a first plurality of first partial sums for a first of the plurality of dimensions; and determining, in parallel, a second plurality of second partial sums for a second of the plurality of dimensions, and wherein, the plurality of dimensions is two and said second plurality of partial sums is used as the second set of final sums. The first processing may include determining, in parallel, a first plurality of first partial sums for a first of the plurality of dimensions; determining, in parallel, a second plurality of second partial sums for a second of the plurality of dimensions; and determining, in parallel, a third plurality of third partial sums for a third of the plurality of dimensions, and wherein, the plurality of dimensions is three and the third plurality of partial sums is used as the second set of final sums. The second processing may include determining, in parallel, a first plurality of first combined keep values for a first of the plurality of dimensions; and determining, in parallel, a second plurality of second combined keep values for a second of the plurality of dimensions, and wherein, the plurality of dimensions is two and the second plurality of combined keep values is used as the final set of final keep values. The second processing may include determining, in parallel, a first plurality of first combined keep values for a first of the plurality of dimensions; determining, in parallel, a second plurality of second combined keep values for a second of the plurality of dimensions; and determining, in parallel, a third plurality of third combined keep values for a third of the plurality of dimensions, and wherein, the plurality of dimensions is three and the third plurality of combined keep values is used as the final set of final keep values. The method may include determining a third set of initial keep values for the second set of sums, wherein for each sum in the second set corresponding to one of the data points of the first data set, a corresponding initial keep value of the third set denotes whether said each sum in the second set of sums exceeds a threshold, wherein a first set of keep values for a first of the plurality of dimensions is determined using initial keep values including those of the third set.

In accordance with another aspect of the invention is an apparatus comprising: a plurality of analytical modules; a control unit in communication with the plurality of analytical modules, the control unit comprising a processor and a memory for storing a plurality of instructions which, when executed by the processor, causes execution of a method comprising: receiving a first data set including a plurality of data points in a plurality of dimensions, wherein each data point in the first data set has an associated intensity; performing first processing to determine a second set of final sums for the plurality of data points in the first data set, wherein, for each data point in the first data set, a corresponding final sum of the second set is determined that is a sum of intensities associated with a first portion of data points, wherein the first portion of data points for which the intensities are summed for said each data point are included within a geometric shape centered on said each data point, the first processing further including: for each of the plurality of dimensions, determining a plurality of partial sums; and performing second processing to determine a final set of final combined keep values, wherein each of the final combined keep values in the final set corresponds to a different one of the plurality of data points in the first data set and denotes whether to keep or otherwise remove said different one of the plurality of data points from the first data set, the second processing further including: for each of the plurality of dimensions, determining a plurality of combined keep values. The plurality of analytical modules may include a chromatography module, an ion-mobility module, and a mass spectrometry module. The first data set may be included in a raw data set generated as a result of performing an experiment to analyze a sample using at least the chromatography module and the mass spectrometry module.

In accordance with another aspect of the invention is a method of performing data compression comprising: receiving a first data set including a plurality of data points in a plurality of dimensions, wherein each data point in the first data set has an associated intensity; determining a second set of sums for the plurality of data points in the first data set, wherein, for each data point in the first data set, a corresponding sum of the second set is determined that is a sum of intensities associated with a first portion of data points, wherein the first portion of data points for which the intensities are summed for said each data point are included within a geometric shape centered on said each data point; performing first processing to determine a final set of final combined keep values, wherein each of the final combined keep values in the final set corresponds to a different one of the plurality of data points in the first data set and denotes whether to keep or otherwise remove said different one of the plurality of data points from the first data set, the first processing further including: determining a third set of initial keep values for the second set of sums, wherein for each sum in the second set corresponding to one of the data points of the first data set, a corresponding initial keep value of the third set denotes whether said each sum in the second set of sums exceeds a threshold; and for a first of the plurality of dimensions, determining a first plurality of first combined keep values using initial keep values including those of the third set, wherein each of the first plurality of first combined keep values is associated with a corresponding one of the data points of the first data set, wherein said each first combined keep value associated with the corresponding one data point of the first set represents a combination of initial keep values associated with data points which are included in a line segment that is oriented along the first dimension and is centered on the corresponding one of the data points of the first set; and for a second of the plurality of dimensions, determining a second plurality of second combined keep values using first combined keep values including the first plurality of first combined keep values, wherein each of the second plurality of second combined keep values is associated with a corresponding one of the data points of the first data set, wherein said each second combined keep value associated with the corresponding one data point of the first set represents a combination of first combined keep values associated with data points which are included in a line segment that is oriented along the second dimension and is centered on the corresponding one of the data points of the first set. The method may include performing second processing in parallel for each final combined keep value in the final set corresponding to a different one of the plurality of data points in the first data set. The second processing may include determining whether said each final combined keep value is greater than zero, and if not, determining that said different one of the plurality of data points is removed from the first set. The plurality of dimensions may be two and the second plurality of second combined keep values may be used as the final set of final combined keep values. The plurality of dimensions may be three and the method may also include determining, using second combined keep values including the second plurality of second combined keep values, a third plurality of third combined keep values for a third of the plurality of dimensions. The third plurality of third combined keep values may be used as the final set of final combined keep values. Determining the first plurality of first combined keep values may include performing processing to determine, in parallel, at least a portion of the first plurality of first combined keep values for the first dimension. Determining the second plurality of second combined keep values may include performing processing to determine, in parallel, at least a portion of the second plurality of second combined keep values for the second dimension. The third set of keep values may be determined in parallel in the step of determining the third set of keep values. The geometric shape may be any of a rectangle and a rectangular prism. The plurality of dimensions of the first data set may be at least two and may include a first dimension representing mass and a second dimension representing chromatographic retention time. The first data set may include data produced as a result of performing an experiment for analyzing a sample that includes performing a chromatographic separation and mass spectral analysis. The plurality of dimensions of the first data set may be at least three and may further include a third dimension representing drift time. The experiment may further include performing ion mobility spectrometry. The first data set may be a raw data set produced by an instrument used in performing the experiment. Determining the second set of sums for the plurality of data points in the first data set may further include determining, for each of the plurality of dimensions, a plurality of partial sums in parallel for data points of the first data set. Determining the second set of sums for the plurality of data points in the first data set may further include: determining, in parallel, a first plurality of first partial sums, wherein each of the first plurality of first partial sums is a first partial sum for a different one of the plurality of data points of the first set, wherein the first partial sum for said different one of the plurality of data points of the first set is a sum of intensities associated with data points of the first portion that are included in a line segment of the geometric shape centered on said each data point whereby the line segment is oriented along a first of the plurality of dimensions; and determining, in parallel, a second plurality of second partial sums using first partial sums including the first plurality of first partial sums, wherein each of the second plurality of second partial sums is a second partial sum for a different one of the plurality of data points of the first set, wherein the second partial sum for said different one of the plurality of data points of the first set is a sum of first partial sums associated with data points of the first portion that are included in a line segment of the geometric shape centered on said each data point whereby the line segment is oriented along a second of the plurality of dimensions. The plurality of dimensions may be two and the second plurality of partial sums may be the second set of sums. The plurality of dimensions may be three and the method may include determining, in parallel, a third plurality of third partial sums using second partial sums including the second plurality of second partial sums, wherein each of the third plurality of third partial sums is a third partial sum for a different one of the plurality of data points of the first set, wherein the third partial sum for said different one of the plurality of data points of the first set is a sum of second partial sums associated with data points of the first portion that are included in a line segment of the geometric shape centered on said each data point whereby the line segment is oriented along a third of the plurality of dimensions, the third plurality of partial sums being used as the second set of sums. Each of the plurality of combined keep values for said each dimension may be determined by adding keep values. Each of the plurality of combined keep values for said each dimension may be determined by performing a logical OR operation of keep values. The first data set may correspond to a first mass sector having a first corresponding mass range, the first mass sector being one of a plurality of mass sectors included in a first scan pack of a plurality of scan packs, each of the plurality of scan packs including a plurality of scans of data generated from performing the experiment. The method may include extracting, from the first scan pack of the plurality of scan packs, the plurality of mass sectors each having a corresponding mass range. Each mass sector of the plurality of mass sectors may be stored in a first memory of a computer and the method may further comprise: reading from the first memory one of the mass sectors of the plurality of mass sectors, wherein the reading is performed by executing code on a processing unit of the computer whereby the processing unit executes instructions serially, copying the one mass sector into a second memory of a device, the device including a second processing unit that performs parallel processing, wherein the second memory is configured for use by the second processing unit when performing parallel processing and wherein the first memory is not configured for use by the second processing unit; determining, using the second processing unit and the one mass sector stored in the second memory, which one or more data points of the one mass sector are removed from the first data set thereby generating a compressed form of data points of the one mass sector; and copying the compressed form of the data points of the one mass sector from the second memory to the first memory. The second processing unit may be a graphics processing unit. The second processing unit may executed code that performs processing including said determining the second set of sums for the plurality of data points in the first data set, said determining the third set of keep values for the second set of sums, said first processing and said second processing.

In accordance with another aspect of the invention is an apparatus comprising: a plurality of analytical modules; a control unit in communication with the plurality of analytical modules, the control unit comprising a processor and a memory for storing a plurality of instructions which, when executed by the processor, causes execution of a method comprising: receiving a first data set including a plurality of data points in a plurality of dimensions, wherein each data point in the first data set has an associated intensity; determining a second set of sums for the plurality of data points in the first data set, wherein, for each data point in the first data set, a corresponding sum of the second set is determined that is a sum of intensities associated with a first portion of data points, wherein the first portion of data points for which the intensities are summed for said each data point are included within a geometric shape centered on said each data point; performing first processing to determine a final set of final combined keep values, wherein each of the final combined keep values in the final set corresponds to a different one of the plurality of data points in the first data set and denotes whether to keep or otherwise remove said different one of the plurality of data points from the first data set, the first processing further including: determining a third set of initial keep values for the second set of sums, wherein for each sum in the second set corresponding to one of the data points of the first data set, a corresponding initial keep value of the third set denotes whether said each sum in the second set of sums exceeds a threshold; and for a first of the plurality of dimensions, determining a first plurality of first combined keep values using initial keep values including those of the third set, wherein each of the first plurality of first combined keep values is associated with a corresponding one of the data points of the first data set, wherein said each first combined keep value associated with the corresponding one data point of the first set represents a combination of initial keep values associated with data points which are included in a line segment that is oriented along the first dimension and is centered on the corresponding one of the data points of the first set; and for a second of the plurality of dimensions, determining a second plurality of second combined keep values using first combined keep values including the first plurality of first combined keep values, wherein each of the second plurality of second combined keep values is associated with a corresponding one of the data points of the first data set, wherein said each second combined keep value associated with the corresponding one data point of the first set represents a combination of first combined keep values associated with data points which are included in a line segment that is oriented along the second dimension and is centered on the corresponding one of the data points of the first set. The method may further include performing second processing in parallel for each final combined keep value in the final set corresponding to a different one of the plurality of data points in the first data set, wherein the second processing includes determining whether said each final combined keep value is greater than zero, and if not, determining that the different one of the plurality of data points is removed from the first set. The plurality of analytical modules may include a chromatography module, an ion-mobility module, and a mass spectrometry module. The first data set may be included in a raw data set generated as a result of performing an experiment to analyze a sample using at least the chromatography module and the mass spectrometry module. The experiment may include performing, with respect to the sample, chromatographic separation using the chromatography module, ion mobility spectrometry using the ion-mobility module, and mass spectrometry using the mass-spectrometry module.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DESCRIPTION

Figure 1:
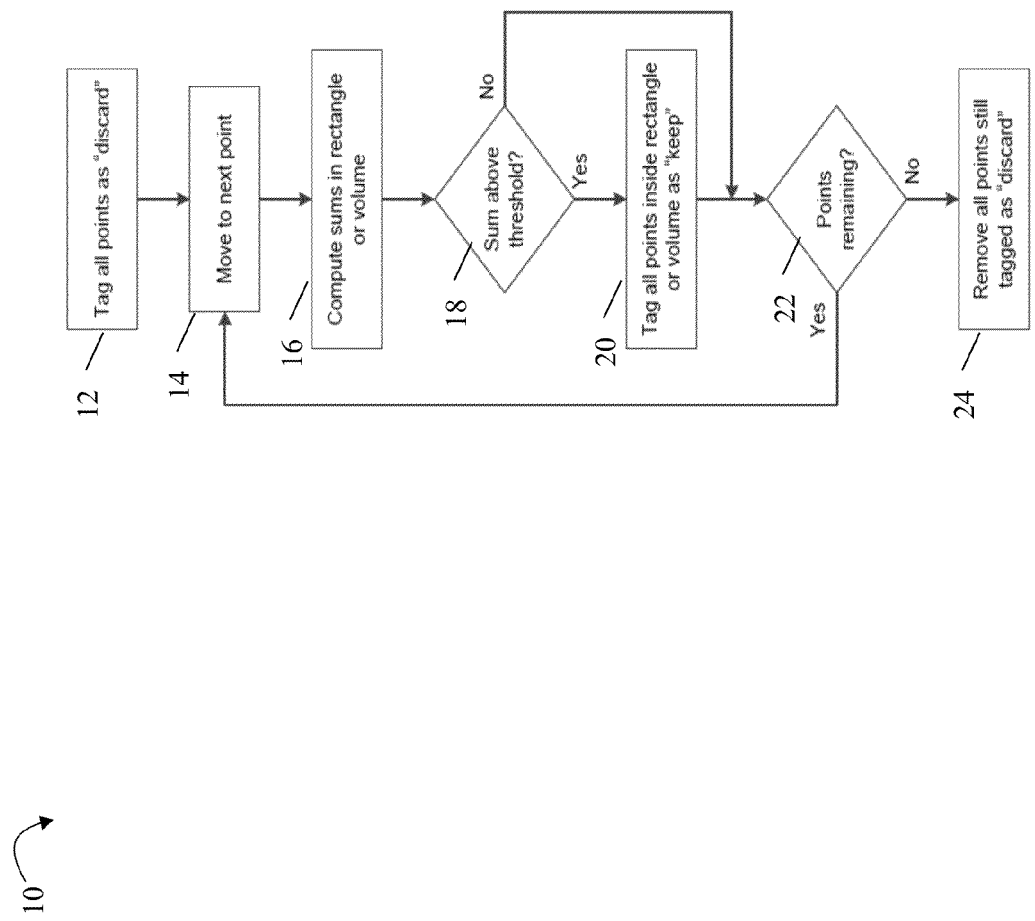
FIGS. 1, 3B, 4, 5, 6, 7, 18, 19, 20, 21, 22 and 23 are flowcharts of processing steps that may be performed in an embodiment in accordance with techniques herein.

Described herein are techniques that may be used in connection with performing data compression using a GPU (graphics processing unit) in real-time. Such techniques are used in connection with a data compression algorithm that may also be referred to herein as Data Sweep compression. In an exemplary embodiment, techniques described herein may be embodied in an implementation of the Data Sweep compression algorithm which performs compression of data generated in connection with an experiment. The data, to which compression techniques herein may be applied, may be generated, for example, as a result of an experiment performed using LC/MS (liquid chromatography/mass spectrometry) instruments or LC/MS/IMS liquid chromatography/mass spectrometry/ion mobility spectrometry) instruments. LC/MS instruments, as well as LC/IMS/MS instruments, generate scans of MS raw data in time sequential order as the analysis progresses in LC chromatographic time. In connection with such raw data generated from an LC/MS experiment, the raw data acquired may be represented as a surface having two dimensions of data. In connection with such raw data generated from an LC/IMS/MS experiment, the raw data acquired may be represented using a volume having three dimensions of data. Such raw data generated from an LC/MS experiment may show peaks of different heights (e.g., intensity) at different mass (m/z) and time (LC retention time) coordinates. Such raw data generated from an LC/IMS/MS experiment may show peaks of different heights (e.g., intensity) at different mass (m/z), time (LC retention time) coordinates and drift (mobility) coordinates.

Raw data generated from a typical analysis may include thousands of data points in both the time and the mass axes, and, for example, 200 data points in the drift axis for IMS data. Thus, the size of the raw data may typically be normally very large requiring many gigabytes (GBs) of storage. The MS instrument may store the raw data in a file for post-acquisition processing. In some systems, the MS instrument may perform some level of lossless data compression, such as, by not outputting data points with zero intensity. However, despite such data compression, the size of the raw data is still very large. Thus, there is still a need to further compress the raw data such as using techniques herein.

A mass spectrum can be regarded as a pair of lists of numbers (masses and intensities). Due to the digital nature of most acquisition systems, in their raw form (as may be included the raw data) these numbers are usually integers and may be referred to as mass indices and intensities herein. The raw data may comprise data points associated with a non-zero intensity whereby data points with zero intensity are discarded. As used herein, such typical raw data with zero intensity data points removed may be referred to as zero-compressed.

Techniques described herein may be used to achieve a lossy compression by removing data points that do not contribute to the final results, such as uncorrelated background noise data points. For most raw data types, especially IMS data, this method of compression requires a tremendous amount of computation posing a practical challenge to implement such techniques for real-time processing. Such techniques described herein may be characterized as parallel processing algorithms which may utilize a multi-core processor, such as the GPU, to perform compression in real-time which may be applied to the raw data as generated by the instrument. The benefit is not only a reduced raw data file size, but also any post-acquisition processing takes less time as it has less data to process.

As described in following paragraphs, in embodiments described herein, some parts of the algorithms may run in the CPU (Central Processing Unit) of a computer system and remaining steps run in the GPU. In such an embodiment, compute intensive steps may run in the GPU to take advantage of the massive parallel processing and many-core capabilities of the GPU. In some embodiments, code that runs in the GPU may be programmed using the CUDA (Compute Unified Device Architecture) programming language created by NVIDIA Corporation, which is specifically designed to exploit the parallel characteristics of the GPU. The GPU can handle thousands of concurrent programming threads, each processing one or more elements of a parallel computation. To facilitate parallel programming, CUDA organizes these threads in blocks, and the threads blocks are organized in a grid. The threads in a thread block, as well as the grid of blocks, can be indexed in one, two, or three dimensions. The function calls that run in the GPU are called "kernels" which may be launched from the CPU. Each kernel corresponds to a portion of parallel code that may be executed by multiple threads, where such threads are organized into a number of blocks. A "grid" of blocks may be run as a unit of computation on the GPU where the threads in the grid may execute the kernel code concurrently.

Data Sweep may be characterized as an algorithm to reduce the size of LC/MS and LC/IMS/MS raw data by removing data points, such as uncorrelated background noise data points, which do not contribute to the analytical results produced by normal processing of the data. The remaining data points have some contribution to the analytical results, at least a minimum contribution.

Thus, Data Sweep may be differentiated from a filter, for example, because the data points that remain after applying the algorithm are not modified in any way. It is, however, a lossy raw data compression method because we cannot recover the original raw data from the compressed data. Nevertheless, the impact in the analytical results is inappreciable or minimal when the algorithm is applied appropriately.

Generally, the Data Sweep algorithm may be expressed as including the following four steps A-D:
A. For each data point in the data, sum the intensities of all points inside a rectangle, or inside a volume (rectangular prism) for IMS data, centered in the data point.
B. Once the sum is computed, compare it to a given threshold value.
C. Then, if the sum is above the threshold, all points inside the rectangle (e.g., for LC/MS raw data) or volume (e.g., for LC/IMS/MS data) are kept (e.g., marked as "keep"). Otherwise, the points inside the rectangle or volume are "candidates" to be discarded. It should be noted that a point may be candidate for discard from the perspective of a first rectangle or volume, but may be a keep point (e.g., marked as "keep") from due to another second rectangle or volume. However, once a point is tagged as "keep" by at least one rectangle or volume, the data point is kept (e.g., retains its "keep" status or marking).
D. After all data points in the data have been processed (swept) as above, all points that remain tagged as candidates to be discarded may be removed from the data.

All four steps A-D are run on each data point whereby step D does not start until all points have been processed with the first three steps A-C.

Referring to FIG. 1, shown is a flowchart of processing steps summarizing processing of the Data Sweep algorithm. The flowchart 10 generally summarizes the Data Sweep algorithm based on step A-D noted above. Generally, steps 16, 18, 20 and 24 correspond, respectively, to steps A, B, C and D noted above. In step 12, all data points of the raw data set may be initialized or tagged as "discard". In step 14, processing is performed for a next selected data point of the raw data set. In step 16, the sum is computed of intensities for all data points in a rectangle or volume centered on the selected data point in step 14. In step 16, the rectangle or volume may more generally be characterized as a geometric shape based on the dimensions of the raw data set. In step 18, a determination is made as to whether the sum is above an established threshold. If step 18 evaluates to no, control proceeds to step 22. If step 18 evaluates to yes, control proceeds to step 20 to tag all points inside the rectangle or volume (or more generally, the geometric shape centered on the selected point of step 14) as "keep" denoting that all such tagged points should not be discarded or removed as part of the compression. From step 20, control proceeds to step 22 where a determination is made as to whether there are any points remaining to be processed in the raw data set. If step 22 evaluates to yes, control proceeds to step 14. Otherwise, control proceeds to step 24 where all points remaining tagged as "discard" may be removed from the raw data set.

What will be described in following paragraphs are techniques that may be used in an embodiment in connection with performing the general processing described in FIG. 1 and in steps A-D above for performing data compression. Such processing may be performed, for example, in connection with compressing a data set, for example, such as the raw data set generated as a result of performing an LC/MS or an LC/IMS experiment. As described in more detail elsewhere herein such techniques may be applied in real-time to compress such data as it is generated by the instrument.

In connection with FIG. 1 and steps A-D of the Data Sweep algorithm, it should be noted that the sizes of the rectangles or volumes used in step A (step 16 of FIG. 1) to compute the sums (also referred to as herein as the sum window) may be determined based on the peak width in each axis (mass, time, and drift) multiplied by a given factor. Thus, if, for example, the peak width in the time (or chromatographic) direction is 12 seconds, the factor is 1.25, and there is one data point per second along the time axis, then the size of the sum window in the time axis is equal to 15 points.

The size of the sum window in the time axis may be the same for all points (e.g., for all time coordinates). However, in the mass and drift axes, the size of the sum window may further vary with the data point coordinates because the peak width along such axes may also vary from that of the time axis.

Figure 2A:
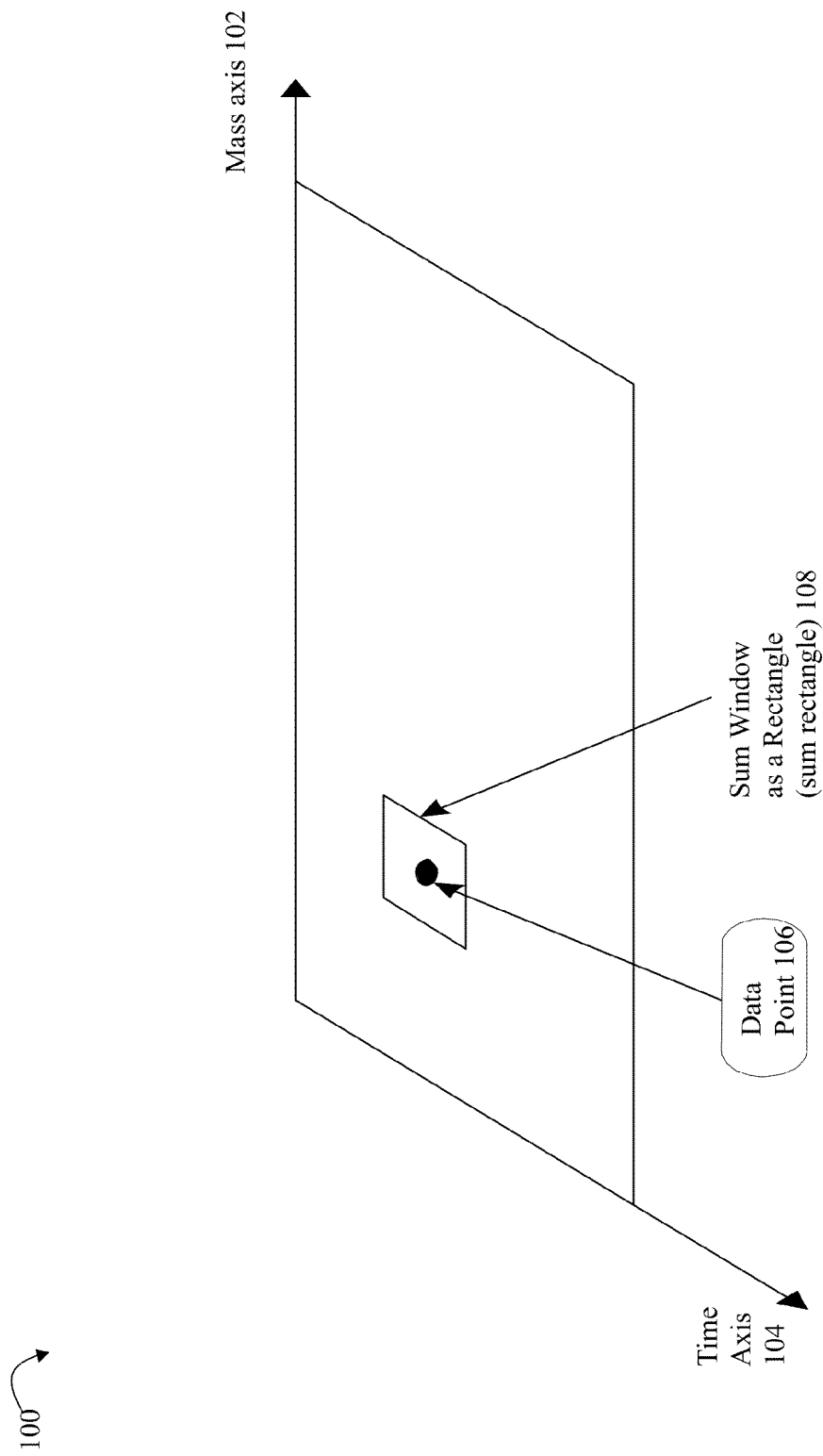
FIGS. 2A and 2B are examples illustrating different geometric shapes formed using an intensity sum window or sum window for a data point in a raw data set processed in accordance with techniques herein.
Figure 2B:
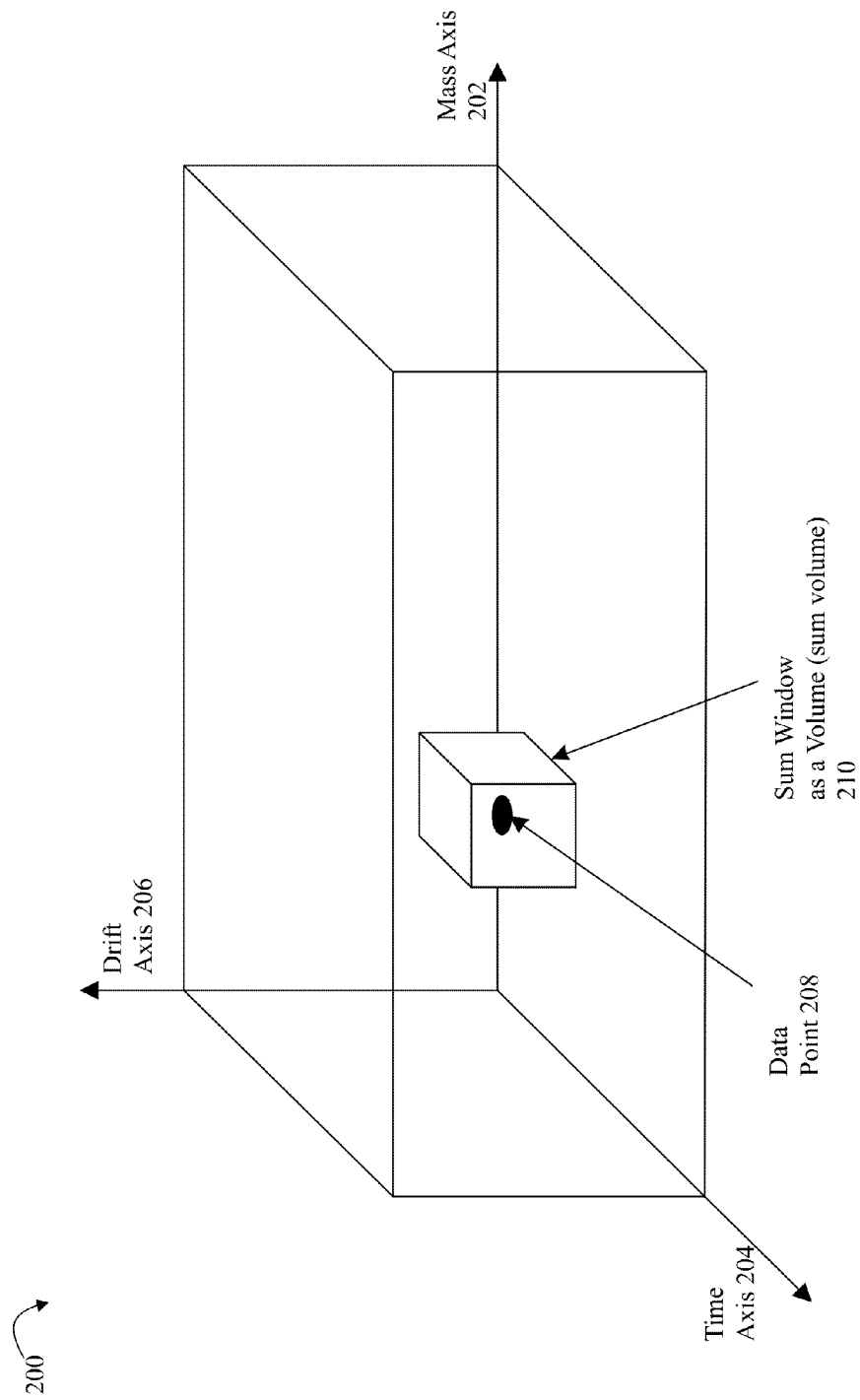

Referring to FIGS. 2A and 2B, shown are examples of sum windows as may be used in connection with techniques herein.

With reference to FIG. 2A, shown is an example of a sum window for a single data point of a two-dimensional raw data set generated as a result of an LC/MS experiment. In the example 100, shown are the mass axis 102 and time axis 104 with the data point 106 plotted in the two-dimensional space. As described herein, the sum window for LC/MS data may be a rectangular region 108. It should be noted that the sum window for two-dimensional data, such as LC/MS data may be also referred to as a sum rectangle.

With reference to FIG. 2B, shown is an example of a sum window for a single data point of a three-dimensional raw data set generated as a result of an LC/IMS/MS experiment. In the example 200, shown are the mass axis 202, time axis 204, and drift axis 206 with the data point 208 plotted in the three-dimensional space. As described herein, the sum window for LC/IMS/MS data may be a volume 210. It should be noted that the sum window for three-dimensional data, such as LC/IMS/MS data may be also referred to as a sum volume.

Thee term sum window may be used to more generally refer to the geometric shape centered on a data point whereby the geometric shape of rectangle 108 or volume 210 varies with the dimensions (e.g., either 2 or 3) of the raw data set.

Implementation of Data Sweep, such as for real-time use, may generally present computational and memory challenges. As a first consideration, consider the computation performed to process a data set. A straight, brute force or naïve implementation requires a large amount of computation to process a data set, especially for an LC/IMS/MS data set.

As an example of the amount of computation required in one straight forward implementation of step A, suppose a fairly common size for an LC/IMS/MS data set includes 200,000 points in the mass axis, 200 points in the drift axis, and 3000 points in the time axis whereby the data set has 120 billion (120*10^9) data points to process. Furthermore, in this illustration, assume a constant sum window (volume) around each point of 5 by 9 by 7 points (mass×drift×time), which means 315 sum operations performed per data point. The total sum operations for step A is then 37.8 trillion (37.8*10^12). For step B there is one comparison operation per data point, resulting in 120 billion comparison operations. In a straight implementation of step C, there are as many "keep" tag operations as the number of points in each volume with the sum above the threshold. This is data dependent but, obviously, it is no more than 37.8 trillion tag operations. Additionally, there is an addressing overhead in step C as we need to revisit all points inside each volume to tag them appropriately. As illustrated by the foregoing, this amount of computation makes a real-time implementation difficult with standard processors, such as the CPU. However, such amount of computation is feasible when implemented in parallel such as using parallel processors like the GPU.

As mentioned above, in some embodiments, the raw data set generated may have some minimal amount of compression performed, such as the raw data set may not include data points with zero intensity as a result of the simple compression applied by the instrument. It may seem plausible to apply the Data Sweep algorithm directly to the zero-compressed raw data as generated by the instrument since the zero intensity points are already discarded and would not need to be tested by the algorithm. However, applying the Data Sweep algorithm directly to the zero-compressed raw data is difficult. Each zero-compressed raw data scan (e.g., scan with only non-zero intensity values) must be accompanied by information regarding the position of these values in a non-compressed scan (scan that also includes the zero intensity values). This added information is the index into the mass axis of each non-zero intensity data point. In one embodiment, this added information is included in an additional companion array of mass indices for each scan of zero-compressed raw data.

In principle, applying the Data Sweep algorithm directly to the zero-compressed raw data noted above seems advantageous since the number of data points where the algorithm steps are applied is reduced. However, running the four steps A-D described above on such zero-compressed raw data points requires further computation as will now be described.

For example, to compute the sum values described in step A, processing may be performed to search the start and end points of the sum window within each array of mass indices for all scans that intersect the sum window. In the example depicted above, such processing represents 126 searches (9×7×2) per sum window (volume). Once the end points of the volume in each compressed scan are known, the computation of the sum is straightforward and requires less sum operations than in the uncompressed raw data (e.g., raw data not zero-compressed). Step C would require a similar search procedure, although processing may save in memory the end points found in step A and reuse them in step C. Nonetheless, the additional computation required by the search operations will, most likely, cancel out the mentioned advantage, and possibly make it worse.

As described in more detail below, processing may alternatively be performed to separate the computation in each of the two or three axes. In this manner, fewer operations may be required to processing the data set. However, such processing in one embodiment requires saving in memory the partial sums obtained after completing the sums in each axis, and may be characterized as generally more difficult and cumbersome to implement directly on such zero-compressed raw data sets and most likely would not provide any significant computation advantage over applying the algorithm to uncompressed data.

In one embodiment as described herein, the Data Sweep algorithm may be applied to uncompressed raw data (containing also the zero intensity data points). In such an embodiment in which the instrument generates zero-compressed raw data sets, processing may be performed to first decompress the raw data as obtained from the instrument. It may be generally more efficient to decompress entire scans even if only a section correspondent to a given sum window is needed. For LC/IMS/MS data, the 200 scans that contain mobility data at a given retention time, come grouped in a block of non-zero intensities and their correspondent mass indices. Therefore, for LC/IMS/MS data it may be preferred for efficiency to decompress entire blocks of 200 drift scans.

In an embodiment described herein, the minimum number of points needed along the time (chromatographic) axis to compute the sums in step A of the Data Sweep algorithm is the size of the sum window along the time axis, also referred to herein as the chromatographic (chrom) sum window. (In connection with the exemplary dimensions above, the chrom sum window is 7). Therefore, at any given time in such an embodiment, the minimum amount of decompressed raw data (with zero intensities included) maintained in memory to run the Data Sweep algorithm is the size of the chrom sum window (e.g., 7) by 200 drift scans.

Figure 3:
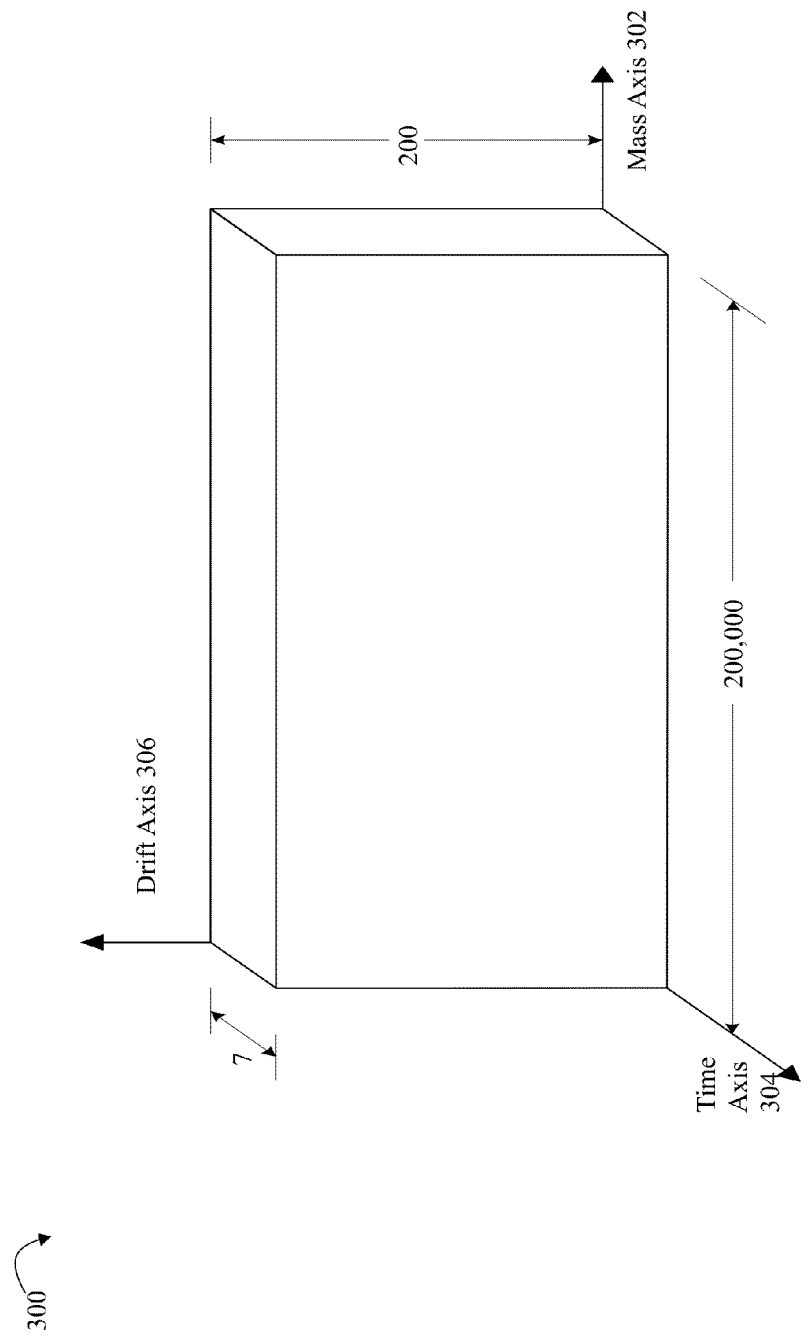
FIG. 3 is an example illustrating a minimum amount of decompressed raw data that may be maintained in memory for use in an embodiment in accordance with techniques herein.

Referring to FIG. 3, shown is an illustration depicting the minimum amount of decompressed raw data that may be maintained in memory for use with techniques herein consistent with the example mentioned above. In the example 300 of FIG. 3, illustrates is mass axis 302, time axis 304 and drift axis 306. In this example, the minimum data in memory is 280 million data points (200,000×200×7), or about one GB of memory if each data point intensity is represented by a four byte floating point number. This memory size requirement may be larger, for example, if the chrom sum window is wider, if the scans have a greater number of mass values, and the like. Additionally, more memory may be typically required to hold zero-compressed raw data during decompression operations, and for copies of uncompressed data for intermediate calculations. The foregoing memory requirements may be excessive in systems with limited amount of memory, such as certain GPU cards, thus driving the need for some sort of memory management technique, such as described in more detail elsewhere herein.

An embodiment in accordance with techniques herein may implement processing that is a variation from the general description provided above as generally outlined in step A-D and FIG. 1. Such variation may be performed, for example, in order to advantageously exploit the massive parallel processing capabilities of the GPU. Rather than compute the sum at each data point individually, processing may be performed in an embodiment to compute all sums at the same time by separating the computation in each axis. Thus, for example, for each data point, processing may be performed to first compute the sum value summing intensity values along the time axis only, i.e., summing only intensities within the chrom sum window. This creates a collection of partial sum values, one at each data point. Then, at each data point location, processing may be performed to sum partial sum values along the drift axis only, i.e., summing only partial sums within the drift sum window. This creates an updated collection of partial sum values. Finally, at each data point location, processing may be performed to sum partial sum values along the mass axis only, i.e., summing only partial sums within the mass sum window. This creates a collection of final sum values, one at each data point, and completes step A described above.

Such an adaption of step A may be characterized as amenable for parallel processing since many threads can compute partial sum values in parallel efficiently. Furthermore, given that the partial sum values of adjacent data points differ only in two values, processing may compute a sum value from the previous one and only two sum operations. This reduces substantially the total number of operations to compute all sums.

Step B as note above may also be adapted for use in a manner favorable for parallel processing. However, step C may not be so readily adapted for use with parallel processing because only some threads need to revisit and flag all data points inside their sum window. These are the threads processing data points with the sum above the threshold, and cannot take full advantage of parallelism as most likely they would be addressing data points with little or no relation to each other. One innovative idea that may be utilized in an embodiment to overcome the foregoing computing of step C described above, and perform step C efficiently in parallel is described next. In implementing step C in an embodiment in accordance with techniques herein, rather than performing processing whereby, for each data point, processing revisits all the points inside the sum window (rectangle or volume) to tag them when the sum is above the threshold, the problem may be viewed from the perspective of the revisited data point. For each data point, processing may be performed to examine all the sum windows to which that the point contributes (e.g., all sum windows which include the data point). Then, for each of these sum windows including the particular data point, it may be determined whether each of these sum windows has an associated sum above the threshold. If so, the particular data point may be tagged as "keep". In an embodiment, the sum windows including the particular data may be processed until the first such sum window is found having an associated sum above the threshold. Once the first such sum window including the particular data point is found/determined, the particular data point may be tagged as "keep" and there is no need to further consider processing with respect to the remaining sum windows including the particular data point. The foregoing may provide an advantage that each point is tagged only once, but at the expense of possibly looking at sum windows with the sum below the threshold. The net computation savings is data dependent and may be minimal or none. However, an advantage resides in how the foregoing may be implemented with parallel processing. The step described above (e.g., where each point is examined from the perspective of all sum windows which include the point/to which the point contributes) may be separated in computations in each of the three axes similar to what it is done to compute the sums of Step A. Therefore, multiple threads can perform this computation in an implementation of step C in parallel efficiently.

At each data point, a new rectangle or volume may be defined referred to herein as the "Keep window" that is used for this new "keep" computation in implementing step C in an embodiment in accordance with techniques herein. It should be noted that the keep window at each point may not be equal to the sum window at that point, although in many cases is. For example, the mass keep window at a given point (size of the keep window along the mass axis), may have the upper and lower halves different. The upper half may be equal to half the sum window of the furthest higher point that this point contributes to a sum. Conversely, the lower half may be equal to half the sum window of the furthest lower point that this point contributes to a sum. Given that in the mass and drift axes the sum window size varies with the point location, the two keep window halves may be different.

An embodiment in accordance with techniques herein may also use a set of "keep flags", one at each data point, which are set to "zero" for all points except for those where the sum is above the threshold, which are set to "one". To perform this new "keep" computation using the "keep windows" and the "keep flags", processing may be performed to do a similar set of operations like those done to compute the sums, but instead of using the points' intensity values, processing may use keep flag values of the data points. Thus, for example, for each data point, processing may first compute a "keep value" summing keep flag values along the time axis only, i.e., summing only keep flags within the chrom keep window. This creates a collection of partial keep values, one at each data point. Then, at each data point location, processing may then sum partial keep values along the drift axis only, i.e., summing only partial keeps within the drift keep window. This creates an updated collection of partial keep values. Finally, at each data point location, processing may be performed to sum partial keep values along the mass axis only, i.e., summing only partial keeps within the mass keep window. This creates a collection of final keep values, one at each data point, and completes step C described above.

It should be noted that the foregoing implementation of step C is amenable for use with parallel processing since many threads may compute partial keep values in parallel efficiently. Furthermore, given that the partial keep values of adjacent data points differ only in two values, processing may be performed to compute a keep value from the previous keep value and only two sum operations. This reduces substantially the total number of operations to compute all keeps. It should be noted computation of step D is now straightforward when step C is implemented as generally described above and elsewhere herein using the keep values and keep flags. All data points with their keep value above zero are kept. All the other data points which have a keep value equal to zero may be discarded.

Figure 3B:
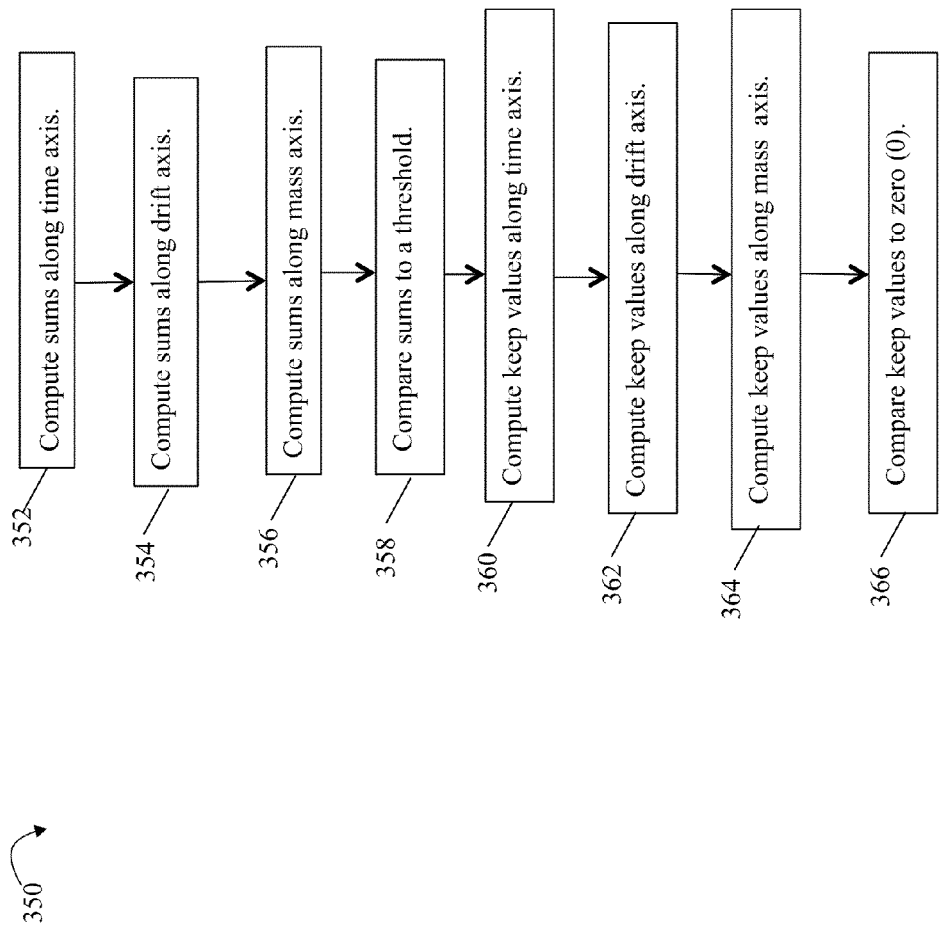

Referring to FIG. 3B, shown is a flowchart summarizing processing steps that may be performed in an embodiment in accordance with techniques herein. The flowchart 350 summarizes processing noted above and additional detail regarding the steps of 350 is further described in following paragraphs. It should be noted that the steps of flowchart 350 summarize processing that may be performed on an LC/IMS/MS raw data set. For non-IMS data (e.g., an LC/MS data set generated as a result of an LC/MS experiment), steps 354 and 362 described below may be omitted since there is no such third drift axis in the raw data set being processed.

In step 352, processing is performed to compute sums along the time axis. In step 352, for each data point in the raw data set, processing may be performed to compute a sum value for the data point by summing the intensities of all points along a line segment centered on the data point. The line segment is oriented along the time axis, and its length may vary with the location of the data point. The obtained sum value for each data point may be saved for processing in step 354.

In step 354, processing is performed to compute sums along the drift axis. Step 354 processing may use the set of sum values generated by step 352. In step 354, for each data point having a sum value in the output generated and saved by step 352, processing may be performed to add the sum values (of the set generated by step 352) of all points along a line segment centered on the data point. The line segment is oriented along the drift axis, and its length varies with the location of the data point. The newly obtained sum value for each data point may be saved for processing in step 356.

In step 356, processing is performed to compute sums along the mass axis. Step 356 processing may use the set of sum values generated by step 354. In step 356, for each data point having a sum value in the output generated and saved by step 354, processing may be performed to add the sum values (of the set generated by step 354) of all points along a line segment centered on the data point. The line segment is oriented along the mass axis, and its length varies with the location of the data point. The newly obtained sum value for each data point may be saved for processing in step 358.

In step 358, processing is performed to compare the sums (generated from step 356) to a given threshold value. In step 358, for each data point having a sum in the output generated and saved by step 356, processing may be performed to compare the sum to a given threshold value. If the sum is above the threshold, the corresponding data point's keep flag (e.g., where the data point corresponds to the sum value just compared) may be set to 1 (one), otherwise processing may set the corresponding data point's keep flag to 0 (zero). The obtained keep flag for each data point may be saved for processing in step 360

In step 360, processing is performed to compute keep values along the time axis. In step 360, for each data point having a keep flag in the output generated and saved by step 358, a keep value for the data point may be determined by summing the keep flags (generated by step 358) for all points along a line segment centered on the data point. The line segment is oriented along the time axis, and its length may vary with the location of the data point. The obtained keep value for each data point may be saved for processing in step 362.

In step 362, processing is performed to compute keep values along the drift axis. Step 362 may use the set of keep values generated by step 360. In step 362, for each data point having a keep value in the output generated and saved by step 360, processing may be performed to sum the keep values (from the set generated from step 360) of all points along a line segment centered on the data point. The line segment is oriented along the drift axis, and its length varies with the location of the data point. The newly obtained keep value for each data point may be saved for processing in step 364.

In step 364, processing is performed to compute keep values along the mass axis. Step 364 may use the set of keep values generated by step 362. In step 364, for each data point having a keep value in the output generated and saved by step 362, processing may be performed to sum the keep values (from the set generated from step 362) of all points along a line segment centered on the data point. The line segment is oriented along the mass axis, and its length varies with the location of the data point. The newly obtained keep value for each data point may be saved for processing in step 366.

In step 366, processing is performed to compare each of the keep values (as determined in step 364) to zero (0). In step 366, for each data point having a keep value in the output generated and saved in step 364, processing may be performed to compare the keep value to zero. If the keep value is more than zero, the corresponding raw data point (having the keep value) may be kept. Otherwise, the corresponding raw data point may be discarded.

In following paragraphs, reference is made to FIGS. 4-7 which provide further detailed processing that may be performed in an embodiment in connection with implementation of the steps of FIG. 3B.

In following paragraphs and in connection with FIGS. 4-7, the sum and keep windows are abbreviated as described in the following Table 1.

TABLE 1

| St | Time sum window |
|----|-----------------|
| Sd | Drift sum window |
| Sm | Mass sum window |
| Kt | Time keep window |
| Kd | Drift keep window |
| Km | Mass keep window |

Figure 4:
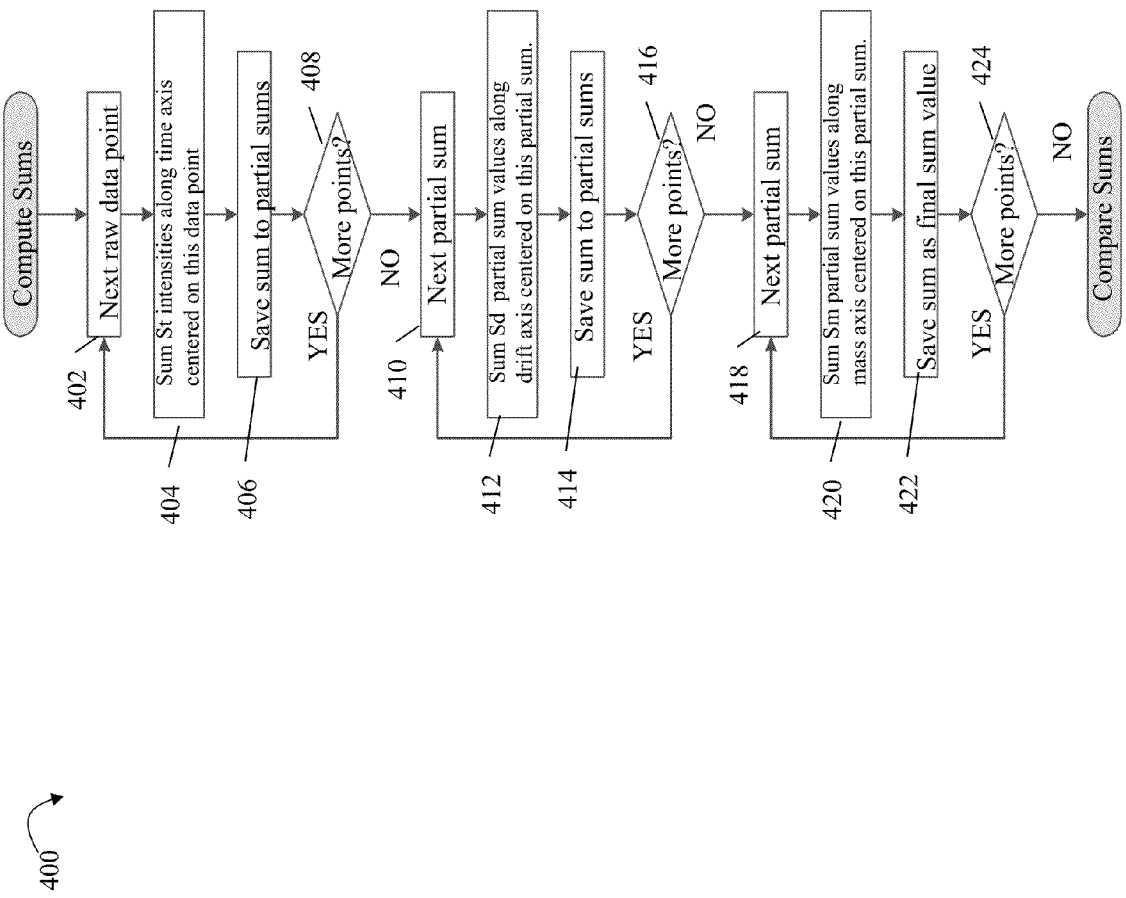

Referring to FIG. 4, shown is a flowchart of processing steps that may be performed in connection with computing the intensity sums in an embodiment in accordance with techniques herein. The steps of the flowchart 400 provide additional detail regarding steps 352, 354 and 356 of FIG. 3B that may be performed in an embodiment in accordance with techniques herein. In particular, the first loop of steps 402-408 provide additional detail regarding step 352 of FIG. 3B, the second loop of steps 410-416 provide additional detail regarding step 354 of FIG. 3B, and the third loop of steps 418-424 provide additional detail regarding step 356 of FIG. 3B.

In one embodiment as described in more detail elsewhere herein, steps of the first loop may be performed to compute a first set of partial sums in parallel for a portion of raw scan data points. Once the first loop processing has completed, steps of the second loop may be performed to compute a second set of partial sums in parallel for the portion of raw scan data points. Once the second loop processing has completed, steps of the third loop may be performed to compute final sum values in parallel for the portion of raw scan data points.

At step 402, processing is performed for the next raw data point. At step 404, for the current raw data point of step 402, processing is performed to sum the St intensities included in a line segment along the time axis centered on the current raw data point. In step 406, the sum is saved as a partial sum for the current raw data point whereby the partial sum represents the sum intensity for the points of the line segment along the time axis centered on the current raw data points. At step 408, a determination is made as to whether there are more raw data points to be processed. If step 408 evaluates to yes, control proceeds to step 402. Otherwise, if step 408 evaluates to no, control proceeds to step 410.

In the second loop beginning in step 410, the first set of partial sums generated by the first loop are further processed and used to generate second updated partial sums. In step 410, processing commences for the next partial sum of the first set (generated by the first processing loop) whereby the next partial sum corresponds to one of the raw data points. At step 412, processing is performed to sum the Sd partial sum values of the first set along the drift axis centered on the current partial sum (selected in step 410) associated with the one data point. In step 414, the sum obtained as a result of step 412 may be saved as the new updated partial sum corresponding to the one raw data point. At step 416, a determination is made as to whether there are additional partial sums of the first set to be processed. If step 416 evaluates to yes, control proceeds to step 410. If step 416 evaluates to no, control proceeds to step 418.

In the third loop beginning in step 418, the second set of partial sums generated by the second loop are further processed and used to generate final partial sums. In step 418, processing commences for the next partial sum of the second set (generated by the second processing loop) whereby the next partial sum corresponds to one of the raw data points. At step 420, processing is performed to sum the Sm partial sum values of the second set along the mass axis centered on the current partial sum (selected in step 418) associated with the one data point. In step 422, the sum obtained as a result of step 420 may be saved as the final partial sum corresponding to the one raw data point. At step 424, a determination is made as to whether there are additional partial sums of the second set to be processed. If step 424 evaluates to yes, control proceeds to step 418. If step 424 evaluates to no, control proceeds with subsequent processing for comparing the final sum values to a threshold as in step 358 of FIG. 3B, which is further described below in connection with FIG. 5.

Figure 5:
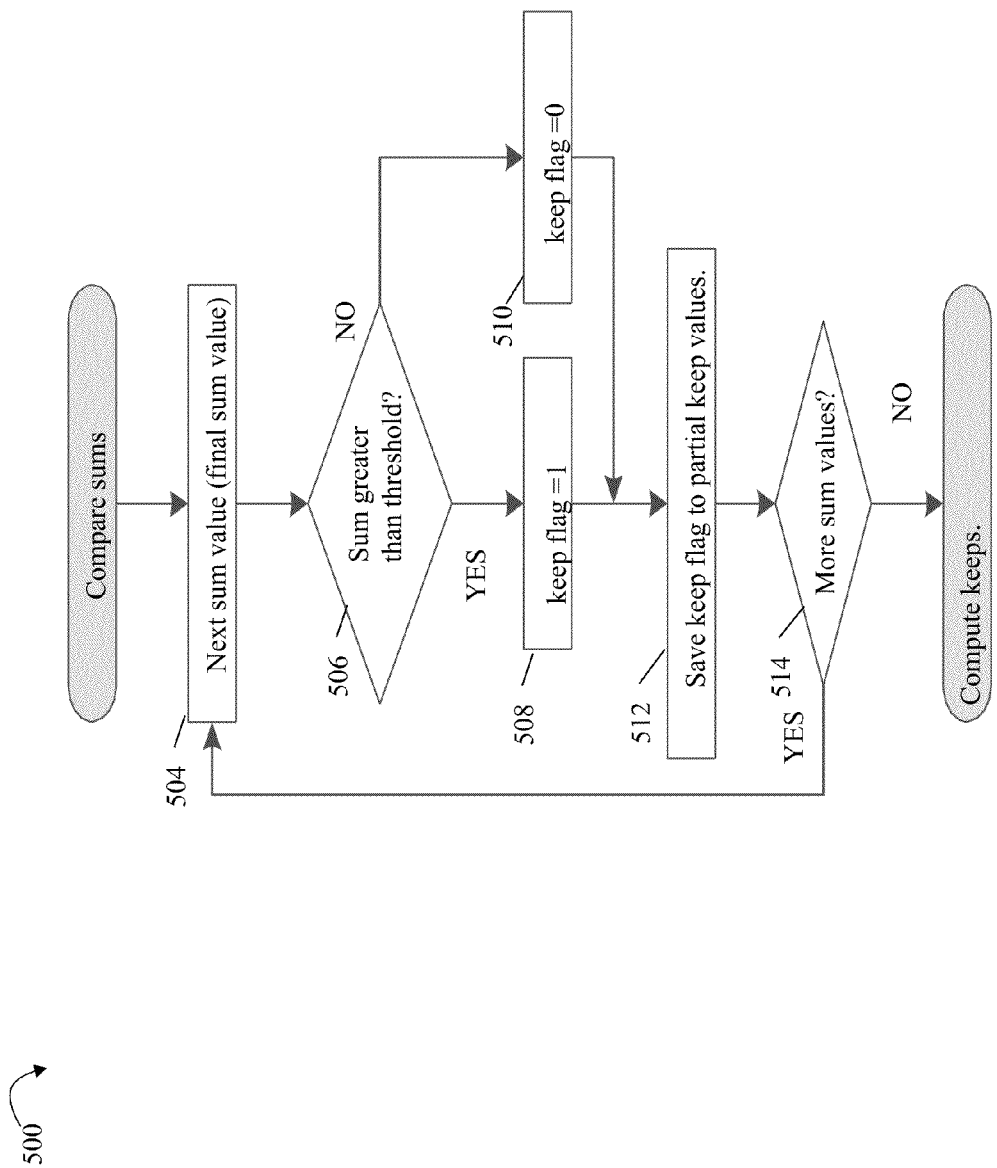

Referring to FIG. 5, shown is a flowchart of processing steps that may be performed in connection with comparing final intensity sum values (obtained as a result of FIG. 4 processing) to a threshold in an embodiment in accordance with techniques herein. The steps of the flowchart 500 provide additional detail regarding step 358 of FIG. 3B that may be performed in an embodiment in accordance with techniques herein. At step 504, a next final sum value is obtained. In step 506, a determination is made as to whether the current final sum value is greater than a threshold intensity value. If step 506 evaluates to yes, control proceeds to step 508 where the keep flag corresponding to the final sum value and also corresponding to one of the raw data points is set to 1 and control proceeds from step 508 to 512. Otherwise, if step 506 evaluates to no, control proceeds to step 510 where the keep flag corresponding to the final sum value and also corresponding to one of the raw data points is set to zero (0) and control then proceeds to step 512. In step 512, the keep flag obtained in either step 508 or 510 for the current final sum value may be stored as an initial partial keep value corresponding to the one raw data point. At step 514, a determination is made as to whether there are additional final sum values to be processed. If step 514 evaluates to yes, control proceeds to step 504. If step 514 evaluates to no, control proceeds with subsequent processing for computing keep values as in steps 360, 362 and 364 of FIG. 3B, which are further described below in connection with FIG. 6.

It should be noted as mentioned elsewhere herein, the steps of FIG. 5 are illustrated as being performed in an iterative manner. However, such overall processing of FIG. 5 is also amenable to being performed in parallel. An embodiment in accordance with techniques herein may also perform, in parallel for multiple final sum values associated with raw data points, a determination of a keep flag value for each such multiple final sum values as described above.

Figure 6:
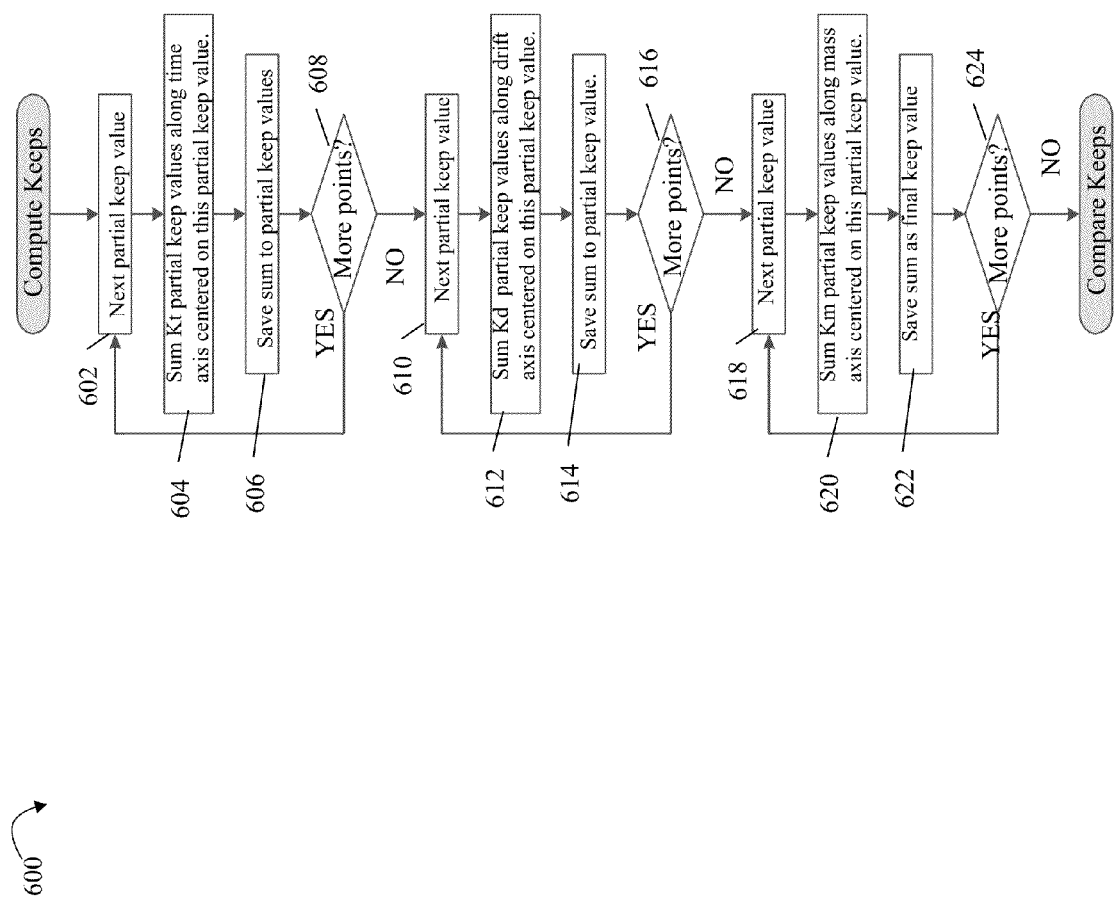

Referring to FIG. 6, shown is a flowchart of processing steps that may be performed in connection with computing keep values in an embodiment in accordance with techniques herein. The steps of the flowchart 600 provide additional detail regarding steps 360, 362 and 364 of FIG. 3B that may be performed in an embodiment in accordance with techniques herein. In particular, the first keep loop of steps 602-608 provide additional detail regarding step 360 of FIG. 3B, the keep second loop of steps 610-616 provide additional detail regarding step 362 of FIG. 3B, and the third keep loop of steps 618-624 provide additional detail regarding step 364 of FIG. 3B.

In one embodiment as described in more detail elsewhere herein, steps of the first keep loop may be performed to compute a first set of partial keep values in parallel for a portion of raw scan data points having corresponding initial keep values generated by FIG. 5 processing. Once the first keep loop processing has completed, steps of the second keep loop may be performed to compute (using the first set of partial keep values) a second set of partial keep values in parallel for the portion of raw scan data points. Once the second keep loop processing has completed, steps of the third keep loop may be performed to compute (using the second set of partial keep values) final keep values for the portion of raw scan data points.

In the first keep loop beginning at step 602, the set of initial partial keep values generated as a result of FIG. 5 processing may be used to generate, as an output of the first keep look, the first set of partial keep values. At step 602, processing is performed for the next initial partial keep value generated by FIG. 5 processing. At step 604, for the initial partial keep value selected in step 602, processing is performed to sum the Kt initial partial keep values (from the set generated by FIG. 5 processing) included in a line segment along the time axis centered on the current partial keep value (selected in step 602). In step 606, the sum is saved as an updated partial keep value for the current raw data point whereby the partial keep value represents the sum of keep values (generated by FIG. 5 processing) for the points of the line segment along the time axis centered on the current partial keep value. At step 608, a determination is made as to whether there are more partial keep values in the initial set generated by FIG. 5 processing which have yet to be processed. If step 608 evaluates to yes, control proceeds to step 602. Otherwise, if step 608 evaluates to no, control proceeds to step 610.

In the second keep loop beginning in step 610, the first set of partial keep values generated by the first keep loop are further used to generate a second set of updated partial keep values. In step 610, processing commences for the next keep value of the first set (generated by the first keep processing loop) whereby the next partial keep value corresponds to one of the raw data points having the next partial keep value. At step 612, processing is performed to sum the Kd partial keep values of the first set (e.g., generated by the first keep loop) along the drift axis centered on the current partial keep value (as selected in step 610). In step 614, the sum obtained as a result of step 612 may be saved as the new updated partial keep value corresponding to the one raw data point. At step 616, a determination is made as to whether there are additional partial keep values of the first set to be processed. If step 616 evaluates to yes, control proceeds to step 610. If step 616 evaluates to no, control proceeds to step 618.

In the third keep loop beginning in step 618, the second set of partial keep values generated by the second keep loop are further processed and used to generate final keep values. In step 618, processing commences for the next partial keep values of the second set (generated by the second keep processing loop) whereby the next partial keep values corresponds to one of the raw data points. At step 620, processing is performed to sum the Km partial keep values of the second set of keep values along the mass axis whereby such partial keep values summed are included in a line segment centered on the current partial keep value selected in step 618. In step 622, the sum obtained as a result of step 620 may be saved as the final keep value corresponding to the one raw data point. At step 624, a determination is made as to whether there are additional partial keep values of the second set (as generated by the second keep loop) to be processed. If step 624 evaluates to yes, control proceeds to step 618. If step 624 evaluates to no, control proceeds with subsequent processing for comparing the final keep values to zero as in step 366 of FIG. 3B, which is further described below in connection with FIG. 7.

Figure 7:
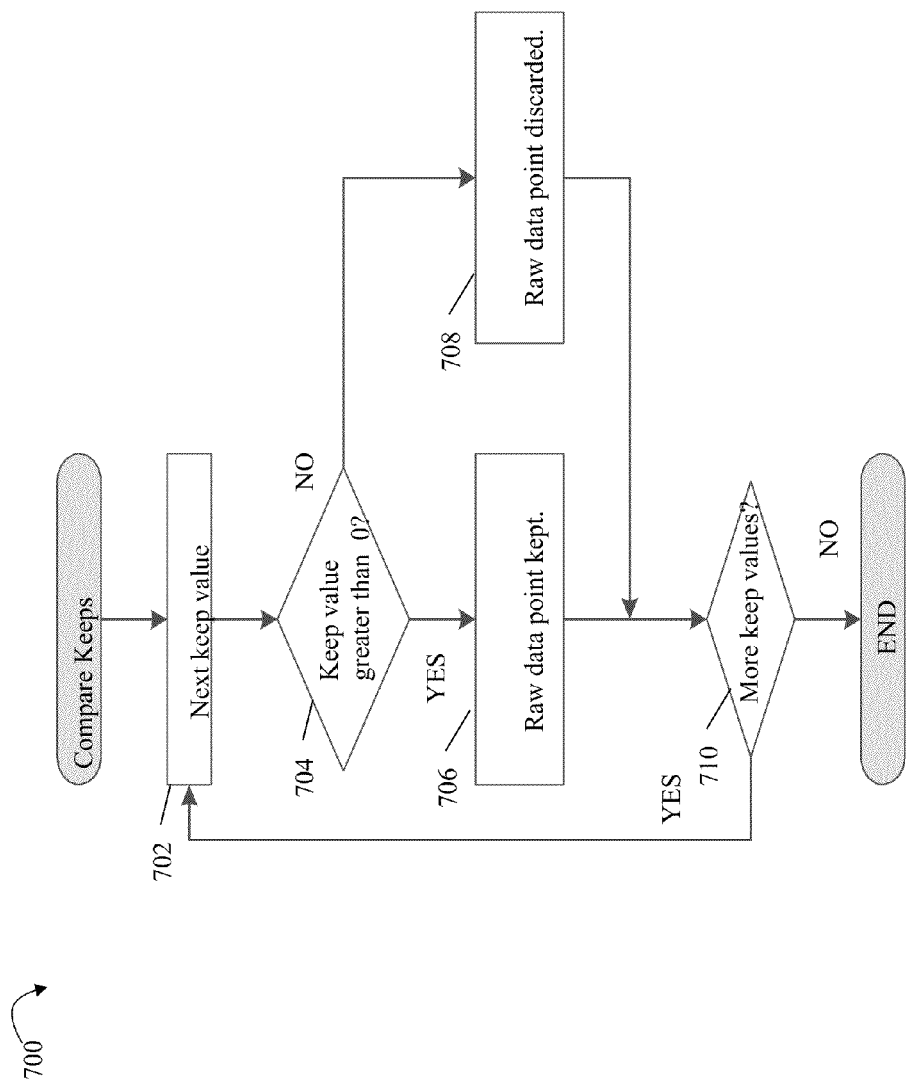

Referring to FIG. 7, shown is a flowchart of processing steps that may be performed in connection with determining which raw data points to keep based on the final computed keep values determined as an output of FIG. 6 processing. The steps of the flowchart 700 provide additional detail regarding step 366 of FIG. 3B that may be performed in an embodiment in accordance with techniques herein.

At step 702, the next final keep value in the set output from FIG. 6 processing is selected. At step 704, a determination is made as to whether the current final keep value, as selected in step 702, is greater than zero. If step 704 evaluates to yes, control proceeds to step 706 where the raw data point, which corresponds to the current final keep value, is kept. Control then proceeds to step 710. If step 704 evaluates to no, control proceeds to step 708 where the raw data point, which corresponds to the current final keep value, is discarded. Control then proceeds to step 710.

In step 710, a determination is made as to whether there are more final keep values to be processed in the set of final keep values generated from FIG. 6 processing. If step 710, evaluates to yes, control proceeds to step 702. Otherwise, if step 710 evaluates to no, processing of FIG. 7 stops.

It should be noted that FIG. 7 described processing that may be performed iteratively over the final keep values to determine which raw data points are kept and which are discarded. In a manner similar to that as mentioned above in connection with FIG. 5, processing steps of FIG. 7 may be executed in parallel with respect to multiple keep values of multiple associated raw data points. In this manner, processing such as of steps 704, 706 and 708 may be performed for each of multiple data points where such processing is performed in parallel for the multiple data points to thereby determine (in parallel) whether each of the multiple data points is to be kept or removed.

It should be noted that in connection with the processing steps described a substantial amount of memory may also be required to save intermediate values between processing steps.

In connection with discussion herein, a computer where the CPU is located may be referred to as the "host", and the plug-in card where the GPU is located may be referred to as the "device". Primarily, the memory located in the host computer is called host memory or main memory, and the memory located in the device or GPU may be referred to as device memory. The device may include different types of memory with different size, speed, and usage. For example, in one embodiment, the GPU may include the following types of memory: device, shared, constant, and texture memory.

Unlike in the host, where the amount of host memory is selectable and may be large, the amount of device memory is fixed and normally limited to a few GBs. Given that to run the Data Sweep algorithm in the GPU the data must reside in device memory, the algorithm described herein may be further adapted in an embodiment to operate with limited amounts of memory. In many instances, an embodiment may use host memory as a temporary storage to save copies of data in device memory. Data may be transferred back and forth between host and device memories in order to maintain in device memory only the minimum required at any given time.

To reduce the amount of memory required, as well as to run the Data Sweep algorithm efficiently in parallel processing, a Data Sweep GPU implementation in an embodiment in accordance with techniques herein may process several scans at a time in groups called scan packs.

Figure 8:
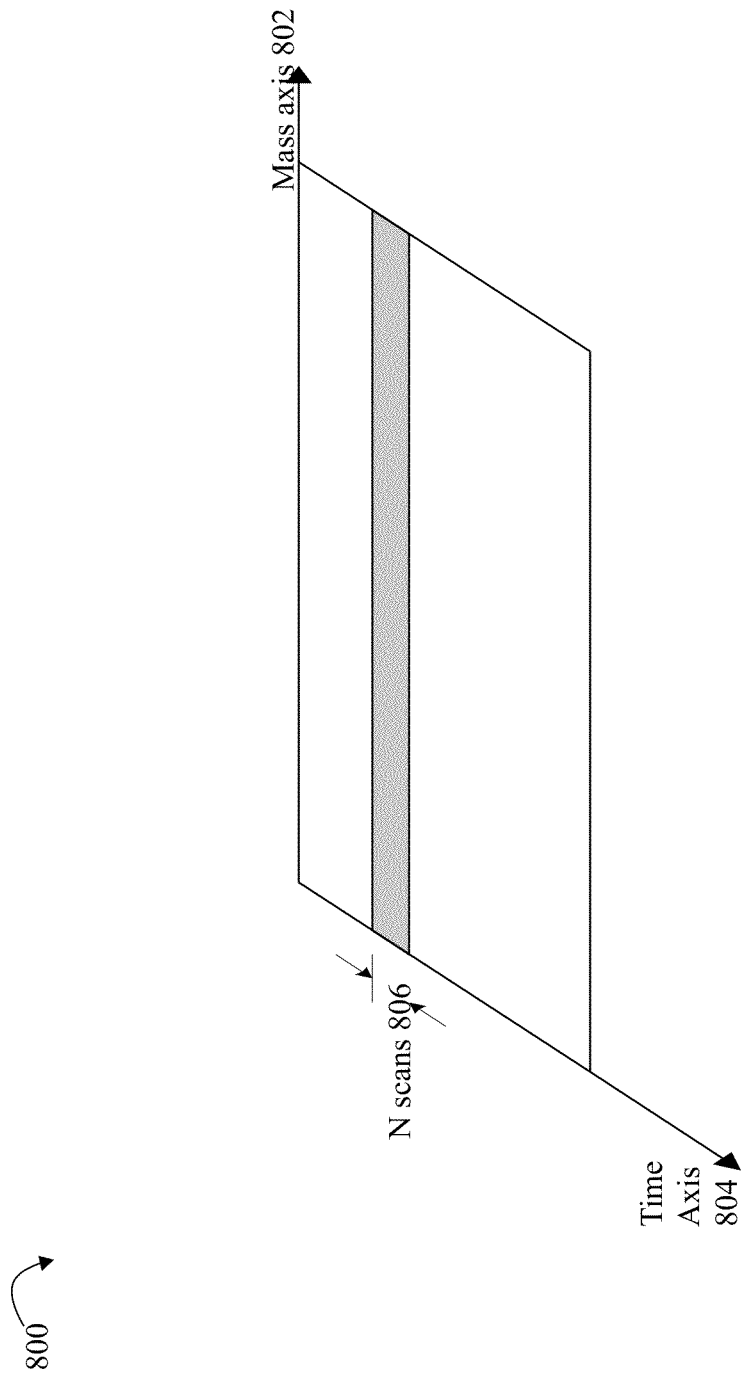
FIG. 8 is an example illustrating a scan pack in connection with LC/MS raw data in an embodiment in accordance with techniques herein.

Referring to FIG. 8, shown is an example illustrating a scan pack in connection with LC/MS raw data in an embodiment in accordance with techniques herein. The example 800 illustrates a mass axis 802 and time axis 804 with a scan pack 806 of N scans of data from a raw LC/MS data set. As illustrated by 806, the scan pack forms a two dimensional geometric shape when expressed in terms of the mass and chromatographic retention time.

Figure 9:
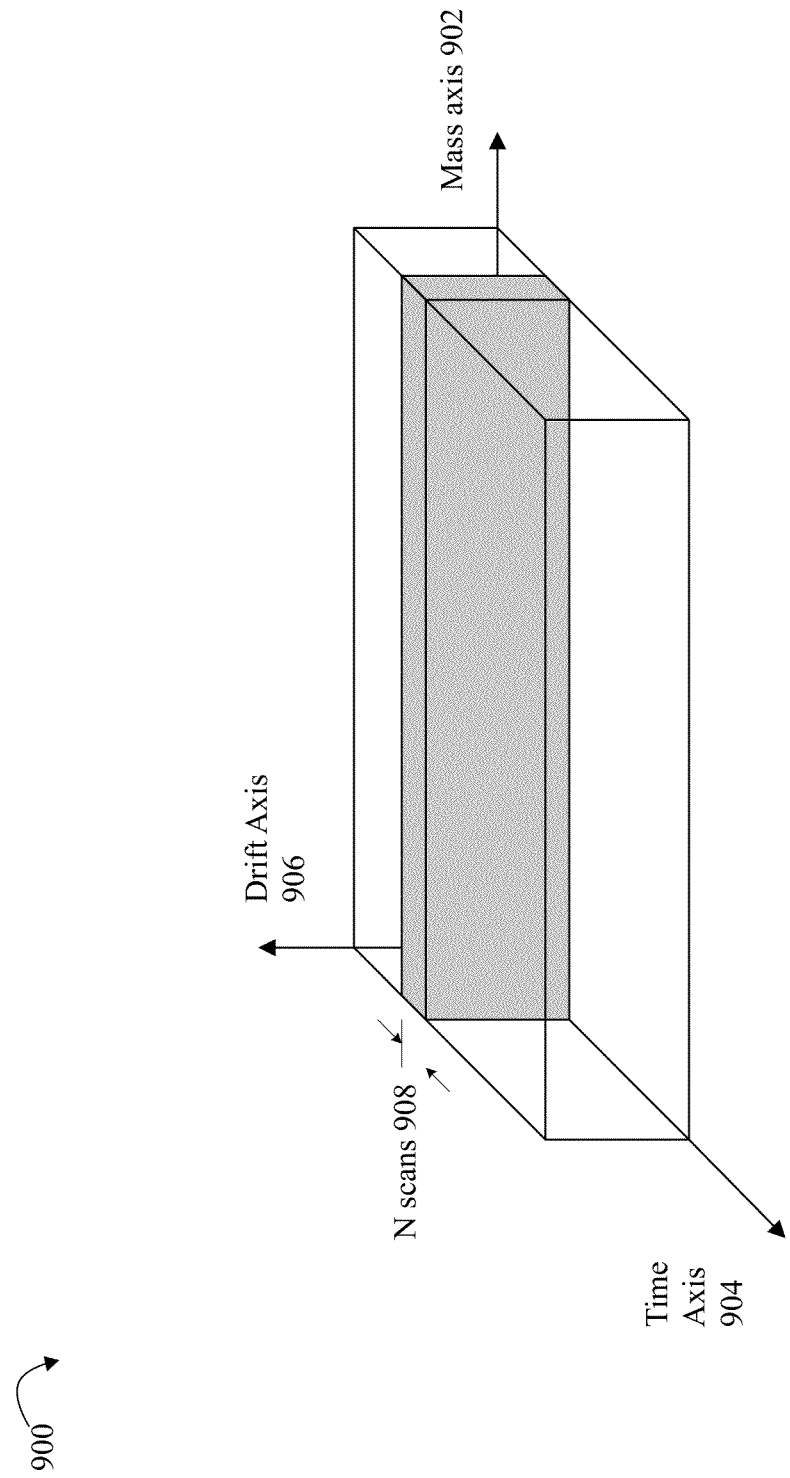
FIG. 9 is an example illustrating a scan pack in connection with LC/IMS/MS raw data in an embodiment in accordance with techniques herein.

Referring to FIG. 9, shown is an example illustrating a scan pack in connection with LC/IMS/MS raw data in an embodiment in accordance with techniques herein. The example 900 illustrates a mass axis 902, time axis 904 (for chromatographic retention time) and a drift axis 906 with a scan pack 908 of N scans of data from a raw LC/IMS/MS data set. As illustrated by 908, the scan pack forms a three dimensional geometric shape or volume when expressed in terms of mass, chromatographic retention time, and drift time.

In one embodiment, the steps described above in connection with FIG. 3B may be performed for a single scan pack at a time. In other words, the steps of FIG. 3B may be performed sequentially one scan pack at a time rather than in the entire data set at once. For steps that operate along the mass or drift axes, this division in scan packs doesn't really make any difference as the scan packs contain entire scans or drift scans. However, for the steps that operate along the time axis (e.g., steps 352 and 360 of FIG. 3B) processing of a single scan pack utilizes data that is outside the scan pack. For example, to compute sums on the first scan of a raw data scan pack, processing performed as described herein uses data points of the previous raw data scan pack because half the sum window falls on data points in the previous input scans. Similarly, to compute sums on the last scan of a raw data scan pack, processing described herein uses data points on the next raw data scan pack because half the sum window falls on data points in the next input scans. The same situation applies to the keeps computation.

Based on the above, an embodiment may maintain in memory more than one scan pack during computation, or at least one scan pack and part of the adjacent scan packs. However, to make scan pack memory management simpler, an embodiment may maintain in memory entire scan packs rather than partial scan packs.

To minimize the number of scan packs maintained in memory at any given time, scan packs may be sized to, at least, half the chromatographic (chrom) time sum window St. This is the smallest scan pack size that guarantees that only three scan packs are needed in memory. With scan packs smaller than the foregoing size, more than three scan packs of data may be required in memory to process the first few and last few scans in a scan pack. With scan packs that are at least the foregoing size (e.g., at least half St), three scan packs may be maintained in memory as illustrated in FIG. 10 with a chromatographic time sum window (chrom sum window or St) of 17.

Figure 10:
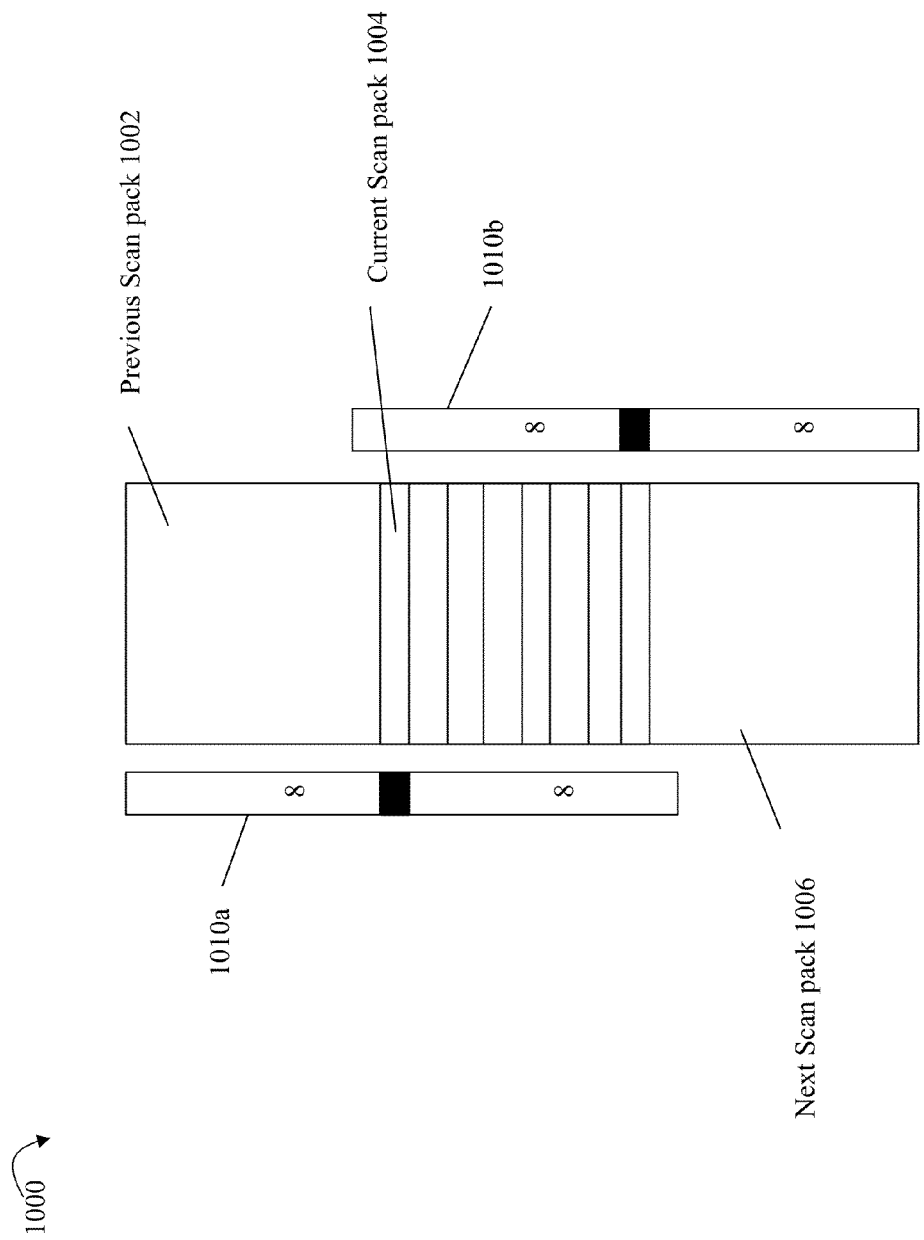
FIG. 10 is an example illustrating scan packs and associated scan pack size in an embodiment in accordance with techniques herein.

Referring to FIG. 10, shown is an example illustrating scan packs and associated scan pack size. In the example 1000, included are the previous scan pack 1002, current scan pack 1004 and next scan pack 1006. In the example 1000, the chromatographic time sum window (chrom sum window or St) is 17 as represented by elements 1010a and 1010b. For efficient parallel processing in the GPU, the scan pack size may further be set to a minimum of 16 scans regardless of the chrom sum window size. For the same efficiency reason, if the chrom sum window calls for a scan pack size greater than 16, the scan pack size may be rounded up to the next multiple of 8.

Consistent with description herein, processing performed to compute the sums and keeps (e.g., in steps 352, 354, 356, 360, 362 and 364 of FIG. 3B) for a current scan pack uses data from the previous and next scan packs. However there is interdependency between the scan packs needed for computing the sums and keeps. To compute the current "keeps" scan pack, processing described herein uses the previous, current, and next scan packs of keep flags. Since the keep flags are obtained directly from the sum scan packs, needed in memory are the previous, current, and next sum scan packs. The previous and the current scan packs are obtained from the current and the next scan packs, respectively, as the scan pack advances. However, to compute the next scan pack of sums, processing herein uses the current, next, and "lead" scan packs of raw data. The "lead" scan pack of raw data may be defined as one scan pack ahead of the next. Thus, the terms previous, current, next, and lead define relative sequencing of scan packs. In this case, the "next" scan pack of sums is obtained using a scan pack of raw data aligned with it, i.e., the "next" scan pack of raw data. However, to compute sums on the "next" scan pack of raw data, processing herein uses one scan pack before and one after, which (relative to the next scan pack) are the "current" and "lead" scan packs respectively (relative to the next scan pack. The foregoing is illustrated in FIG. 11.

Figure 11:
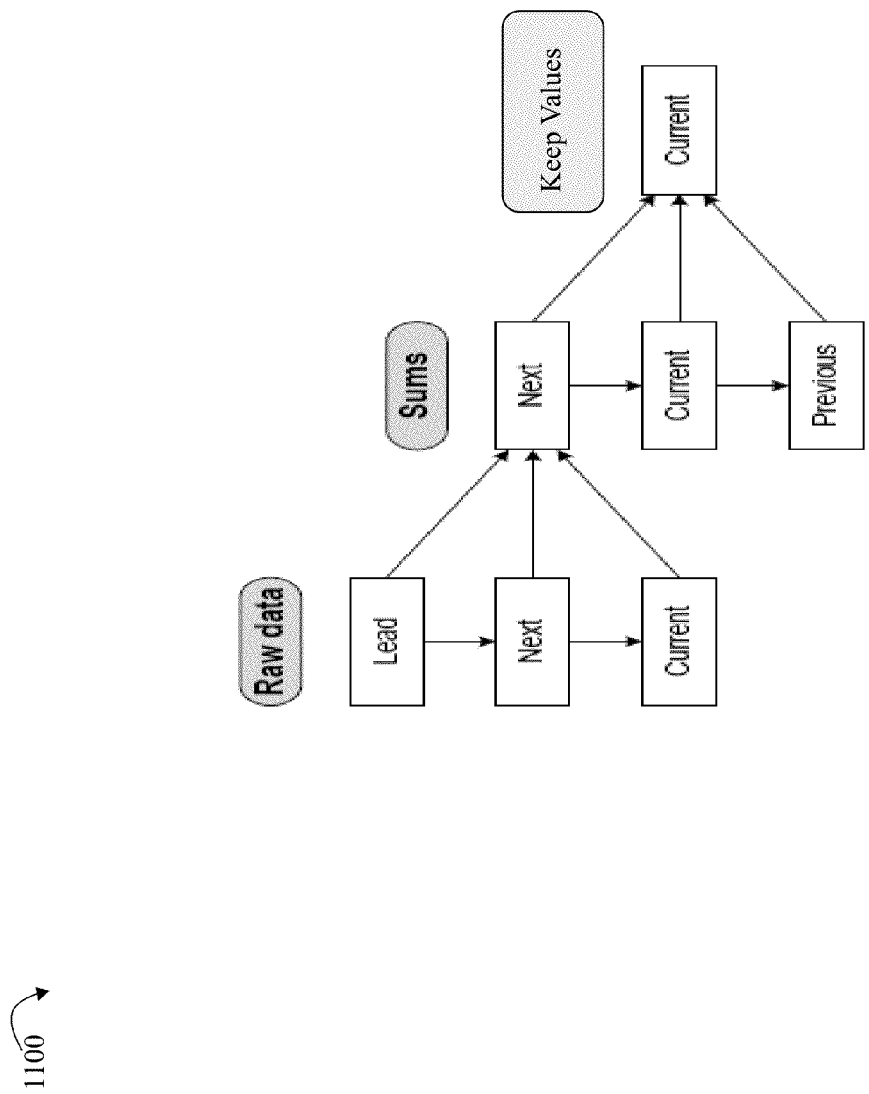
FIG. 11 is an example illustrating dependencies between scan packs when computing sum values of intensities in an embodiment in accordance with techniques herein.

With reference to FIG. 11, the example 1100 illustrates that to compute the sums for the "next" scan pack, raw data of the current, next and lead scan packs are needed. Additionally, to compute the keep values for the current scan pack, final sum values for the previous, current and next scan packs are needed. As seen in FIG. 11 there is a two scan pack delay from raw data to keep values. In addition, as the keep values of the scans in a scan pack are not available until the entire scan pack is processed, there is actually a three scan pack delay from a raw data input scan and the fully processed output scan.

Although dividing the computation in scan packs reduces the required memory, in many cases this is not sufficient and the memory requirements are still excessive. This may generally be true for many LC/IMS/MS raw scan data sets. To overcome this problem, each scan pack may be further divided into a number of equally sized "mass sectors".

A mass sector is a section of a scan pack delimited by two specified mass indices. The two mass indices determine the "mass range" and the size of the mass sector. The other two dimensions of a mass sector, time and drift, are the same as in the scan pack.

Figure 12:
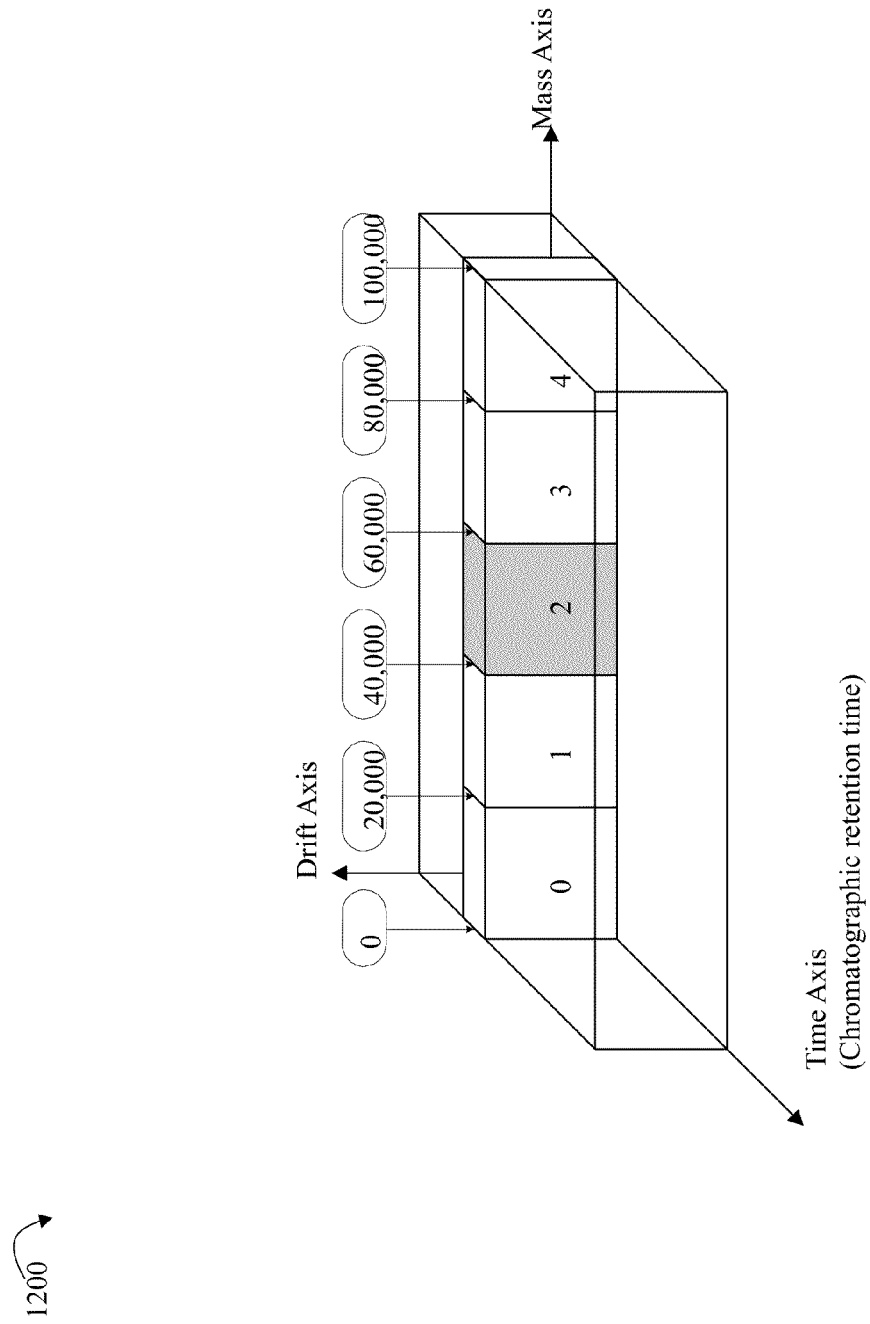
FIG. 12 is an example illustrating the scan pack of FIG. 9 further divided into mass sectors in an embodiment in accordance with techniques herein.

Referring to FIG. 12, shown is an example illustrating the scan pack of FIG. 9 further divided into mass sectors. The scan pack in the example 1200 is divided into five mass sectors, denoted as mass sectors 0-4, with mass sector 2 highlighted. In this example, the number of mass indices is 100,000, the size of each mass sector is 20,000 mass indices, and the mass range of mass sector 2 is from mass indices 40,000 to 59,999. For each scan pack, processing may be performed one mass sector at a time in sequence. Therefore, all steps described in FIG. 3B may be performed and completed for one current mass sector prior to commencing processing of the steps of FIG. 3B for the next subsequent mass sector.

The combination of the scan pack and mass sector concepts that may be used in an embodiment as described herein effectively divides the data into a number of arbitrarily small sized tiles, allowing processing with small amounts of device memory.

The size and number of mass sectors is thus computed to reduce the device memory requirements to any arbitrarily low amount. The smaller the mass sectors are, the less device memory required.

An embodiment may use two types of mass sectors directly related to the type of memory allocated: host memory or device memory. A host memory mass sector allocates host memory only and includes a number of allocations for different purposes, mainly for raw data and for keep values. A device memory mass sector allocates device memory only and has fewer allocations than the host memory mass sectors since not all information is required to be maintained in device memory.

An embodiment may select a number of host memory mass sectors to cover the entire mass axis as described in the example of FIG. 12. However, there is only one device memory mass sector as only one mass sector is processed at a time. Processing may be performed to partition the scan pack data into all host memory mass sectors, loading each mass sector memory with the appropriate scan pack data. Then, one host memory mass sector is processed at a time in sequence, reusing the same device memory mass sector. For example, the first host memory mass sector data may be copied into the device memory mass sector and processing described herein (e.g., FIG. 3B processing) may be performed on the device memory data. Results of the processing performed may be stored in the device memory data whereby such results may be copied from device memory back to the first host memory mass sector. The foregoing performed with respect to the first host memory mass sector may then be repeated for the second host memory mass sector, the third host memory mass sector, and so forth, reusing the device memory mass sector for each such subsequently processed host mass sector.

In the embodiment described herein, it should be noted that the size of the device memory mass sector is the same size as the host memory mass sectors. However, the mass range of the device memory mass sector changes while processing data from each host memory mass sector. The amount of memory allocated for the device memory mass sector may be the largest any host memory mass sector could possibly have. As described in following paragraphs, a host memory mass sector may increase its memory allocation up to a maximum allocation size. Setting the device memory mass sector allocation size to that maximum guarantees that the copies from host memory mass sectors to the device memory mass sector are always successful.

An embodiment may also perform optional processing to increase performance. However, such processing uses two device memory mass sectors. With such optional processing, one device memory mass sector may process the even host memory mass sectors, and the second device memory sector may be used to process the remaining odd host memory mass sectors. Using two device memory mass sectors provides an advantage in that processing and memory copies may be overlapped. Thus, while one device memory mass sector may be processing data from a host memory mass sector, the other device memory mass sector may be copying data from the next host memory mass sector.

Although conceptually the mass sector idea is simple, its practical implementation is not trivial, especially for zero-compressed raw data in the host memory mass sectors. The example described below is for LC/IMS/MS data, but may be similarly performed for two dimensional data, such as LC/MS data.

Figure 13:
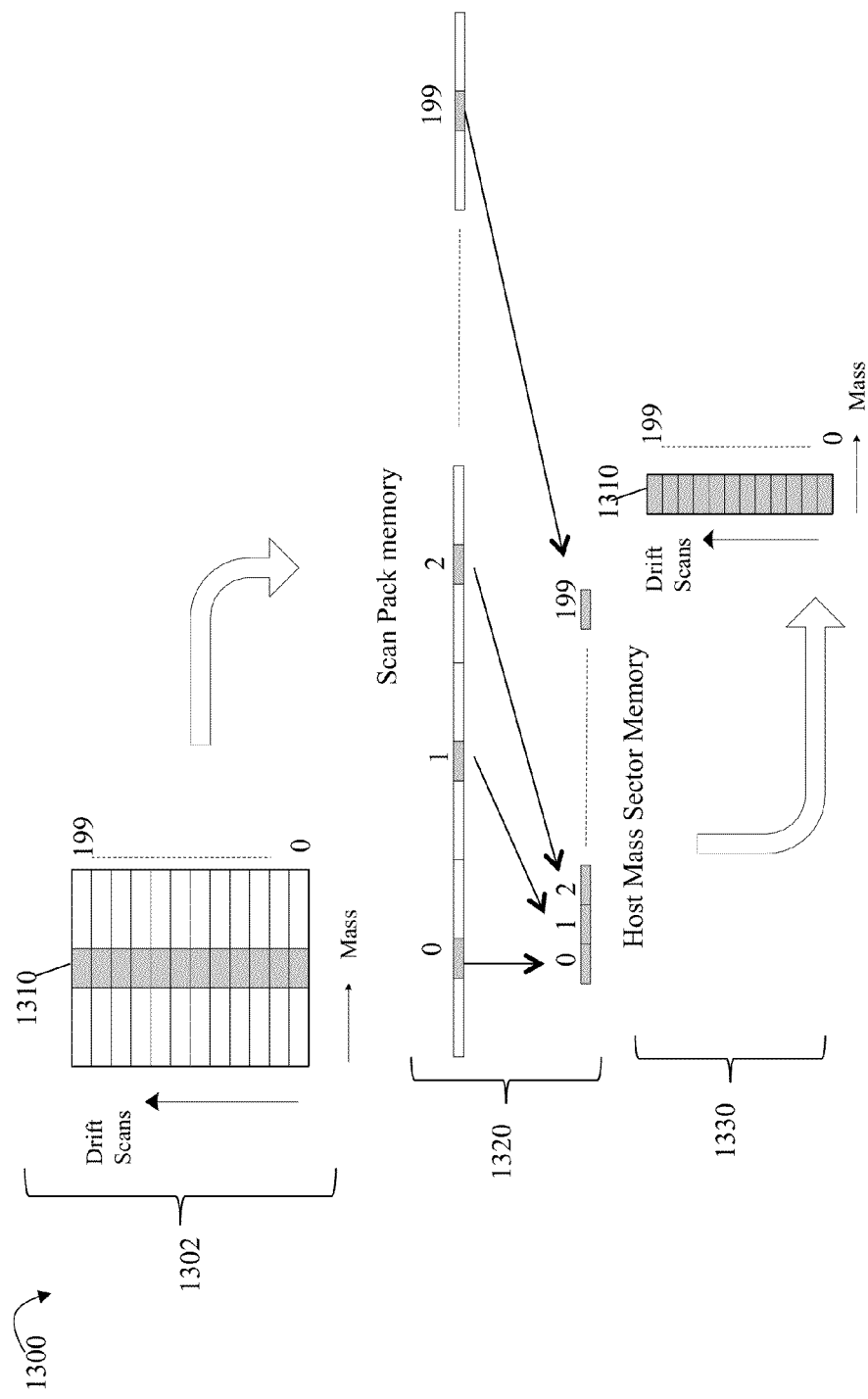
FIGS. 13 and 14 are examples illustrating scan pack splitting and assembly in an embodiment in accordance with techniques herein.

To process a host memory mass sector, processing needs to copy into host memory the values in the scan pack with mass indices within the mass sector limits. Given that the drift scans in a scan pack are organized in memory one after another, this means that for each and every drift scan in the scan pack, processing may determine the section of the drift scan within the desired mass sector limits, and then copy these values to the mass sector memory, one section after another. This is illustrated in FIG. 13 that shows an example with the 200 drift scans of only one full scan where there are 200 drift scans per each chromatographic retention time scan. From the perspective of the processing steps, the mass sector looks like a smaller scan pack.

In the example 1300 of FIG. 13, element 1310 represents a portion of the mass range within each of the 200 drift scans. Element 1320 represents the data of the 200 drift scans (denoted 0-199) as they may be included sequentially in scan pack memory. To process a host memory mass sector, portions 0-199 from, respectively, drift scans 0-199 (as illustrated in 1320) may be copied to the host memory mass sector as illustrated in 1330. Each of the portions 0-199 has mass indices within the desired mass sector limits being processed for the host memory mass sector.

The foregoing scan pack splitting process may be performed for scan packs that contain uncompressed data, such as decompressed raw data (e.g., no points removed which have zero intensity), partial sums, or keep values scan packs, which are all represented in the example of FIG. 13. However, for scan packs of zero-compressed raw data, such splitting may be more complicated as each scan length and mass indices content is different. In this case, the scan pack splitting process requires searching the end points of the mass sector in each array of mass indices as illustrated in the example of FIG. 14.

Figure 14:
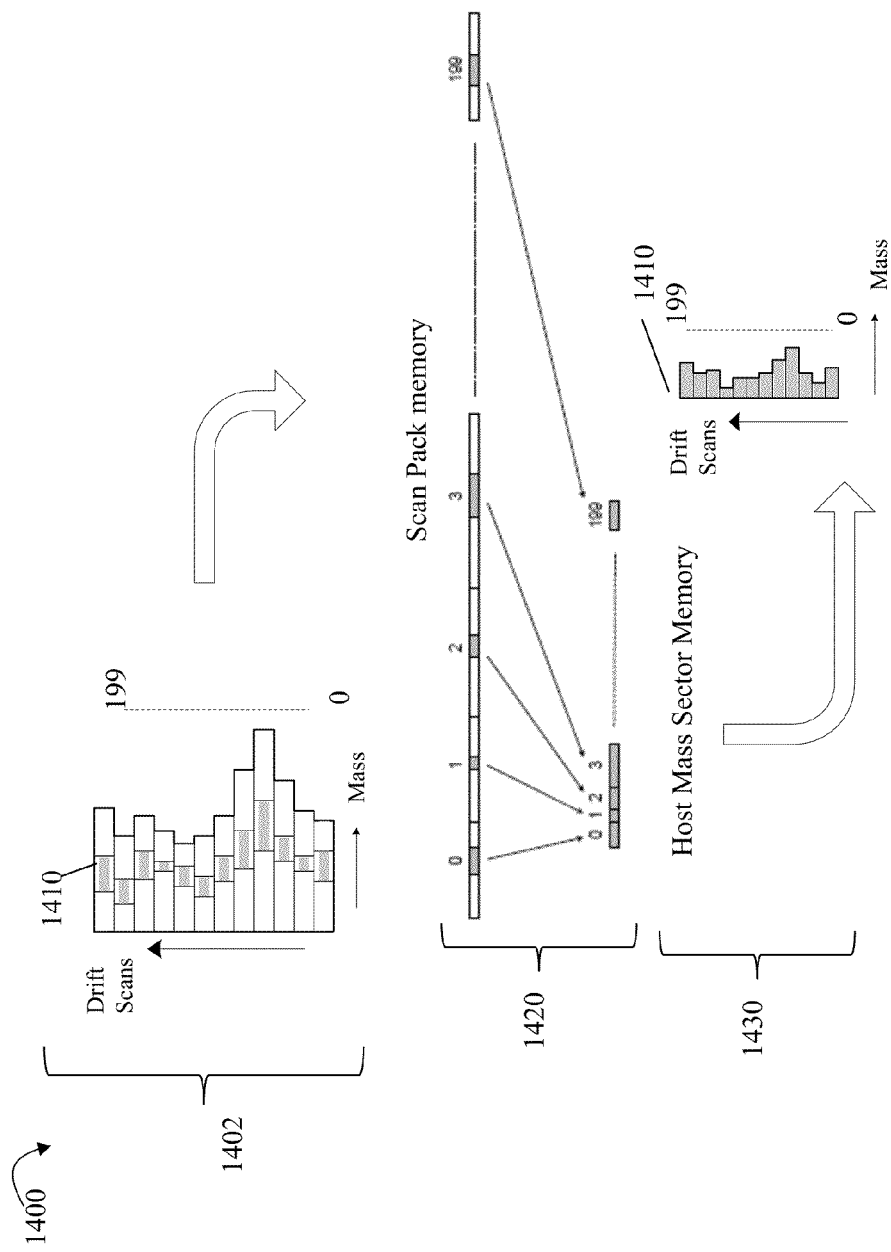

Referring to FIG. 14, the example 1400 includes elements similar to those of FIG. 13 with several differences due to the zero-compressed raw data. Element 1410 may represent the portion of each drift scan for a desired mass index range. Element 1420 represents the data of the 200 drift scans (denoted 0-199) from 1402 as they may be included sequentially in scan pack memory. To process a host memory mass sector, portions 0-199 from, respectively, drift scans 0-199 (as illustrated in 1420) may be copied to the host memory mass sector as illustrated in 1430. Each of the portions 0-199 has mass indices within the desired mass sector limits being processed for the host memory mass sector. One difference between FIGS. 13 and 14 is that element 1402 (as compared to 1302) illustrates that the number of data points in each drift scan 0-199 may vary due to the possibility of zero compression of the raw data, such as described herein where data points having zero intensity may be removed). Another difference is that element 1430 similarly illustrates the different sizes due to number of data points extracted from each of the drift scans 0-199 for the same desired mass index range.

Once all mass sectors have been processed in accordance with techniques herein, processing may be performed to assemble them as a complete scan pack of compressed output data which may be output. This process is straightforward and is the reverse of the one just described above in connection with FIGS. 13 and 14. Generally, processing is performed to concatenate each mass sector contribution to a complete drift scan.

As noted above, each mass sector may be processed independently. However, this represents a problem when computing sums or keeps along the mass axis. To compute sums at data points located at the beginning of the mass sector (first few mass indices), processing uses data points that are located in the previous mass sector. Similarly, to compute sums at data points located at the end of the mass sector (last few mass indices), processing uses data points that are located in the next mass sector. The same problem is encountered when computing keep values.

The foregoing may be solved by maintaining in device memory three mass sectors at any given time—the previous, current, and next—in a similar way as with scan packs and the time axis computations. However, doing that may defeat the purpose of the mass sectors of reducing device memory requirements. Unlike in the scan packs, where the majority of data points in the previous and the next scan packs are used, in the case of the mass sectors, only a few data points in the previous and the next mass sectors may be used. Given that the number of data points in the mass sectors along the mass axis is normally in the many thousands, it may not be desirable maintain in memory the entire previous and next mass sectors just for a few data points used in each.

An embodiment in accordance with techniques herein may further extend each mass sector limits to include the extra data points needed to compute the data points at the ends of the mass sector range. In consequence, the mass sectors overlap each other by a certain number of data points.

Figure 15:
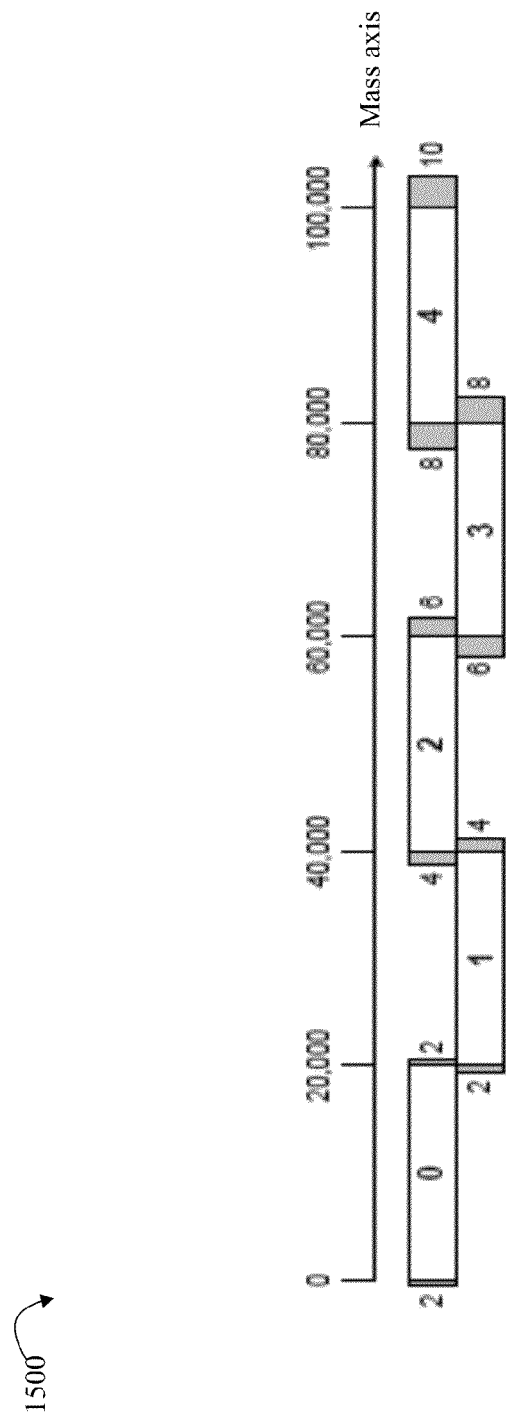
FIGS. 15, 16 and 17 are examples illustrating extension of mass sector boundaries in an embodiment in accordance with techniques herein.

Referring to FIG. 15, shown is an example of five mass sectors, 0-4, each with a size of 20,000 mass indices. FIG. 15 shows examples of the boundaries used to extend the limits at each mass sector extremes/ends as may be needed to compute the sums in all points of the mass range. The boundaries of mass indices for each mass sector may be equal to half the mass sum window Sm whereby the mass index boundaries may be increased for each mass sector as needed thereby causing overlap with neighboring adjacent mass sectors. For example, with the boundaries shown, mass sector 2 has a range from 40,000 to 59,000 but would have in memory values with mass indices from 39,996 to 60,005 since, as illustrated, the lower end mass index value of mass sector 2 is extended by 4 and the upper end mass index value of mass sector 2 is extended by 6. In a similar manner, as illustrated in FIG. 15, mass sector 0 has both lower and upper bounds each extended by 2, mass sector 1 has its lower bound extended by 2 and upper bound by 4, mass sector 3 has its lower bound extended by 6 and its upper bound extended by 8, and mass sector 4 has its lower bound extended by 8 and its upper bound extended by 10.

Figure 16:
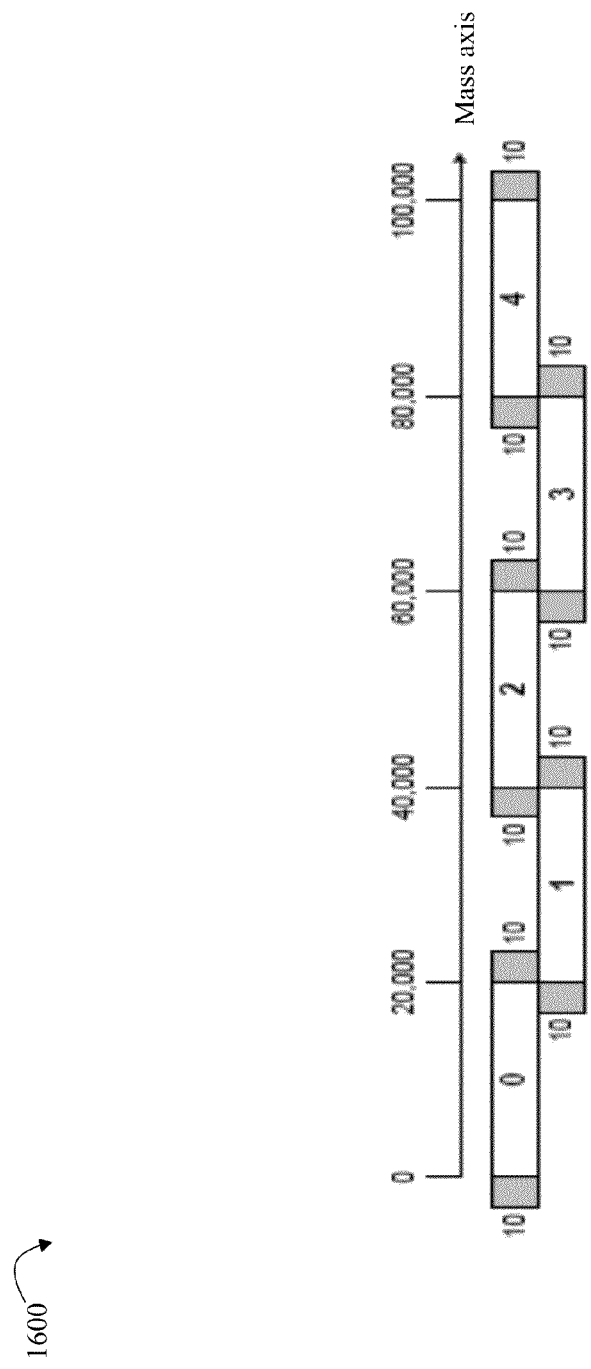

As a variation from that of FIG. 15, an embodiment in accordance with techniques herein may extend lower and upper boundaries of all mass sectors by the same whereby such extensions are equal to the largest such boundary extension which is 10 in this example of FIG. 15. The foregoing simplifies the design in exchange for a handful of extra data points in most mass sectors. FIG. 16 shows the same example as in FIG. 15 with the difference that a common boundary extension of 10 is used for lower and upper boundaries of all sectors. For example, as illustrated in the example 1600, mass sector 2 may have in memory values with mass indices from 39,990 to 60,009 with both an upper and lower boundary extension of 10 mass index values. Additionally, given that there are two operations—sums and keep values computation in the mass axis—that require an extension in the mass sectors limits, an embodiment may actually double the common extension boundaries, such as 10, described above and as illustrated in FIG. 16.

Figure 17:
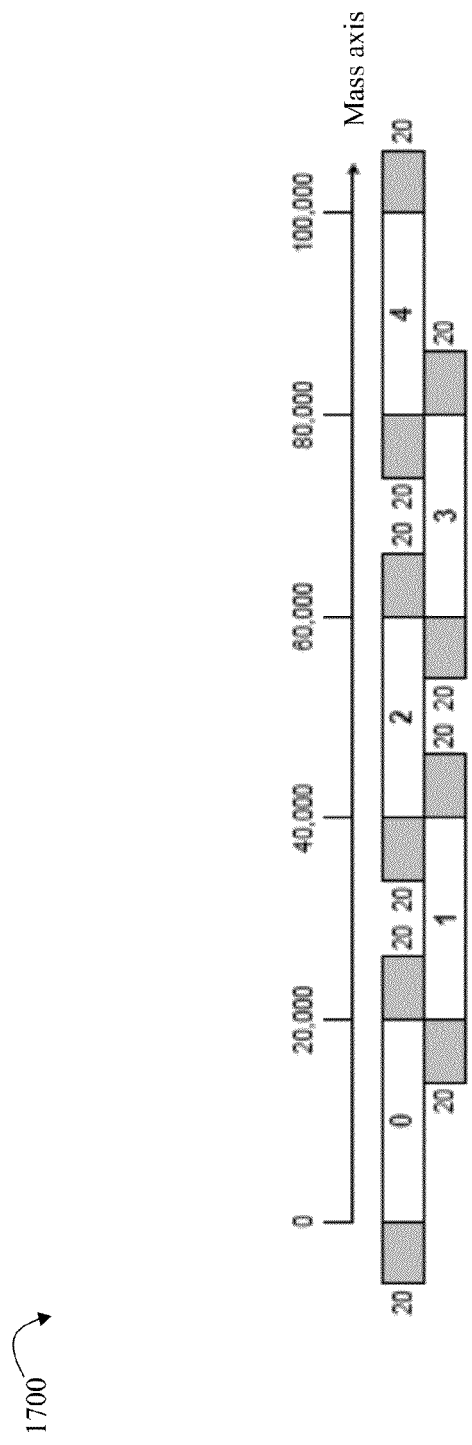

Recall that, as described elsewhere herein, to compute keep values sum values are used, and to compute sum values, raw data is used. Therefore, to compute, for example, the keep values at the beginning of a mass sector, a few sum values with mass indices below the mass sector range, such as 10 extra sum values, may be made available. However, to compute those 10 extra sum values processing further needs a few raw data points with mass indices below those, such as 10 additional raw data points. As a result in this example, a boundary of 20 extra points beyond the mass sector limits may be used to guarantee that all keep values within the mass sector range are computed correctly. FIG. 17 shows the same example as above but showing the doubled boundaries of 20 rather than 10 as in FIG. 16. Therefore, the mass sectors limits may be extended by a boundary equal to twice half the maximum mass sum window, or in other words, equal to the maximum mass sum window.

As described elsewhere herein, each mass sector allocates memory for different purposes. Some of these memory utilizations are of a fixed size, meaning that once the memory is allocated it is not increased. This is the case for memory used to store keep values. Other memory allocations may be of variable size such as those used to store zero-compressed raw data. In a real-time implementation, it may not be possible to know ahead of time the size of zero-compressed raw scans since each one has a different number of zero intensity values removed. The size may only be known when the raw scan data acquisition has finished and is passed to the Data Sweep algorithm for processing herein. Therefore, an embodiment may not set a fix capacity for the memory allocation dedicated to store multiple sections of compressed drift scans in a mass sector.

To cope with this uncertainty, these memory allocations may be set to an initial capacity that is increased as needed. The initial capacity may be based in an estimated average size of compressed drift scans, multiplied by the number of drift scan in the mass sector. If the initial capacity is set too large, most surely all drift scans will fit, but probably there will be wasted memory. On the other hand, if the initial capacity is set too small, there will be many memory re-allocations and copies of data. The initial capacity is chosen as a compromise between these two extremes. Therefore, all host memory mass sectors start with the same amount of memory, but each one increases its own memory capacity as may be needed to store its data. The foregoing also minimizes the amount of host memory needed since mass sectors located at the center of the mass axis tend to have more dense drift scans (less zero intensity values) than those at the extremes of the mass axis.

When a host memory mass sector determines that adding a new drift scan will overflow the capacity of its memory allocation, it may increase its capacity by an amount large enough to minimize the number of re-allocations. The device memory mass sector may not increase its memory capacity but may rather be set larger than the initial capacity of the host memory mass sectors.

As mentioned elsewhere herein, data in a host memory mass sector is copied into the device memory mass sector. To guarantee correct copies, a host memory mass sector capacity increase may not bring its total memory capacity above the capacity of the device memory mass sector. Therefore, there is a limit on how much a host memory mass sector may increase its memory capacity, which is determined by the capacity of the device memory mass sector.

As described herein, each host memory mass sector decides to increase its memory capacity up to a limit. When a host memory mass sector reaches this limit and still needs to increase its memory capacity, an embodiment may perform additional processing to divide the mass sector in two. The host memory mass sector may be replaced by two new host memory mass sectors, each with a mass range half the mass range of the original mass sector: the upper half and the lower half. The memory capacity of both mass sectors is set equal to the capacity of original mass sector. The total amount of host memory used increases, but the device memory used stays the same as no changes are made to the device memory mass sector. Given that each of the two new mass sectors have half the size (mass range) but the same memory capacity, most likely both will have enough capacity for half the original compressed data. However, a divided mass sector can be further divided as may be needed until this is achieved. It should be noted that once a mass sector is divided, the mass axis is no longer divided in a number of equally sized mass sectors.

Zero-compressed raw data may be stored in a mass sector using a set of block arrays, each containing a block of information pertaining to all drift scans of all full scans in the mass sector. One block array may store all non-zero intensity values from all drift scans in sequence. Another second block array may store the correspondent mass indices, and a third block array may store corresponding flags. These flags contain codes generated by the instrument to signal error conditions during acquisition. Two additional smaller arrays may also be used to allow addressing the data pertaining to a specific drift scan in the three block arrays described above. One of the two additional arrays contains the number of non-zero intensity values in each drift scan, and the second of the two additional arrays contains the offset of the first element of the drift scan from the beginning of the block array. In one embodiment described herein, these latter two arrays are used to address the block arrays since each drift scan has a different number of non-zero intensity values.

Each host memory mass sector may have four of the above-mentioned sets of block arrays. For the reasons explained elsewhere herein such as in connection with FIG. 11, these four sets of block arrays contain data in the previous, current, next, and lead scan packs within the mass sector range. The device memory mass sector has only three of these sets of block arrays: for the current, next, and lead scan packs. The previous scan pack's set of block arrays are not necessary for processing and is rather used by the host memory mass sectors to store output data. An embodiment may further include another set of the two smaller arrays described above, used to store the number of points kept in each drift scan and their offset after the block arrays have been reduced.

All mass sectors, both host memory and device memory mass sectors, may use three arrays for keep values. The three arrays used for keep values may store keep values in the previous, current, and next scan pack within the mass sector range. Given these arrays contain uncompressed data, depending on the data type used to store the keep values, the amount of memory required for these arrays may be large. To bring this memory requirement to the absolute minimum, each keep value may be represented by a single bit, resulting in these arrays also being referred to as "bit arrays" and their content may be referred to as "keeps". In an embodiment, the bits of the bit arrays may be, however, packed as 32 bit integers for fast processing by multiple GPU threads. In addition to these data arrays allocated in either host or device memory mass sectors, there are three arrays in device memory used by the device memory mass sector during computation. They are used to store partial sums in the current, next, and lead scan packs within the range of the mass sector being processed. As these three arrays contain uncompressed data, the device memory required for these arrays is the largest of all arrays. Fortunately, just as described herein for the device memory mass sector, these arrays may also be reused during processing of each mass sector.

What will now be described are design alternatives that may be used in an embodiment in accordance with techniques herein. The sequence of steps described in FIG. 3B may represent the order in which operations are performed in an embodiment. However, this is one among several possible sequences that can be obtained by permutation of the sums and the keeps steps. For example, the sums can be computed along the mass axis first, followed by the time axis, and then the drift axis, and/or the keeps can be computed first along the drift axis, followed by the mass axis, and then the time axis. Generally, the different axis or dimensions of data may be processed in any order when computing keep values and when computing sum values. The computation result is the same using any of the foregoing possible permutations, but the performance obtained and especially the memory resources needed may vary substantially from one to another.

To save memory, an embodiment in accordance with techniques herein may strive to perform in-place computations where possible. For a given computation step, this means the utilization of the same memory for input data and for output data. Some permutations favor in-place computation more than others. When in-place computation is not possible, more memory is required because input and output data need separate memory allocations.

As an example of how the order in which the steps are processed can affect the amount of computation, consider the sums computation as described in steps 352, 354 and 356 of FIG. 3B. In this case the sums are computed along the time axis first in step 352, then the drift axis in step 354, and lastly along the mass axis in step 356. In the discussion that follows for this example, when a scan pack is referred (current, next, or lead), it actually refers to the data within the mass range of a mass sector only, not of the entire scan pack. To compute the next scan pack of sums along the time axis, processing may be performed to decompress the current, next, and lead scan packs of raw data into the corresponding scan packs of partial sums mentioned above. An embodiment may use these three scan packs to compute in-place the sums along the time axis on the next scan pack of partial sums. Then, processing may compute in-place the sums along the drift axis on the next scan pack of partial sums. Finally, processing may compute the sums along the mass axis on the next scan pack of partial sums. In total, processing has decompressed three scan packs and computed sums in three scan packs.

As an alternative, now consider an embodiment which computes the sums along the mass axis first and the time axis last. In this case, the following may be performed:

1. Decompress the current, next, and lead scan packs of raw data into the correspondent scan packs of partial sums mentioned;
2. Compute in-place the sums along the mass axis on the current, the next, and the lead scan packs of partial sums;
3. Compute in-place the sums along the drift axis on the current, the next, and the lead scan packs of partial sums; and
4. Compute the sums along the time axis on the next scan pack of partial sums, using the current, the next, and the lead scan packs of partial sums.

In this alternative case, processing has decompressed three scan packs and computed sums in seven scan packs which is more than double the number of sums computations as compared to the original ordering as in FIG. 3B. It should be noted that in the alternative example above, in order to compute the next scan pack of sums along the time axis, processing needs to have available the current, next, and lead scan packs with sums already computed along the other two axes.

One way to reduce the number of sums computation in the alternative example above is to use the current and the next scan packs of partial sums to save partial sums along the mass and drift axes, instead of using them to decompress data. Thus, processing may decompress the lead scan pack of raw data into the lead scan pack of partial sums. Then, processing may compute the sums along the mass and drift axes, both in-place, on the lead scan pack of partial sums. Finally, processing may be performed to compute the sums along the time axis on the next scan pack of partial sums, using the current, the next, and the lead scan packs of partial sums. In total, processing has decompressed one scan pack and computed sums in three scan packs which is one third the amount of decompression operations performed as compared with the original version of the alternative described above.

Nevertheless, computing the sums along the mass axis in-place may not be very efficient in the GPU, although it may be improved with more complex GPU code. Therefore, an embodiment may compute the sums along the mass axis last, because the last axis does not have to compute the sums in-place. The axis for which sum computation is performed last receives partial sums computed along the other two axes. However, such processing for the last sum computation may output keep flags if step 358 (e.g., comparing final sums to a threshold) is performed at the same time as each final sum is computed. A similar rationale described in the sums computation examples above applies to the keep values computation.

Another alternative with advantages in some cases is to utilize transposed scan packs in embodiment. For example, a scan pack may have the mass and the time axes transposed such that instead of having scan elements on consecutive memory locations, it would have chromatogram elements on consecutive memory locations. Any two or the three axes can be transposed. Transposed scan packs have the advantage of providing coalesced memory reads and writes for certain GPU computations. One variant of transposed scan packs is when a processing step receives input data in a scan pack, but outputs data in a transposed scan pack. This may have the advantage of having coalesced reads and writes on this and on the following processing step. However, the GPU computation gets more complex, and the processing step cannot perform, obviously, computations in-place.

To eliminate the arrays dedicated for keep values as described above, an embodiment may reuse the partial sum arrays in connection with keep values. An embodiment may, for example, replace each sum above the threshold with a "1", or with a "0" otherwise. Then, such values may be used as the keep values. However, since an embodiment may need to save the previous and the current scan packs of keep values for the following scan pack computation, using such arrays for keep values would preclude from using these arrays for any further sum values.

The foregoing are some variations and alternatives that may be used in an embodiment in connection with performing the processing described in FIG. 3B. As will be appreciated by those skilled in the art, further alternatives and variations of the processing generally described herein may be used in an embodiment in accordance with techniques herein.

What will now be described are additional details regarding how the Data Sweep algorithm may be implemented in parallel using a GPU, or more generally, another component capable of performing parallel processing using multiple processors. It should be noted that in following paragraphs, discussion may not make a distinction between raw data sets of different dimensions such as, for example, regarding a raw data set generated by an LC/MS experiment (e.g. non-IMS data having two dimensions) and a raw data set generated by an LC/IMS/MS experiment (e.g., MS data having three dimensions). In one aspect, non-IMS data may be characterized as IMS data but with only one drift value. Furthermore, although following description, and other discussion herein, may refer to use of a GPU, such techniques and description herein are more generally applicable for use with any component capable of performing parallel processing using multiple processors.

As noted elsewhere herein, the GPU can handle thousands of concurrent programming threads, each processing one or more elements of a parallel computation. To facilitate parallel programming, CUDA organizes these threads in blocks, and the threads blocks are organized in a grid. The threads in a thread block, as well as the grid of blocks, can be indexed in one, two, or three dimensions. The function calls that run in the GPU are called "kernels" which may be launched from the CPU. Each kernel corresponds to a portion of parallel code that may be executed concurrently by multiple threads, where such threads are organized into a number of blocks. A "grid" of blocks may be run as a unit of computation on the GPU where the threads in the grid may execute the kernel code concurrently.

Figure 18:
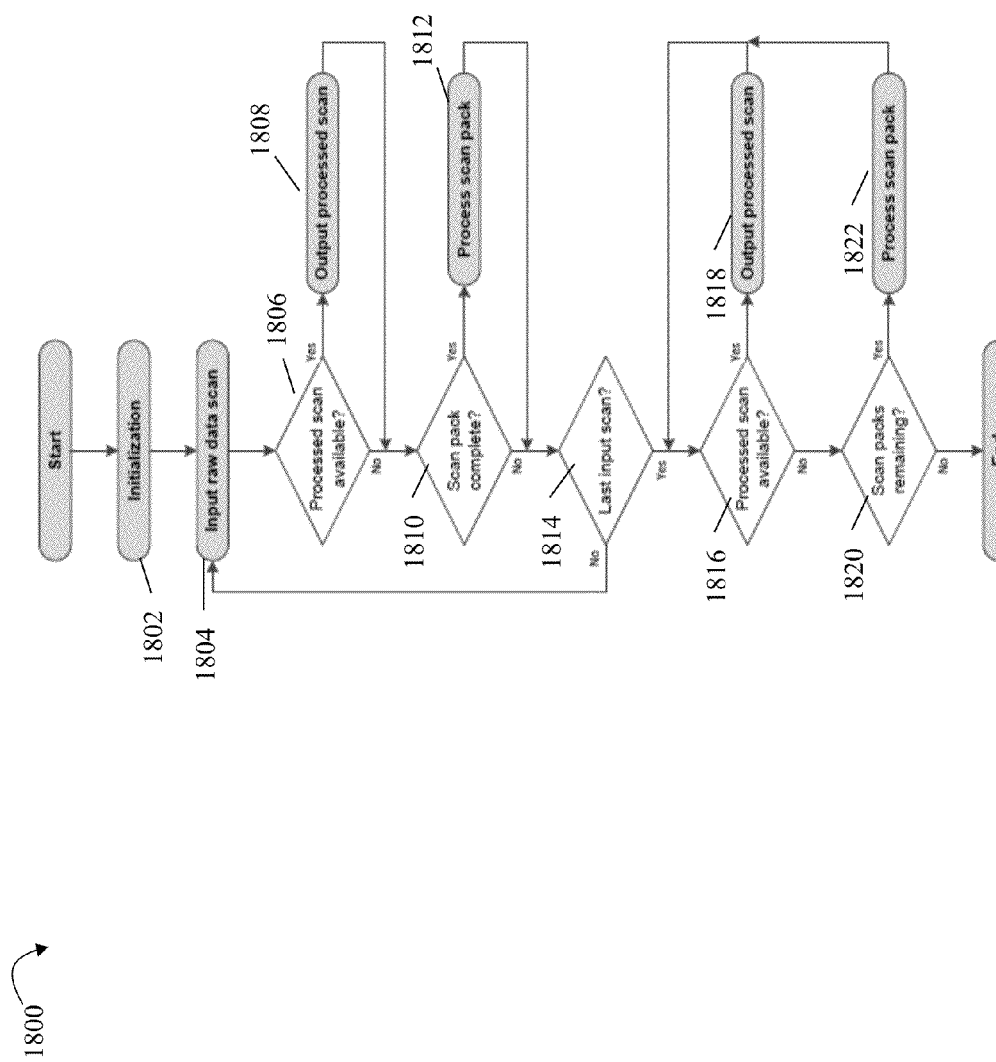
Figure 18A:
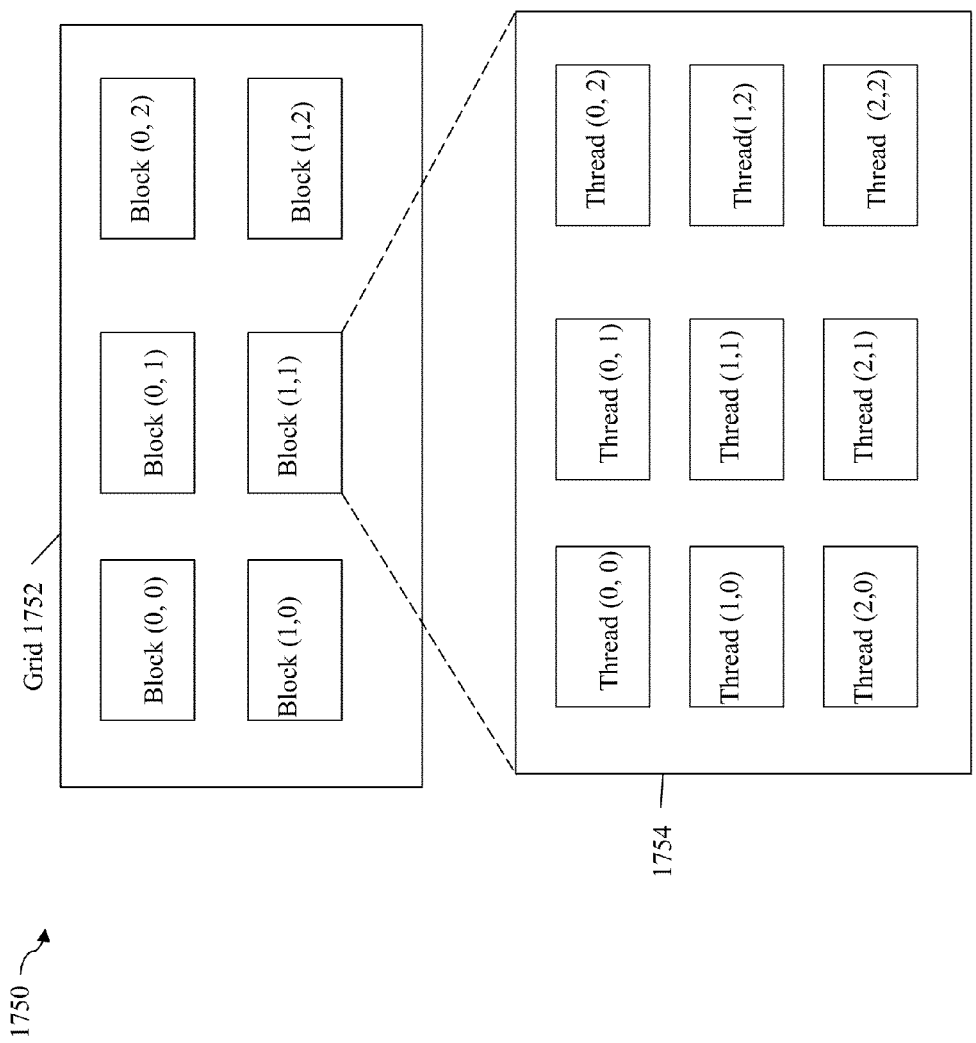
FIG. 18A is an example illustrating a thread hierarchy that may be used in an embodiment in accordance with techniques herein.

Referring to FIG. 18A, shown is an example illustrating the foregoing thread hierarchy that may be used in an embodiment in accordance with techniques herein. The example 1750 provides a general representation of the thread hierarchy that includes a grid 1752 of thread blocks. Each thread block in 1752 may include multiple threads as illustrated by 1754. All threads in a block run the same kernel or set of instructions. A thread block may have one, two or three dimensions although two dimensions are illustrated in connection with 1754. The maximum number of threads in a block may vary with the particular system. All thread blocks in the grid 1752 have the same size and run the same kernel. Thus, the threads in a grid executing a same kernel may be executed in parallel. A grid may have one, two or three dimensions although two dimensions are illustrated in 1750. The foregoing is a general representation of the thread hierarchy. Additional details regarding the particular dimensions and sizes of blocks and grids, and the like, as may be included in an embodiment in accordance with techniques herein are described elsewhere herein.

The Data Sweep compression techniques described herein may be implemented in an embodiment as a multithreaded application which uses two CPU threads in normal operation. Each instance of the algorithm processes one acquisition function, and at least two instances of the algorithm can run simultaneously in the same GPU card. In this manner, both the low and elevated energy MS data of the same acquisition or experimental analysis run can be processed at the same time. As described elsewhere herein, the raw data file, compressed using techniques herein, may be obtained by operating the mass spectrometer in an alternating scan mode thereby providing for acquisition of both low and elevated MS data in the same experimental run. Such raw data includes both low and elevated energy MS data that is acquired and compressed in real-time. In one aspect, such raw data may be characterized as comprising two data streams—one for the low energy MS data and a second for the elevated energy MS data—whereby each of the two data streams may be compressed by a separate executing code instance executing in a CPU.

In an embodiment using an application which performs processing described herein, the application may communicate with the instrument acquisition system or module of an MS instrument system using a software interface. Such an interface may be used to facilitate transmitting data between the acquisition module and code of the executing application (e.g., sending raw data scans from the acquisition module to code of the executing application, and also sending data from the executing application to the acquisition module).

Figure 25:
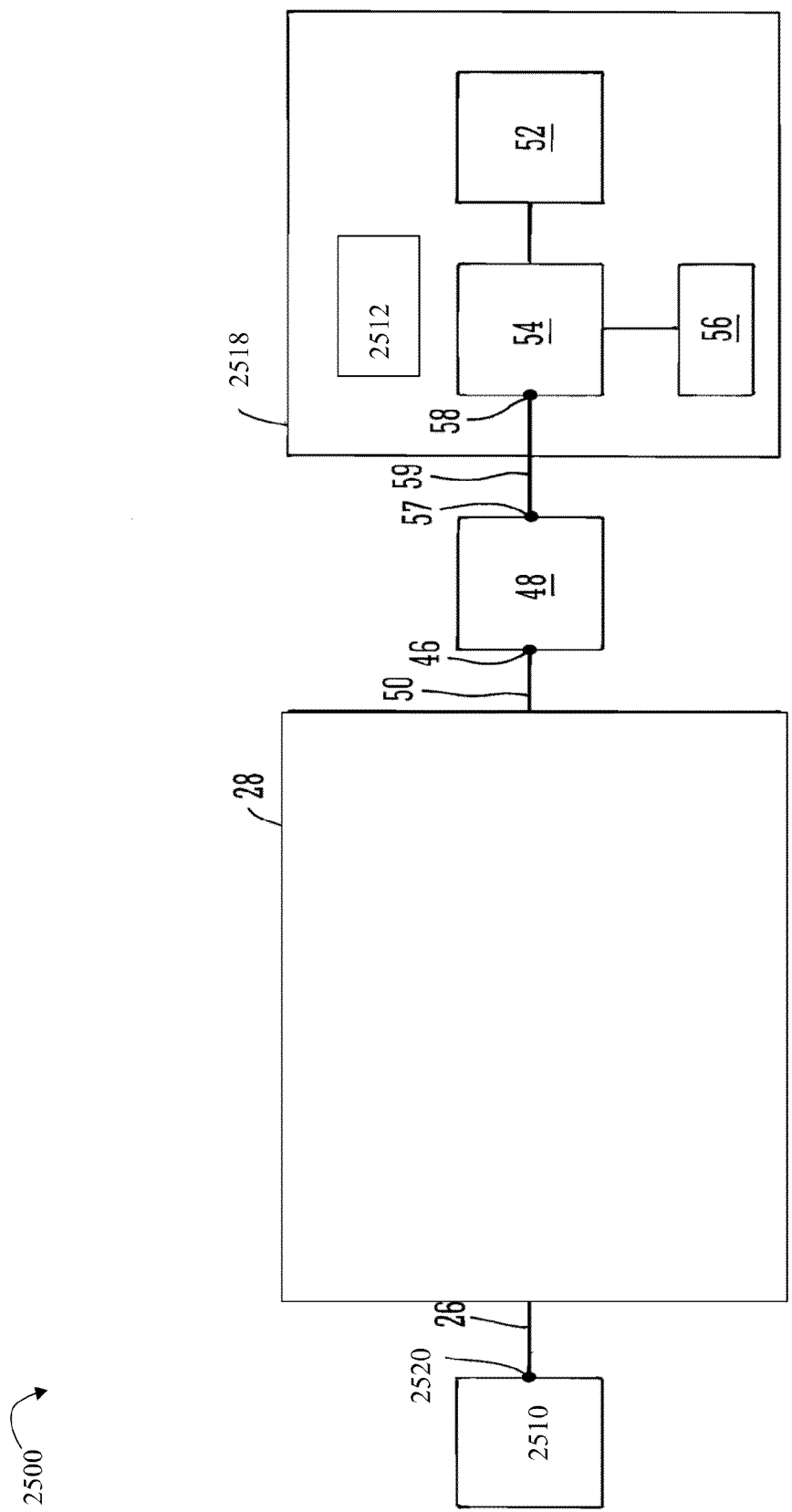
FIG. 25 is an example of a functional block diagram of components that may be used in an embodiment in accordance with techniques herein.

It should be noted that the acquisition system or module and other components of a system utilizing techniques herein are described in more detail elsewhere such as, for example, in connection with FIG. 25.

Scans may be passed using this interface as full scans, i.e., a single scan for non-IMS data, or a block of 200 drift scans for IMS data. In one embodiment, the interface may define a method that the acquisition module calls to pass one scan of data to the executing application. The interface also defines a callback method that the application performing processing described herein may call to pass one scan to the acquisition module. When the application receives a raw data scan, processing may be performed to make a copy and may then processes the scan at a later point in time, when it is appropriate to do so, independent of the acquisition module processing. Similarly, when the acquisition module receives a processed scan, it makes a copy immediately and then may perform any necessary further processing of the scan at a later point in time, when it is appropriate to do so, independent of the application code execution. Each of the application and the acquisition module may maintain a queue where the scan copies are placed. In this manner, the queue may be used as a buffer to temporarily store a new scan of data which arrives when the previous scan is still being processed.

Processed scans may be output in the same order as the raw data input scans are received, and such processed scans may be output at the same rate after an initial input-output delay of three scan packs explained elsewhere herein.

The interface used may also define an initialization method that the acquisition module calls before processing starts. With this method, the acquisition module may pass the application the parameters required to setup processing, as well as the callback method to be used to return processed scans. The application may return a value with the initialization method where the value indicates the input-output scan delay that the acquisition module should expect.

It should be noted that in connection with the interface, a series of error codes may be defined identifying possible error conditions that may result during execution of the application. In this manner, when an error occurs during execution of the application, the application may notify the acquisition module with a suitable error code regarding the runtime error state. The interface may also define a cancellation method that may be used by the acquisition module to stop processing. It should be noted that in an embodiment described herein, the cancellation method may be used to stop normal processing such as a result of a user request.

In following paragraphs, reference is made to FIGS. 18-24. FIG. 18 is a top level flowchart of processing steps whereby additional detail of steps of FIG. 18 are described further in FIGS. 19-23.

Figure 23:
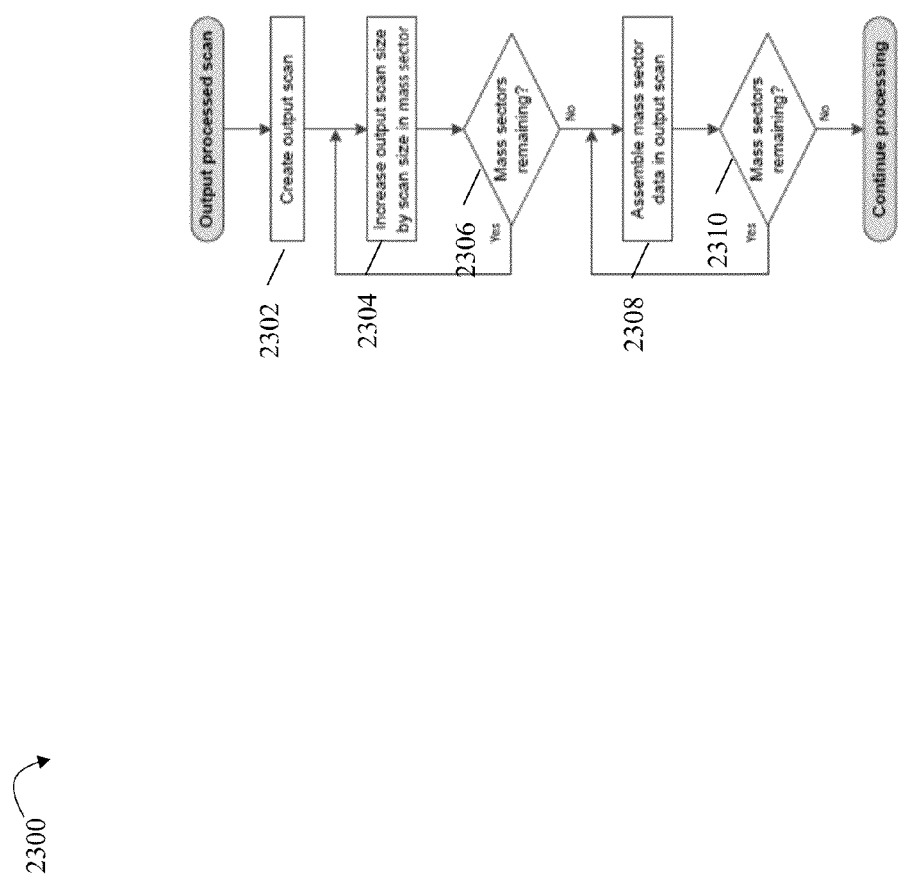

Referring to FIG. 18, shown is a high level flowchart of processing steps that may be performed in an embodiment in accordance with techniques herein. At step 1802, initialization processing may be performed. During initialization, several one-time events may occur (e.g., once per data set acquisition). Step 1802 is described in more detail in connection with FIG. 19. After initialization processing in step 1802, control proceeds to step 1804 where a raw data scan is received for processing by the application code. In one embodiment as described herein, the application may receive zero-compressed raw data scans in real-time. The scans may include LC/MS data scans or LC/IMS/MS data scans. The scans arrive one after another at the same rate the acquisition module acquires them. Step 1804 is described in more detail in connection with FIG. 20. In step 1806, a determination is made as to whether a processed scan is available. If step 1806 evaluates to yes, control proceeds to step 1808 to output the processed scan. In step 1808, the executing application code may output processed scans in real-time. The scans may be output one after another at the same rate the input raw data scans arrive and in the same order. FIG. 23 discussed below provides additional detail regarding the processing of step 1808. From step 1808, control proceeds to step 1810. If step 1806 evaluates to no, control proceeds directly to step 1810.

In step 1810, a determination is made as to whether a next complete scan pack of data has been received which has not yet been processed. If step 1810 evaluates to yes, control proceeds to step 1812 to process the next scan pack. Additional detail regarding step 1812 is described in connection with FIG. 21 below. From step 1812, control proceeds to step 1814. If step 1810 evaluates to no, control proceeds directly to step 1814. In step 1814, a determination is made as to whether processing is currently being performed for the last input scan of the current acquisition. If step 1814 evaluates to no, control proceeds to step 1804 to process the next raw data scan. If step 1814 evaluates to yes, control proceeds to step 1816.

In step 1816, a determination is made as to whether a processed scan is available and pending to be output. If step 1816 evaluates to yes, control proceeds to step 1818 to output the processed scan to the acquisition module. Step 1818 processing is similar to that as described in connection with step 1808 above. From step 1818, control proceeds to step 1816. If step 1816 evaluates to no, control proceeds to step 1820 to determine whether there are any scan packs remaining which need to be processed (e.g., where such scan packs may be in a queue awaiting processing). If step 1820 evaluates to yes, control proceeds to step 1822 to process the next scan pack. Step 1822 processing is similar to that as described herein in connection with step 1812. From step 1822, control proceeds to step 1816. If step 1820 evaluates to no, processing of the flowchart 1800 stops.

In connection with FIG. 18, recall that the embodiment described herein processes scans in packs (the scan pack) rather than each scan individually. Given that input scans arrive one at a time (step 1804), scans are accumulated until a scan pack is full (when step 1810 evaluates to yes). When the scan pack is full, it is processed (step 1812) producing the same number of processed scans. However, in the embodiment described herein, these processed scans are not output all at once, but rather one at a time at the rate of the following incoming input scans (i.e., step 1808 outputs processed scans at the same rate at which scans are input in step 1804).

Also, recall in the embodiment described herein that there is a three scan pack delay from input to output, so there won't be any processed scans (as in step 1806) until several input scans have arrived. Also a consequence of this delay is what happens after the last input scan arrives (when step 1814 evaluates to yes). At this point, there will be processed scans pending to be output and accumulated scan packs pending to be processed. As a first next step, processing is performed to output all such processed scans awaiting output. Since there is no longer any arriving input scans, all these processed scans are output one at a time (step 1818) as fast as the acquisition module can take them. Once all these pending processed scans are output (i.e., step 1816 evaluates to no), a determination is made (step 1820) as to whether there are any scan packs pending to be processed, and if so, each such scan pack is processed (in step 1822). This processing generates a number of processed scans that need to be output. Therefore, processing from step 1822 goes back to step 1816 to output the processed scans as described above. This loop continues until there are no more scan packs pending to be processed, and no more processed scans pending to be output (i.e., both elements 1816 and 1820 evaluate to NO).

Figure 19:
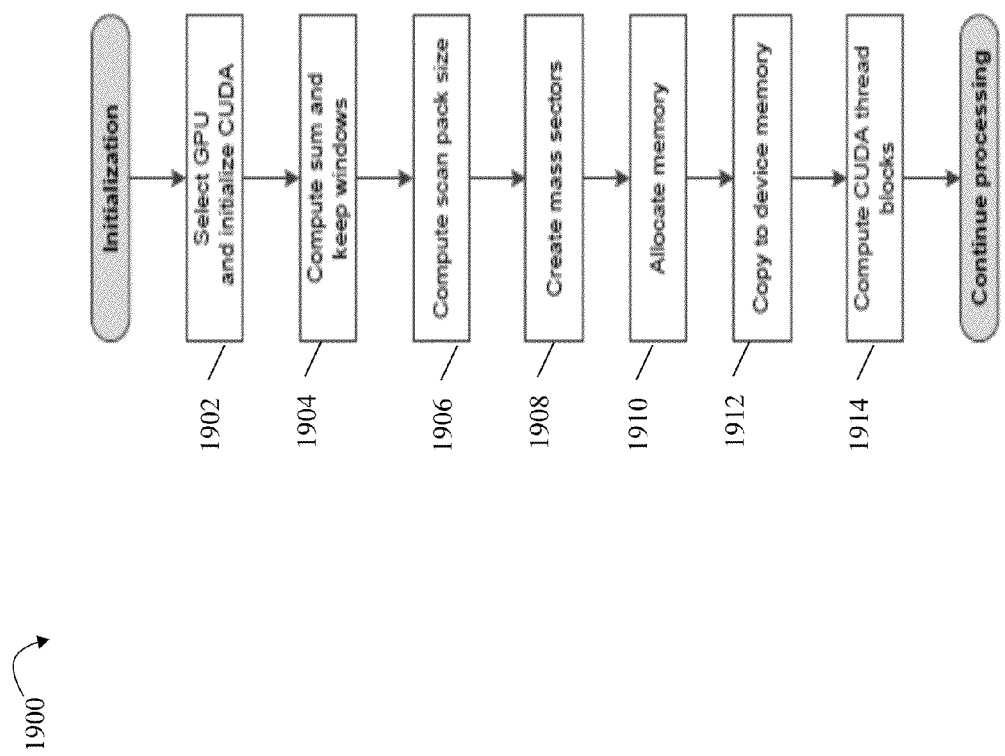

Referring to FIG. 19, shown is a flowchart of processing steps that may be performed for initialization processing, as in step 1802 of FIG. 18, in an embodiment in accordance with techniques herein. At step 1902, selection of the GPU is performed thereby identifying the component used in connection with performing processing for data compression. Additionally, any processing needed for initialization of CUDA for use with the selected GPU. It should be noted that an embodiment may have more than one GPU card installed and available for use with techniques herein. If the acquisition module creates more than one instance of a process or application performing techniques herein for a single acquisition of raw data, only one of such instance may perform the GPU card selection and CUDA initialization.

At step 1904, processing is performed to determine the sum and keep windows. Step 1904 may include checking the validity of processing parameters passed by the acquisition module to the executing application code performing the processing, and then such processing parameter may be used to determine the sum windows (e.g., chrom, drift, and mass sum windows) and the threshold value at each mass index. The threshold values may be those used in connection with FIG. 5 processing used in comparisons to the various intensity sums. In step 1904, the keep windows may be computed from the sum windows as described elsewhere herein.

At step 1906, the scan pack size may be determined. Based on the chrom sum window (sum window along the time axis), the minimum number of scans in a scan pack is computed. Additionally, to further enhance GPU performance, an embodiment may further round up the scan pack size to the next multiple of eight as described elsewhere herein. Additionally, as also mentioned above, the scan pack size may have a minimum values of 16 in an embodiment. It should be noted that the processing delay in connection with returning a first processed scan to the acquisition module is three times the scan pack size computed here.

At step 1908, based on the scan pack size and the amount of device memory required for computation, the size and number of mass sectors is computed. Once the mass sector size and number are determined, processing may be performed to allocate storage and create all host memory mass sectors and device memory mass sector(s). If there is only one host memory mass sector, as may be the case for some LC/MS raw data sets, an embodiment may create only one device memory mass sector. However, if there are two or more host memory mass sectors and overlapping of memory transfers and computation is enabled as described elsewhere herein, then step 1908 processing may include creating two device memory mass sectors.

At step 1910, once the mass sectors have been created, memory for all their internal arrays is allocated. For device memory, in addition to the memory required by the device memory mass sector(s), there is additional memory allocated for arrays to hold data for the sum and keep windows, the thresholds, and the arrays of partial sums.

At step 1912, once device memory is allocated, the sum and keep windows, as well as the thresholds, are copied from host memory to device memory so the GPU can use them during processing.

At step 1914, CUDA-specific parameters may be determined. Step 1914 may include determining the CUDA thread block and grid dimensions for each of the CUDA kernels used during processing. These dimensions may be determined using any suitable technique to maximize GPU performance. Many CUDA kernels use shared memory, a limited resource within the GPU. The amount of shared memory used depends on the thread block dimensions and on the sum or keep window size along each axis. If the amount of shared memory utilized is excessive such as due to a large sum window, the corresponding thread block dimension may be reduced by half. If the amount of shared memory required is still excessive, it generally indicates the sum window is unreasonably large and the initialization returns an error. From step 1914, control returns to FIG. 18 to continue processing following step 1802.

Figure 20:
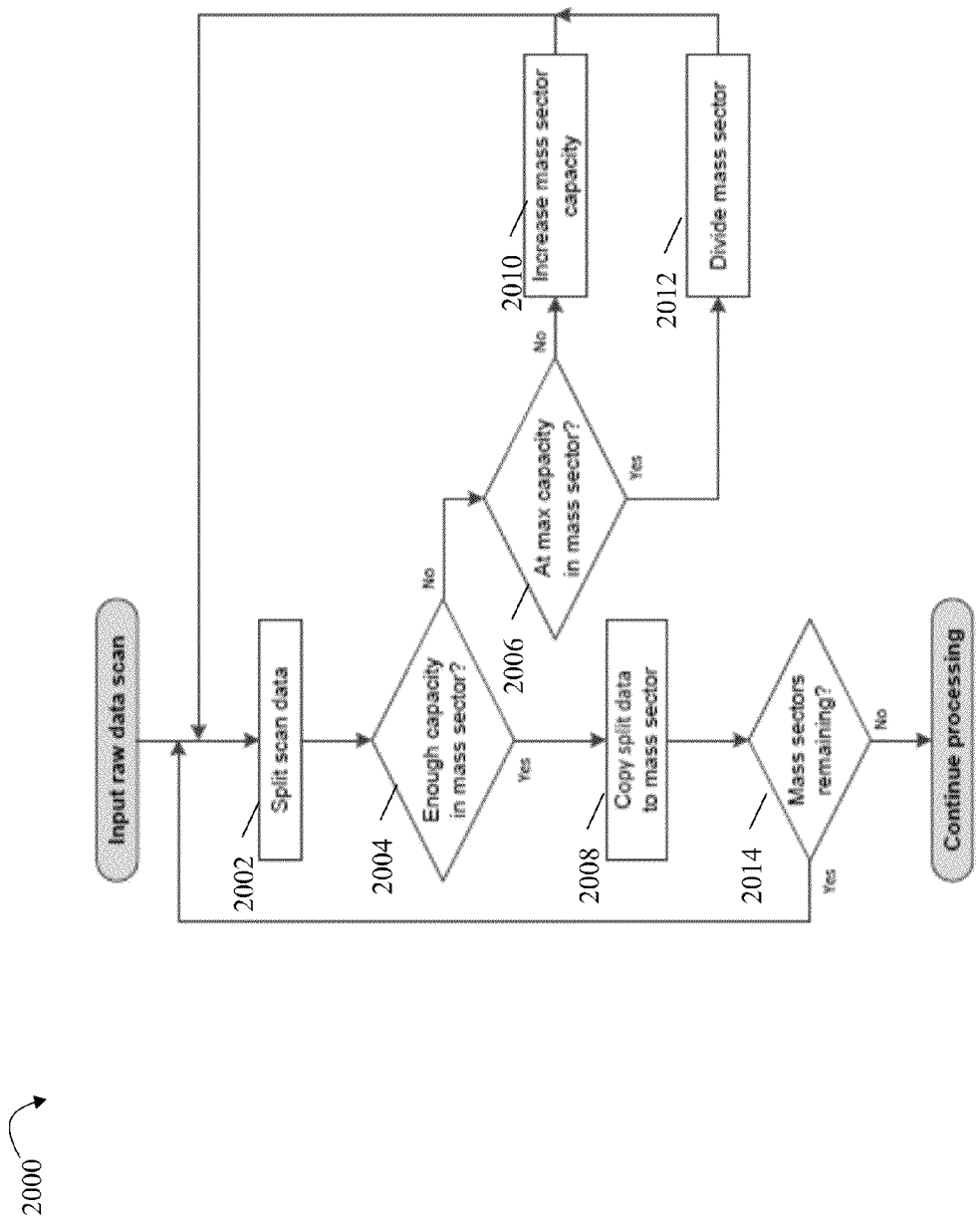

Referring to FIG. 20, shown is a flowchart of processing steps performed to input a raw data scan in an embodiment in accordance with techniques herein. The flowchart 2000 provides additional detailed processing of step 1804 of FIG. 18. As described herein, the executing application code performing the processing for compression may receive zero-compressed raw data scans in real-time, either non-IMS or IMS full data scans. The scans arrive one after another at the same rate the acquisition module acquires them. Upon arrival, each received scan is split in step 2002 into as many pieces as there are host memory mass sectors by splitting each drift scan individually as described elsewhere herein such as in connection with FIG. 14. Each piece may be copied into the "lead" block arrays, as noted elsewhere herein, of the corresponding mass sector. At this point, processing may determine in step 2004 as to whether there is sufficient capacity in the current mass sector. As described above, processing may be determined with respect to each mass sector regarding whether to increase the capacity of its blocks arrays if the arrival of new data would overflow its capacity. If step 2004 evaluates to yes indicating the current mass sector has sufficient capacity, control proceeds to step 2008 to copy the split scan data to the current mass sector. At step 2014, a determination is made as to whether there are any remaining sectors of scan data to be processed. If step 2014 evaluates to yes, control proceeds to step 2002. If step 2014 evaluates to no, processing of the flowchart 2000 returns to FIG. 18 following step 1804.

If step 2004 evaluates to no indicating that the capacity of the current mass sector is insufficient, control proceeds to step 2006 where a determination is made as to whether the current mass sector is at the maximum allowable capacity. If step 2006 evaluates to no, control proceeds to step 2010 to increase the mass sector capacity. From step 2010, control proceeds to step 2002. If step 2006 evaluates to yes, control proceeds to step 2012 to divide the mass sector. From step 2012, control proceeds to step 2002.

It should be noted that the processing performed in connection with FIG. 20 has each mass sector accumulate its corresponding scan data in sequence until the number of received scans is a multiple of the scan pack size. At that point, the "lead" scan pack of all mass sectors is complete and processing of the scan pack can begin as described in FIG. 21.

It should be noted that code for storing data in the mass sector as in FIG. 20 may also include processing for maintaining in its other associated block arrays corresponding data pertaining to other scan packs, such as the next, current, and previous scan packs.

Figure 21:
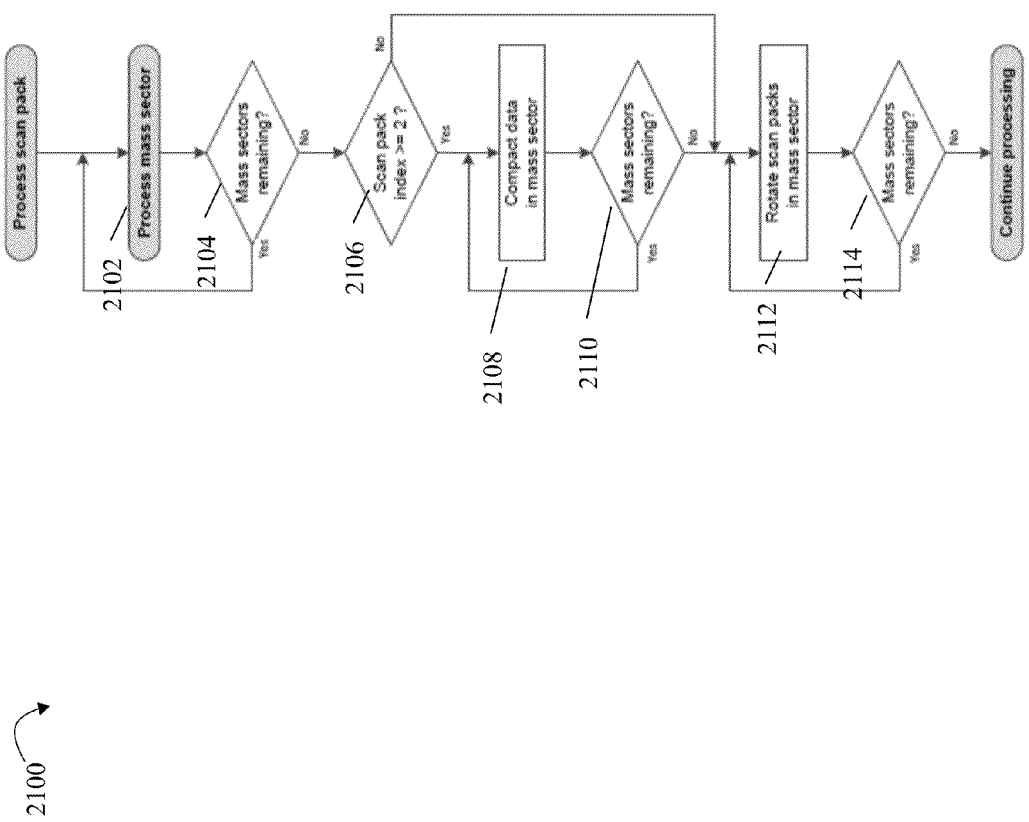

Referring to FIG. 21, shown is a flowchart of processing steps performed to process a scan pack of data in an embodiment in accordance with techniques herein. The flowchart 2100 provides additional detailed processing of step 1812 and step 1822 of FIG. 18. It should be noted that processing of FIG. 21 may be performed only on completed scan packs. Therefore, there may be no processing activity while scans are being received and accumulated in the mass sectors as described in connection with FIG. 20 processing. Once the number of received scans is a multiple of the scan pack size, thereby completing a scan pack, the completed scan pack is then processed. It should be noted that there may be an exception to the foregoing related to processing an incomplete scan pack. An incomplete scan pack may be processed only if it is the last scan pack, which may not be full (since the acquired raw data is not guaranteed to be an exact multiple of scan pack size).

As noted elsewhere herein, processing of all mass sectors in a scan pack is performed based on the sequence in which the mass sectors appear in the scan pack. At step 2102, mass sector processing performed for the next mass sector in the current scan pack. Additional detail regarding step 2102 processing is described below in connection with FIG. 22. In following paragraphs, discussion first proceeds with FIG. 22 processing providing more detail regarding step 2102. Subsequently, discussion then returns to further describe processing following step 2102 of FIG. 21.

Figure 22:
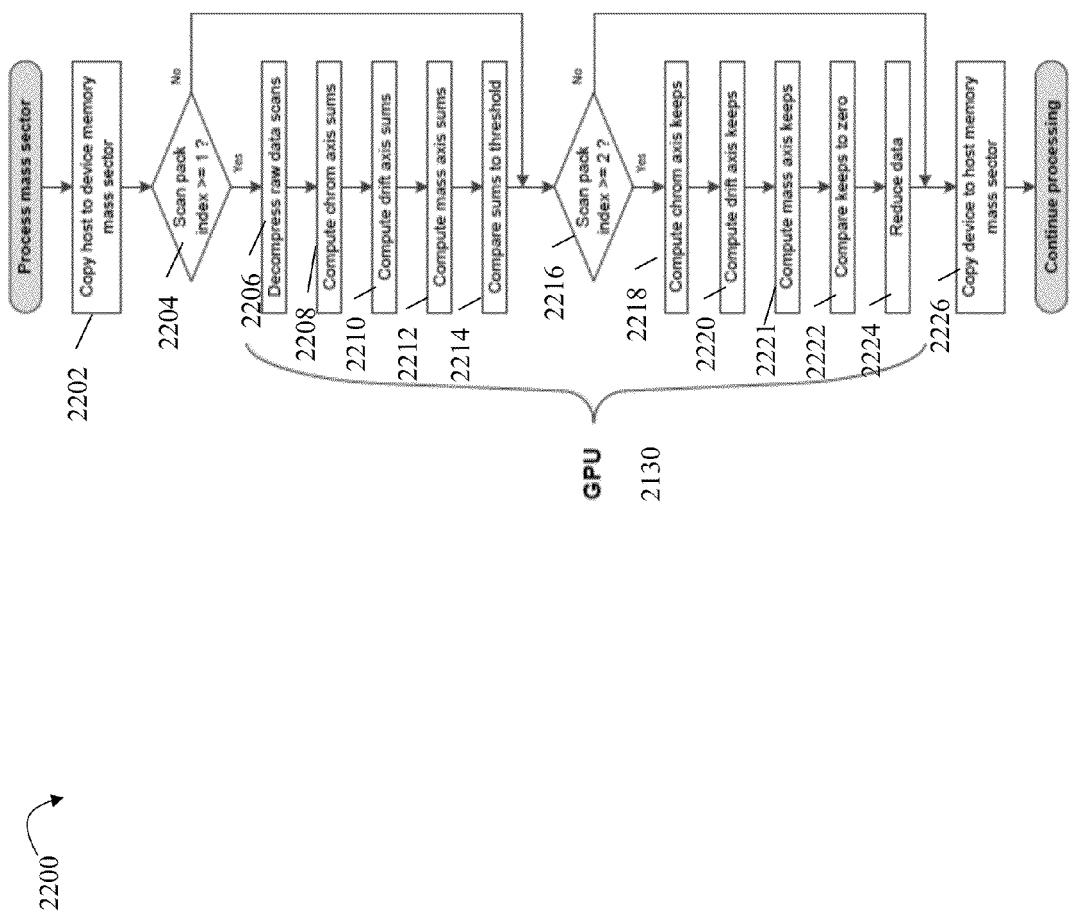

With reference now to FIG. 22, processing is performed for the current mass sector selected in connection with step 2102 of FIG. 21. FIG. 22 provides additional detail regarding processing performed on each mass sector of a scan pack. As each mass sector is processed independently of the others, it is responsible for maintaining in its memory the input raw data for the necessary scan packs (lead, next, current, and previous), saving intermediate values used for processing subsequent scan packs, and saving the processed output data. It should be noted that as described elsewhere herein such as in connection with FIG. 11, to process the first scan pack requires that all mass sectors have accumulated two scan packs of raw data: the lead and the next scan packs. This represents one scan pack delay and allows performing only steps 2206, 2208, 2210, 2212 and 2214 (e.g. sum computation) on the first scan pack. Similarly, also according to FIG. 11, to perform steps 2218, 2220, 2221, 2222, and 2224 (e.g., the keeps computation) on the first scan pack requires that all mass sectors have accumulated three scan packs of raw data: the lead, next, and current scan packs. This represents a two scan packs delay. For LC/MS or non-IMS data, steps 2210 and 2220 described below for the drift axis are omitted.

At step 2202, processing is performed to copy the current mass sector of data from the host mass sector to the device mass sector. Data processed by the GPU needs to be located in device memory. In this step 2202, data in the host memory mass sector being processed is copied into the device memory mass sector. If there are two device memory mass sectors, as described elsewhere herein, even host memory mass sectors may be copied to one of the two device memory mass sectors, and odd host memory mass sectors may be copied to the other. Most, but not all data arrays in the host memory mass sector described above, may be copied to the device memory mass sector. In one embodiment described herein, the "previous" block arrays and the "next" keeps bit array may not be copied. Also, the mass range of the device memory mass sector may be set the same as the host memory mass sector range.

It should be noted that processing steps described below which are included in element 2130 may be performed on the GPU using the device memory mass sector data arrays.

At step 2204, a determination is made as to whether the scan pack index of the current scan pack being processed is greater than or equal to 1. The scan pack index may start with 0 as described herein and represent a sequence number denoting the placement or ordering of the current scan pack relative to other scan packs in the current raw data set being processed. For the first scan pack denoted by scan pack index 0, processing of steps 2206-2214 may be omitted. If step 2204 evaluates to no, control proceeds to step 2216 described below. If step 2204 evaluates to yes, control proceeds to step

2206 to decompress the raw data scans of the current scan pack. Zero-compressed raw data on the current, next, and lead block arrays of the mass sector is decompressed on respective arrays of partial sums. Recall that the partial sums arrays described elsewhere herein are three arrays in device memory (current, next, and lead), not part of any mass sector, and are each sized large enough to hold uncompressed data for one mass sector. The foregoing partial sums arrays are used by the device memory mass sector to store uncompressed partial sum values.

In one embodiment, a single CUDA kernel may perform the decompression. The CUDA kernel may be invoked three times, one for each partial sums array to decompress. The three partial sum arrays where the data is decompressed are cleared (all values set to zero) before the kernel is invoked. The kernel uses three-dimensional thread blocks with the x dimension along the mass axis, the y dimension along the time axis, and the z dimension along the drift axis. The grid x dimension is determined by the drift scan with most data points among all drift scans in the mass sector. Each thread in the block decompresses one point in the array of zero-compressed raw data. The thread reads the mass index and the intensity value of the compressed point in the compressed arrays, and writes the intensity to the uncompressed array at the location determined by the mass index. Memory reads are coalesced (consecutive threads read consecutive memory locations), but write coalescence depends on the sparsity of the data. After step 2206 is complete, the three partial sum arrays of device memory contain the full, uncompressed, raw data of the mass sector: the current, next, and lead uncompressed raw data.

At step 2208, processing is performed to compute the partial sums along the time (chrom) axis on the uncompressed raw data contained in the "next" partial sums array (e.g., that was computed via decompression in step 2206). The computation of step 2208 may be in-place, so the computed sums are saved in the "next" partial sums array. Note that as described above, to compute sums near the first and last scans in the input raw data (in the "next" partial sums array), processing needs input raw data beyond that (e.g., uses data in the "lead" and the "current" partial sums arrays). This is the reason why these three arrays are decompressed in step 2206.

In step 2208 processing, one CUDA kernel may compute the partial sums. It may utilize two-dimensional thread blocks with the x dimension along the mass axis and the y dimension along the drift axis. Each thread in the block computes the sum of all data points in one chromatogram in the data (e.g., computes a sum value for all points for a given mass and drift coordinates within the mass sector), processing one point after another in series. Thus, multiple partial sums along the chromatographic time axis for the current mass sector may be computed in parallel in step 2108 by the multiple executing threads.

For each data point of one chromatogram within the "next" partial sums array, the corresponding thread reads the points in the chromatogram that are required to compute the sum at that data point, computes the sum, and writes the sum in-place back to the "next" partial sums array. Notice that to compute the sums, the thread may also need to read some data points before and after the chromatogram falling on the "lead" and the "current" partial sums arrays. Memory reads and writes may be coalesced in this kernel (consecutive threads read and write consecutive memory locations).

To minimize the number of operations and to enable the in-place computation, each thread may use a circular buffer in shared memory. The thread may use the buffer to store the points required to compute the sum at any given data point. The content in the buffer is accordingly updated as the computation progresses. This allows computing each sum value utilizing the immediately prior computed sum value and also performing two additional sum operations using data in the buffer. In an embodiment using the foregoing technique, the amount of computation performed may be characterized as independent of the sum window size, and allows for the in-place computation as data points already copied to the buffer can safely be overwritten in the "next" partial sums array. After step 2208 has completed, the "next" partial sum array contains partial sums computed along the time (chrom) axis only.

In step 2210, processing is performed to compute the sum values along the drift axis using the partial sums determined in step 2208 (e.g., whereby such sum values are included in the "next" partial sums array). The computation performed in step 2210 may be in-place, so the computed sums are saved in the "next" partial sums array. For non-IMS data, step 2210 is omitted.

In one embodiment, processing of step 2210 may be performed using a single CUDA kernel to compute the sum values. The kernel may use two-dimensional thread blocks with the x dimension along the mass axis and the y dimension along the time axis. Each thread in the block computes the sums of all data points in one "driftogram" in the data (e.g., all points for a given mass and time coordinates within the mass sector), processing one point after another in series. Thus, multiple partial sums along the drift axis for the current mass sector may be computed in parallel in step 2210 by the multiple executing threads.

For each data point of one driftogram within the "next" partial sums array, the corresponding thread reads the points in the driftogram that are required to compute the sum at that data point, computes the sum, and writes the sum in-place back to the "next" partial sums array. Memory reads and writes are coalesced in this kernel (consecutive threads read and write consecutive memory locations). To minimize the number of operations and to enable the in-place computation, each thread uses a circular buffer in shared memory. The thread uses the buffer to store the points required to compute the sum at any given data point. The content in the buffer is, obviously, updated as the computation progresses. This allows computing each sum in a manner as described above in connection with step 2208 using the immediately preceding sum value. This technique makes the amount of computation independent of the sum window size, and enables the in-place computation as data points already copied to the buffer can safely be overwritten in the "next" partial sums array. After step 2210 has completed, the "next" partial sum array contains partial sums computed along the time and drift axes.

In step 2212, processing is performed to compute the sum values along the mass axis using the partial sums determined in step 2210 (e.g., whereby such sum values are included in the "next" partial sums array). The computed sums determined in step 2212 are final sum values as they include sum values obtained by adding intensities along the three axes.

Following step 2212 is step 2214 where the final sum values may be compared to the threshold to determine a keep flag value for associate data points. Step 2214 may include saving the resultant keep flags to the "next" keeps bit array. The computation of steps 2212 and 2214 may not be performed in-place as the input and output data are in different arrays. The foregoing may be intentionally performed in an embodiment for the reasons explained elsewhere herein.

In one embodiment, a single CUDA kernel may perform all processing for steps 2212 and 2214. The kernel may use three-dimensional thread blocks with the x dimension along the mass axis, the y dimension along the time axis, and the z dimension along the drift axis. Each thread in the block processes only one data point of one scan within the mass sector. For each data point of one scan within the "next" partial sums array, the corresponding thread reads the points in the scan that are required to compute the sum at that data point, and computes the final sum for that point. Then it computes a flag for the final sum such that the flag is set if the final sum is above the threshold, and writes the flag as one bit to the "next" keeps bit array. Memory reads may be coalesced in this kernel (consecutive threads read consecutive memory locations), but writes may not be because only some threads write the flag bits, although they do it in groups of 32 bits.

It should be noted that there is a difference between this CUDA kernel used in performing steps 2212 and 2214 in comparison to the kernels described above which are used in steps 2208 and 2210 to compute the sums along the time and drift axes. Threads in this kernel used in steps 2212 and 2214 do not use a circular buffer to store the points required to compute the sum at any given data point. To take advantage of the first benefit provided by the technique using the circular buffer, i.e., that each sum can be computed from the one before and just two sum operations, each thread would have to compute the sums of all data points in one scan within the mass sector. This has two main problems. First, reads would be completely uncoalesced, although memory cache would help somehow, so memory accesses would represent a big penalty in performance. Second, given that the mass sector dimensions along the time and drift axes are much smaller than in the mass axis, it would lead to either small thread blocks, or a small number of thread blocks. In either case, the GPU occupancy would be very small leading to poor performance. The second advantage provided by the circular buffer technique, i.e., making the amount of computation independent of the sum window size, is also not available in this kernel used in steps 2212 and 2214. Therefore, the amount of computation is proportional to the mass sum window size. Fortunately, the average size of the mass sum window is usually smaller than the sum window size in the other two axes. Finally, the third advantage provided by the circular buffer technique, i.e., enabling the in-place computation, is irrelevant in this case because, as it was mentioned earlier, the computation in this step is not in-place. Nevertheless, the kernel performance in steps 2212 and 2214 is similar to performance of the kernels used in steps 2208 and 2210 to compute sums along the time and drift axes, mainly due to the fact that all reads are fully coalesced and the number of thread blocks is large. After step 2214 has completed, the "next" keeps bit array contains initial keep values in the mass sector. Following step 2214, control proceeds to step 2216.

At step 2216, a determination is made as to whether the scan pack index is greater than or equal to 2. If step 2216 evaluates to no, control proceeds to step 2226 described below. If step 2216 evaluates to yes, control proceeds to step 2218. For the first and second scan pack denoted, respectively, by scan pack indices 0 and 1, processing of steps 2218-2224 may be omitted. At step 2218, processing may be performed to compute the partial keep values along the time (chrom) axis by summing keep flags contained in the "current" keeps bit array (e.g., as determined in step 2214). The computation may be performed in-place, so the computed keeps may be saved in the "current" keeps bit array. The "current" keeps bit array is the "next" keeps bit array that was computed in step 2214 one scan pack before.

As noted elsewhere herein, to compute keep values near the first and last scans in the input data (in the "current" keeps bit array), processing may use input data beyond that of the current keeps bit array (e.g., may use data from the "next" and the "previous" keeps bit arrays). This is the reason why the "current" and the "previous" keeps bit arrays are saved in the mass sector memory.

In one embodiment, processing of step 2218 may be performed using a single CUDA kernel to compute the keeps. It uses two-dimensional thread blocks with the x dimension along the mass axis and the y dimension along the drift axis. Each thread in the block computes the keeps of all data points in 32 consecutive chromatograms in the data (all points for a given drift coordinate and 32 consecutive mass coordinates within the mass sector). The thread processes the 32 chromatograms simultaneously by grouping 32 points, one from each chromatogram, and processing a group after another in series. For each group of 32 data points of 32 chromatograms within the "current" keeps bit array, the corresponding thread reads the points in the 32 chromatograms that are required to compute the 32 keeps sums at those 32 data points. Then, the thread computes the 32 keeps sums, performs processing to limit the sums to values between 0 and 1, inclusively (e.g., any sum greater than the maximum value of 1 is set to 1), and writes the 32 sums in-place back to the "current" keeps bit array, as one bit each. Memory reads and writes may be coalesced in this kernel.

In one embodiment, to minimize the number of operations and to enable the in-place computation, each thread may use 32 independent circular buffers in shared memory, one for each of the 32 chromatograms handled by the thread. The thread may use the buffers to store the points required to compute the 32 keeps sums at any given 32 data points. The content in the buffer is, obviously, updated as the computation progresses. This allows computing each of the 32 keeps sums using the keep sum immediately prior and additionally using two sum operations per chromatogram using data in the buffer. This technique also makes the amount of computation independent of the keep window size, and enables the in-place computation as data points already copied to the buffer can safely be overwritten in the "current" keeps bit array. After step 2218 has completed, the "current" keeps bit array contains keeps computed along the time (chrom) axis only.

Step 2220 processing computes keeps along the drift axis using the keeps determined in step 2218 (e.g., whereby such keep values are included in the "current" keeps bit array). The computation may be in-place, so the computed keeps are saved in the "current" keeps bit array. For non-IMS data this step 2220 is omitted.

Processing of step 2220 may be performed by using a single CUDA kernel to compute the keeps. The kernel may use a two-dimensional thread blocks with the x dimension along the mass axis and the y dimension along the time axis. Each thread in the block may compute the keeps of all data points in 32 consecutive driftograms in the data (all points for a given time coordinate and 32 consecutive mass coordinates within the mass sector). The thread processes the 32 driftograms simultaneously by grouping 32 points, one from each driftogram, and processing a group after another in series. For each group of 32 data points of 32 driftograms within the "current" keeps bit array, the corresponding thread may read the points in the 32 driftograms that are required to compute the 32 keeps sums at those 32 data points. Then, the thread may compute the 32 keeps sums, performs processing to limit the sums to values between 0 and 1, inclusively (e.g., any sum greater than the maximum value of 1 is set to 1), and writes the 32 sums in-place back to the "current" keeps bit array, as one bit each. Memory reads and writes may be coalesced in this kernel.

To minimize the number of operations and to enable the in-place computation, each thread may use 32 independent circular buffers in shared memory, one for each of the 32 driftograms handled by the thread. The thread may use the buffers to store the points required to compute the 32 keeps sums at any given 32 data points. The content in the buffer is, obviously, updated as the computation progresses. This allows computing each of the 32 keeps sums using the keep sum immediately prior and additionally using two sum operations per driftogram using data in the buffer. This technique also makes the amount of computation independent of the keep window size, and enables the in-place computation as data points already copied to the buffer can safely be overwritten in the "current" keeps bit array. After step 2220 has completed, the "current" keeps bit array includes keeps computed along the time and drift axes.

Step 2221 processing computes keeps along the mass axis using the keeps determined in step 2220 for LC/IMS/MS data and as determined in step 2218 for LC/MS data (e.g., whereby such keep values are included in the "current" keeps bit array). The computed keeps sums of step 2221 are final keeps sums as they include keeps sums along the three axes. Additionally, step 2222 may be performed to then compare the final keeps sums to zero and save the resultant keep flag to a different bit array: the "current" final keeps bit array. The computations of steps 2221 and 2222 may therefore not be in-place as the input and output data are in different arrays.

It should be noted that the mentioned output bit array, the "current" final keeps bit array, may be not specifically allocated in memory. In one embodiment, the "previous" keeps bit array may be used as the "current" final keeps bit array since the "previous" keeps bit array may no longer needed at this point in processing.

Processing of steps 2221 and 2222 may be performed by a single CUDA kernel. The kernel may use three-dimensional thread blocks with the x dimension along the mass axis, the y dimension along the time axis, and the z dimension along the drift axis. Each thread in the block may process a group of 32 consecutive data points of one scan within the mass sector. The thread may process the 32 points in the group one after another in series. For each data point of one scan within the "current" keeps bit array, the corresponding thread may read the points in the scan that are required to compute the keeps sum at that data point, and may compute the final keeps sum for that point. Then, the thread may also compute a flag for the final sum such that the flag is set if the final sum is above zero, and may also write the flag as one bit to the "current" final keeps bit array. Memory reads and writes may be coalesced in this kernel.

To minimize the number of operations, each thread performing steps 2221 and 2222 may use a circular buffer in shared memory. The thread may use the buffer to store the points required to compute the keeps sum at any given data point. The content in the buffer is, obviously, updated as the computation progresses. Using the data in the buffer, processing may compute each keeps sum using the keep sum computed immediately prior and two additional sum operations. As a result of using the circular buffer, the amount of computation may be characterized as independent of the keep window size. After step 2222 has completed, the "current" final keeps bit array contains the final keeps for the mass sector.

In step 2224, processing may be performed to reduce data. Step 2224 may use the "current" final keeps bit array (e.g., computed in step 2222) to remove data points from the "current" block arrays of the mass sector. Each data point in the "current" block arrays with an associated final keep flag set, is kept, and otherwise, the data point is removed from the block arrays. Given that the removed points leave gaps in the block arrays, this step may also be performed to move the position of the points kept such that they are all together (e.g., consecutive) in the block arrays. This re-positioning may be done only within each drift scan in the mass sector. After the completion of this step 2224, each drift scan has all kept points together at the start of the scan, and a number of unused points at the end. These gaps between the drift scans in the mass sector may be removed later in compact data processing performed in step 2108 of FIG. 21 described elsewhere herein.

Two CUDA kernels may be used to perform this data reduction step 2224, which may be further divided in three sub-steps. The first CUDA kernel may perform the first two sub-steps and the second CUDA kernel may perform the third sub-step. Both kernels may use three-dimensional thread blocks with the x dimension along the mass axis, the y dimension along the time axis, and the z dimension along the drift axis. The two kernels also need "temporary" block arrays to pass intermediate results from the first to the second kernel. These "temporary" block arrays may not be specifically allocated in memory. In an embodiment, the "lead" block arrays may no longer be needed at this point in processing and may alternatively be used as the foregoing "temporary" block arrays.

The first kernel may reduce the data in groups of 512 consecutive data points from a drift scan, where each group is divided in 32 sub-groups of 16 data points. Each thread in this kernel may perform the first sub-step mentioned above by reducing the 16 points in a sub-group. In the first sub-step, each thread may read, from the "current" block arrays and from the "current" final keeps bit array, each of the 16 points in a sub-group in series. Then, the thread may move all kept points such that they are all together at the beginning of the sub-group, possibly leaving unused positions at the end of the sub-group. In this case, the number of unused positions may be saved in the last positions because the next sub-step may use this information. Memory accesses may not be coalesced in this sub-step, but memory cache may be used mitigate any adverse performance affects. It should be noted that the movement of points in the first sub-step may be in-place as a result of the moved points being written to the "current" block arrays. This is possible because each thread moves the points in series, and the work of each thread is independent of the others.

The second sub-step may be performed collaboratively by sets of 32 threads in the first kernel. Each set of 32 threads may move the kept points in each sub-group, such that all kept points are together at the beginning of the group of 512 points, possibly leaving unused positions at the end of the group. In this case, the number of unused positions may be saved in the last position because the next sub-step may use this information. Memory accesses may be coalesced in this sub-step. Although the movement of points in this sub-step may be made in-place, an embodiment may alternative write the moved points to the "temporary" block arrays because these arrays are the input to the second kernel.

After the first kernel, each drift scan in the "temporary" block arrays may contain a sequence of groups of reduced points. As mentioned above, the size of these groups may be 512 points and the last position in each group may contain the number of unused positions in the group, or in other words, the number of removed points.

The third sub-step may be performed using the second kernel to perform the final reduction in each drift scan. The kept points in each group may be moved such that all kept points in each drift scan are together at the beginning of the scan, leaving a number of unused positions at the end of the scan. Each thread in the second kernel may read one point from the "temporary" block arrays and may move the point to its final, reduced, position in the "current" block arrays. In one embodiment described herein, this operation may not be done in-place because there is no guarantee that threads perform the move in sequence. Therefore, some thread may potentially overwrite an input point before another thread moves it. For this reason, the first kernel may output to the "temporary" block arrays, so the second kernel may output to the "current" blocks arrays. The foregoing results in an overall in-place data reduction operation. Memory accesses may be coalesced in this third sub-step.

After step 2224 has completed, each drift scan in the "current" block arrays may have all kept points together at the beginning of the scan, and a number of unused positions at the end of the scan equal to the number of removed points. The number of kept points in each scan may be saved in an array to be used in step 2108.

As an alternative for processing to reduce the data in step 2224, an embodiment may let each thread perform processing as described in the first sub-step above but on the entire drift scan instead only 16 data points. The operation may also be performed in-place. There are, however, two main problems with this approach (similar to what happens as described above in connection with steps 2212 and 2214). First, reads may be uncoalesced thereby incurring a performance penalty for memory accesses. Second, given that the mass sector dimensions along the time and drift axes may be typically much smaller than in the mass axis, it would lead to either small thread blocks, or a small number of thread blocks. In either case, there is an adverse impact on performance.

In step 2226, after all GPU processing (e.g., as denoted by 2130) in the device memory mass sector has finished, results and some data required for processing the next scan pack may be copied from the device memory mass sector to the host memory mass sector being processed. The data arrays copied may be the "current" block arrays, the "next" keeps bit array, and the array that contains the number of kept points in each drift scan in the mass sector.

Once step 2226 completes, the mass sector processing of FIG. 22 is complete and control then returns to FIG. 21 where processing continues at step 2104 of FIG. 21.

With reference again to FIG. 21, at step 2104, a determination is made as to whether there are any mass sectors remaining in the current scan pack being processed. If step 2104 evaluates to yes, control returns to step 2102. If step 2104 evaluates to no, control proceeds to step 2106 where a determination is made as to whether the scan pack index is greater than or equal to 2. The scan pack index may denote the number of the current scan pack in a sequence of scan packs of the raw data set being processed. If step 2106 evaluates to no, control proceeds to step 2112 described below. If step 2106 evaluates to yes, processing proceeds to step 2108 to compact data of each mass sector.

At step 2108, processing may remove the gaps between the drift scans of each mass sector that were left by step 2124 of FIG. 22. Step 2108 processing may be performed by the CPU one host memory mass sector at a time in sequence. For each host memory mass sector, the kept points in each drift scan in the "current" block arrays may be moved such that they are all together at the beginning of the block arrays. As this moving operation entails moving large memory blocks, it may be efficiently done in the CPU. After step 2108 has been performed for all mass sectors, the "current" block arrays of each host memory mass sector may include fully processed data with only the kept data points and without any gaps between them.

At step 2110, a determination is made as to whether there are any mass sectors remaining for the current scan pack. If step 2110 evaluates to yes, control proceeds to step 2108 to process the next host memory mass sector in the current scan pack. Otherwise, if step 2110 evaluates to no, control proceeds to step 2112.

Figure 24:
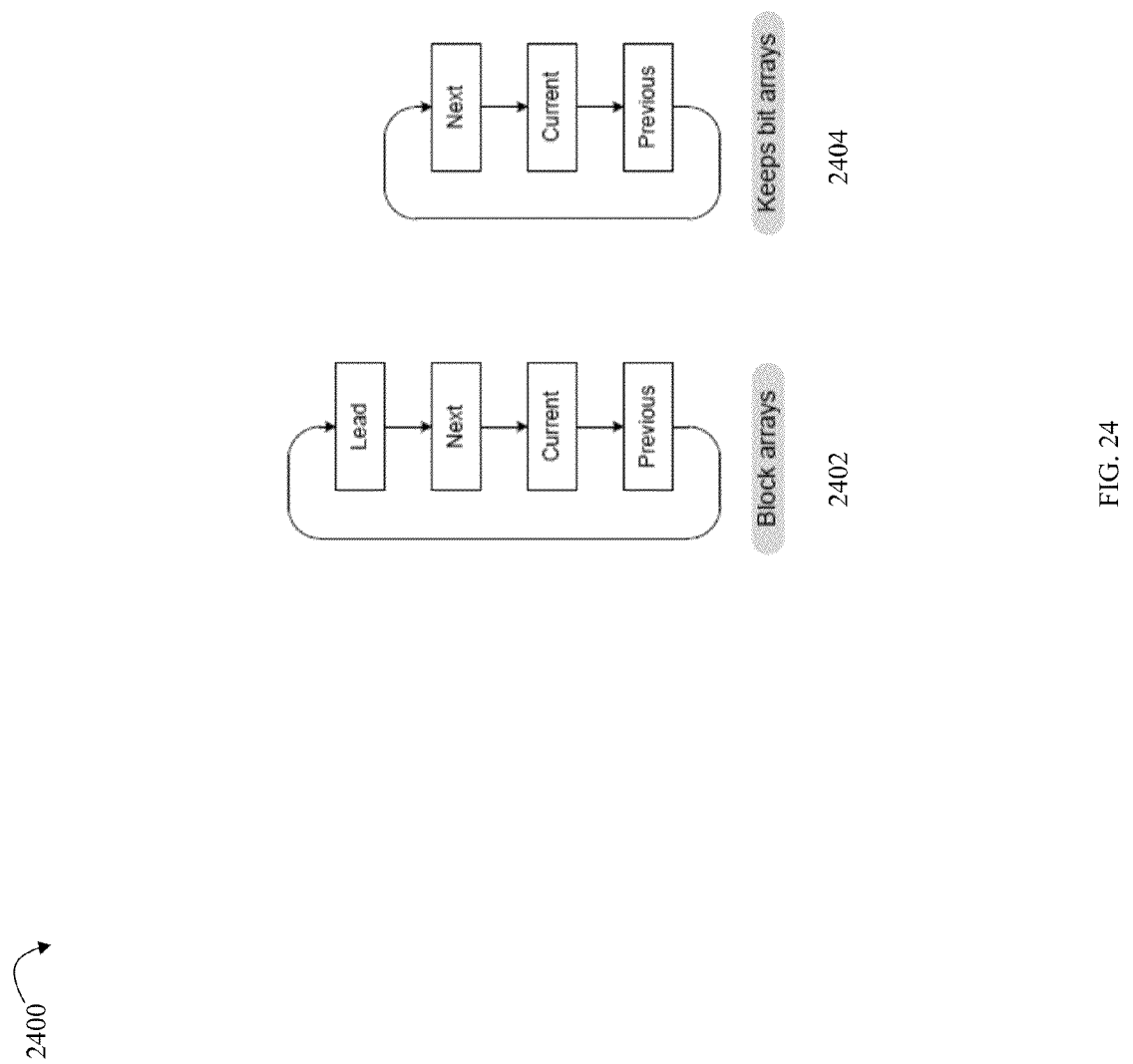
FIG. 24 is an example illustrating how data structures may be renamed in a round-robin manner in an embodiment in accordance with techniques herein.

Processing of step 2112 may be performed for each host memory mass sector of the current scan pack to rotate contents of data structures in preparation for the next scan pack. Such rotation may be performed in connection with structures, such as arrays, as the relative scan pack-naming of particular scan packs changes depending on which scan pack is being processed. Step 2112 prepares the mass sectors for processing the following scan pack. In each host memory mass sector, all arrays with some chronological notation may be moved appropriately. For example, the content in the "current" array of some type at the present scan pack, becomes the content in the "previous" array of that type when processing the following scan pack. This is what the vertical arrows in FIG. 11 (and also FIG. 24) indicate. The arrays moved in step 2112 processing may include the four sets of block arrays and the three keeps bit arrays described elsewhere herein. However, to avoid memory copies, an embodiment may not actually move or copy such data. Rather, the arrays may be renamed in a round-robin fashion as shown in FIG. 24. For example, with reference to 2402 of FIG. 24, the "lead" block arrays may be renamed as the "next" block arrays, the "next" block arrays may be renamed as the "current" block arrays, and the "current" block arrays may be renamed as the "previous" block arrays. Similarly, with reference to 2404 of FIG. 24, the keeps bit arrays may be renamed whereby the "next" keeps bit arrays may be renamed as the "current" keeps bit arrays and the "current" keeps bit arrays may be renamed as the "previous" keeps bit arrays.

With reference to FIG. 21, at step 2112, rotation of structures is performed for the next mass sector of the scan pack being processed. From step 2112, control proceeds to step 2114 where a determination is made as to whether there are any mass sectors of the current scan pack remaining which have not been processing in accordance with step 2112. If step 2114 evaluates to yes, control proceeds to step 2112 to process the next mass sector. If step 2114 evaluates to no, control of FIG. 21 processing ends and returns to continue execution following the step at which process scan pack was invoked (e.g., either following step 1812 or step 1822 depending on point of invocation).

Referring to FIG. 23, shown is a flowchart of processing steps performed to output a processed scan in an embodiment in accordance with techniques herein. The flowchart 2300 provides additional detailed processing of steps 1808 and 1818 of FIG. 18. An embodiment in accordance with techniques herein may output processed scans in real-time, either non-IMS or IMS full scans. The scans may be output one after another at the same rate the input raw data scans arrive and in the same order. As described herein, processing may not, however, output any processed scans until the input-output delay of three scan packs explained elsewhere herein has elapsed. Another consequence of this delay is the following. After the last input scan arrives, the remaining processed scans may be output at a higher rate, normally at the rate the receiving end can take them, because the output rate of scans is no longer synchronized with any arriving scans (e.g., there are no additional arriving scans).

In step 2302, an output scan may be created. At step 2304, the next mass sector of the output scan may be selected and the size of the output scan may be increased by the size of the current mass sector. At step 2306, a determination is made as to whether there are any remaining mass sectors of the current scan. If so, control proceeds to step 2304 to process the next mass sector. If step 2306 evaluates to no, control proceeds to step 2308. For each mass sector of the current scan to be output, step 2308 is performed to assemble the mass sector in the output scan. At step 2310, a determination is made as to whether there are any remaining mass sectors to be included in the output scan. If step 2310 evaluates to yes, control proceeds to step 2308. Otherwise, processing of FIG. 23 stops.

In connection with step 2308, the assembly performed may be characterized as an operation which is reverse from processing performed in input raw data scan processing (e.g., as in step 1804 of FIG. 18 and FIG. 20). Each output scan may be constructed by assembling as many pieces as there are host memory mass sectors whereby each drift scan may be assembled individually in reverse of what is described above (e.g. reverse of what is described herein in connection with splitting and assembling and as illustrated in FIG. 14). Each piece copied may be obtained from the "previous" block arrays of the corresponding mass sector. Recall that after the compact data step 2108, the "current" block arrays of each host memory mass sector contain fully processed scan data, and the rotate scan packs step 2112 renames the "current" block arrays as the "previous" block arrays.

Embodiments of the above described techniques may be used to compress data acquired from any mass spectrometer such as, for example, a time-of-flight (TOF) mass spectrometer. Additionally the instrument system may also optionally include an ion mobility spectrometer (IMS). Additionally, in connection with generating raw data used in connection with compression techniques herein, such mass spectrometers (alone or in combination with an IMS) may be used in series with a liquid chromatograph, as known in the art. Some embodiments may optionally omit the IMS in connection with generating LC/MS raw data rather than LC/IMS/MS raw data.

Referring to FIG. 25, shown is an example of a functional block diagram of components that may be used in an embodiment in accordance with techniques herein. The functional block diagram comprises a mass spectrometer 2510 (e.g., such as a TOF mass analyser), an acquisition system or module 28 for the mass spectrometer, an embedded computer system 48, and a host computer 2518.

Although not illustrated, the acquisition system 28 may include other suitable components known in the art such as, for example, an Analogue to Digital Converter (ADC), components to facilitate communications with the embedded computer system 48, components to store data acquired from the mass spectrometer 2510, and the like.

The mass spectrometer 2510 has an output 2520 connected to the acquisition system 28 over communication connection 26. The acquisition system 28 is connected to an input 46 of an embedded computer 48 such as, for example, by a gigabit Ethernet connection 50. The embedded computer 48 can perform further processing of the mass spectral data and also performs control functions of the mass spectrometer. It also has an output 57 connected to an input 58 of a processor core (e.g., CPU) 54 within a host computer 2518 by a second gigabit Ethernet connection 59. The host computer 2518 may include processing core (e.g., CPU) 54, one or more GPUs 2512, access to a storage area 52 for storing the raw mass spectral data, and a user interface 56 for control of data extraction. Storage area 52 may be, for example, a data store such as a data base, a file, and the like, for storing the raw data compressed using techniques herein. More generally, element 52 may represent any form of computer storage medium.

In connection with the embodiment of FIG. 25, code performing techniques herein may be executed on the host computer 2518 using the CPU 54 and one or more GPUs 2512. Raw data, which may be zero-compressed, may be obtained for processing by code executing in the CPU and GPU(s) of 2518 from the acquisition system or module 28 such as, for example, using a defined software interface as described elsewhere herein.

It will be appreciated by a person skilled in the art that the components of FIG. 25 may be adapted to handle multiple signals from a single detector as well as multiple signals from multiple detectors.

The host computer 2518 may be any commercially available or proprietary computer system, processor board, ASIC (application specific integrated circuit), or other component which includes illustrated components such as a CPU, GPU or other parallel processing component, computer storage medium, and the like. Generally, a processor, such as a CPU or GPU, may execute code obtained from a computer readable medium. The processor, when executing the code, may cause the processor and/or other components to perform processing steps as described herein for obtaining and compressing the raw data.

Additionally, as will be appreciated by those skilled in the art, a computer system or other component having a suitable processor, control means, electrical or signal connections and the like, may be used to facilitate automated and/or manual control and operation of the various instruments and components.

It should also be noted that an embodiment may include components for performing the techniques herein embodied in different configurations than as illustrated in the example of FIG. 25. For example, as a variation, the acquisition system 28 may include components such as one or more GPUs and a processor unit functioning in a manner similar to the CPU of 2518. In such an embodiment, the techniques herein may be performed by such components of the acquisition system 28. The foregoing and other variations will be readily appreciated by those skilled in the art.

It should be noted that different suitable methods may be used with a system as described herein to obtain the raw data that is compressed using techniques herein. For example, in one embodiment, the MS instrument may operate in accordance with an alternating scanning mode providing for effectively simultaneous mass analysis of both precursor and product ions. For example, a portion of a precursor ion may be fragmented to form product ions, and the precursor and product ions are substantially simultaneously analyzed, for example, in rapid succession. One approach to such alternating, effectively simultaneous analysis, is described in U.S. Pat. No. 6,717,130 to Bateman, et al. ("Bateman"), which is incorporated herein by reference and describes application of an alternating voltage to a collision cell of an MS module to regulate fragmentation. Thus, depending on the experiment performed and operation of the MS, an embodiment may use the techniques described in the Bateman '130 patent or other suitable technique.

Figure 26:
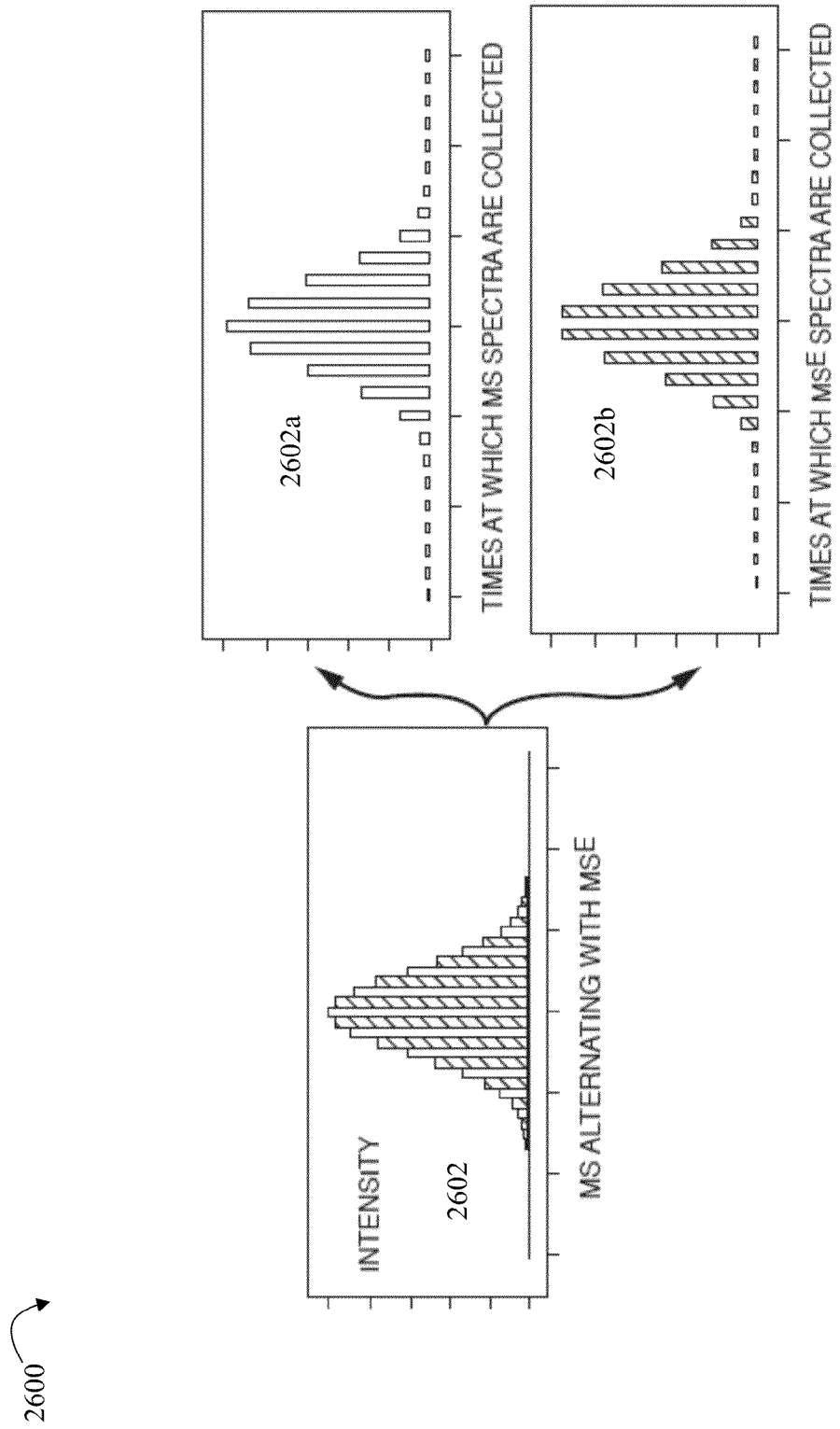
FIG. 26 is an example illustrating mass spectra collected when operating a mass spectrometer in an alternating scan mode in an embodiment in accordance with techniques herein.

Referring to FIG. 26, shown are three related graphs that illustrate the collection of mass spectra during a period of time that covers a peak of a precursor. A first graph 2602 illustrates the alternating collection over time of low-energy spectra (i.e., spectra from unfragmented precursors, labeled "MS") and elevated-energy spectra (i.e., spectra from fragmented precursors, that is, product ions, labeled "MS$^E$".) Second and third graphs 2602a and 2602b respectively illustrate the MS and MS$^E$ spectral collection times and the reconstruction of the desorption temperature peak associated with the precursor as may be generated using an alternating scanning technique described in the Bateman '130 patent.

The reconstructed peak represents the peak profile of a single precursor. The horizontal axis corresponds to chromatographic retention time/of the peak profile. The vertical axis corresponds to arbitrary units of intensity associated with the time-varying concentration of the precursor.

A precursor thus produces ions in both low- and elevated-energy modes. The ions produced in the low-energy mode are primarily those of the precursor ions in possibly different isotopic and charge states. In elevated-energy mode, the ions are primarily different isotopes and charge states of the fragment, or product, ions of those precursors. High-energy mode can also be referred to as elevated-energy mode.

In the graph 2602, the alternating white and black bars thus represent the times at which spectra are collected with low and high (or elevated)-energy voltages of the peak. The low-energy (LE) graph 2602a depicts the times at which a low-energy voltage is applied in the collision cell resulting in low-energy spectra. The high or elevated energy (EE) graph 2602b depicts the times at which an elevated-energy voltage is applied in the collision cell resulting in elevated-energy spectra.

In connection with obtaining raw data which may be compressed using techniques described herein, an embodiment may operate the mass spectrometer in an alternating scan mode whereby the instrument switches in rapid succession between the low energy (LE) cycle or mode (e.g., used to generate spectra containing ions primarily from unfragmented precursors) and the elevated-energy (EE) mode (e.g., used to generate spectra containing ions which are primarily fragmented precursors or product ions). The foregoing may be accomplished by rapidly switching between appropriate voltages applied to the collision cell of the mass spectrometer. For example, the mass spectrometer may be switched between the low energy mode and the elevated energy mode in accordance with a protocol that alternates in repeated succession to apply the low energy mode and the elevated energy mode with a sufficient frequency such that each of the low energy mode and the elevated energy mode is applied a plurality of times during a chromatographic peak width.

In this manner, a raw data file obtained by operating the mass spectrometer as just described in alternating scan mode may include both low energy and elevated energy MS data. Alternatively, and more generally, the raw data file may be obtained using any suitable techniques using any suitable mass spectrometer.

It should be noted that techniques are described herein for compressing a raw data set having two or three dimensions of separation. More generally, techniques herein may be used with any suitable data set and any number of N dimensions, where N may be an integer greater than 1.

The raw data sets, which are compressed using techniques herein, may be further subjected to any suitable post processing. For example, such post processing may include peak detection, determining related ions, and the like. Associating ions having a common retention time is described, for example, in WO 2006/133191, Methods and Apparatus for Performing Retention-Time Matching, Gorenstein et al., (the '191 patent application), which is incorporated by reference herein. Mass spectra obtained using LC/MS may be processed to detect peaks denoting detected ions such as described in WO2005/079263, APPARATUS AND METHOD FOR IDENTIFYING PEAKS IN LIQUID CHROMATOGRAPHY/MASS SPECTROMETRY DATA AND FOR FORMING SPECTRA AND CHROMATOGRAMS, Gorenstein et al., (the '263 patent application), and WO2007/140327, ION DETECTION AND PARAMETER ESTIMATION FOR N-DIMENSIONAL DATA, Gorenstein et al., ("the '327 patent application"), both of which are incorporated by reference herein.

Peak detection (used to determine peaks and thus detected ions in mass spectra) in connection with N-Dimensional data such as may be used with LC/IMS/MS and LC/MS is described, for example, in the '327 patent application. In other words, the peak detection techniques such as described in the '327 patent application may be used to determine peaks corresponding to detected ions of analyzed mass spectral data. Using the techniques of the '327 patent application to analyze such mass spectra, each detected ion is characterized by various characteristics or parameters and has an ion intensity peak or apex at a point in time. Parameters optionally used to characterize a peak profile of a given ion may include the time of initial detection (liftoff), normalized slope, the time of inflection points relative to the time of the peak apex, the time of maximum response (peak apex), the peak width, at inflection points, at full-width-at-half-maximum (FWHM), peak shape asymmetry, and the time of the final detection (touch down) to name only a few. All ions in the mass spectral data having a detected ion intensity peak or apex at a point in time associated with the same chromatographic retention time may be determined as associated or related in that such ions derive or originate from the same common component of a sample. Once peak detection has been performed and properties of detected ions determined, proteins, peptides or other molecules may be identified such as, for example, by comparing properties for one or more detected ions to information in a database of known proteins, peptides or other large or small molecules. The foregoing are some examples of post processing that may be performed on raw data sets compressed using techniques herein.

The techniques herein may be performed by executing code which is stored on any one or more different forms of computer-readable media. Computer-readable media may include different forms of volatile (e.g., RAM) and non-volatile (e.g., ROM, flash memory, magnetic or optical disks, or tape) storage which may be removable or non-removable.

The foregoing disclosure of embodiments of the present invention has been presented for purposes of illustration and description. It is not intended to be exhaustive or to limit the techniques described herein to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments, the specification may have presented the method and/or processes described herein as a particular sequence of steps. However, to the extent that the method or process does not rely on the particular order of steps set forth herein, the method or process should not be construed as limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process should not be limited to the performance of their steps in the order written, and one skilled in the art can readily appreciate that the sequences may be varied and still remain within the spirit and scope of the present invention.

What is claimed is:

1. A method of performing data compression comprising:
receiving a first data set including a plurality of data points in a plurality of dimensions, wherein each data point in the first data set has an associated intensity;
performing first processing to determine a second set of final sums for the plurality of data points in the first data set, wherein, for each data point in the first data set, a corresponding final sum of the second set is determined that is a sum of intensities associated with a first portion of data points, wherein the first portion of data points for which the intensities are summed for said each data point are included within a geometric shape centered on said each data point, said first processing further including:
for each of the plurality of dimensions, determining a plurality of partial sums; and
performing second processing to determine a final set of final combined keep values, wherein each of the final combined keep values in the final set corresponds to a different one of the plurality of data points in the first data set and denotes whether to keep or otherwise remove said different one of the plurality of data points from the first data set, said second processing further including:
for each of the plurality of dimensions, determining a plurality of combined keep values.

2. The method of claim 1, wherein said first processing includes:
determining, in parallel, a first plurality of first partial sums for a first of the plurality of dimensions; and
determining, in parallel, a second plurality of second partial sums for a second of the plurality of dimensions, and wherein, the plurality of dimensions is two and said second plurality of partial sums is used as the second set of final sums.

3. The method of claim 1, wherein said first processing includes:
determining, in parallel, a first plurality of first partial sums for a first of the plurality of dimensions;
determining, in parallel, a second plurality of second partial sums for a second of the plurality of dimensions; and
determining, in parallel, a third plurality of third partial sums for a third of the plurality of dimensions, and wherein, the plurality of dimensions is three and the third plurality of partial sums is used as the second set of final sums.

4. The method of claim 1, wherein said second processing includes:
determining, in parallel, a first plurality of first combined keep values for a first of the plurality of dimensions; and
determining, in parallel, a second plurality of second combined keep values for a second of the plurality of dimensions, and wherein, the plurality of dimensions is two and said second plurality of combined keep values is used as the final set of final keep values.

5. The method of claim 1, wherein said second processing includes:
determining, in parallel, a first plurality of first combined keep values for a first of the plurality of dimensions;
determining, in parallel, a second plurality of second combined keep values for a second of the plurality of dimensions; and
determining, in parallel, a third plurality of third combined keep values for a third of the plurality of dimensions, and wherein, the plurality of dimensions is three and the third plurality of combined keep values is used as the final set of final keep values.

6. The method of claim 1, further comprising:
determining a third set of initial keep values for the second set of sums, wherein for each sum in the second set corresponding to one of the data points of the first data set, a corresponding initial keep value of the third set denotes whether said each sum in the second set of sums exceeds a threshold, wherein a first set of keep values for a first of said plurality of dimensions is determined using initial keep values including those of the third set.

7. An apparatus comprising:
a plurality of analytical modules;
a control unit in communication with the plurality of analytical modules, the control unit comprising a processor and a memory for storing a plurality of instructions which, when executed by the processor, causes execution of a method comprising:
receiving a first data set including a plurality of data points in a plurality of dimensions, wherein each data point in the first data set has an associated intensity;
performing first processing to determine a second set of final sums for the plurality of data points in the first data set, wherein, for each data point in the first data set, a corresponding final sum of the second set is determined that is a sum of intensities associated with a first portion of data points, wherein the first portion of data points for which the intensities are summed for said each data point are included within a geometric shape centered on said each data point, said first processing further including:
for each of the plurality of dimensions, determining a plurality of partial sums; and
performing second processing to determine a final set of final combined keep values, wherein each of the final combined keep values in the final set corresponds to a different one of the plurality of data points in the first data set and denotes whether to keep or otherwise remove said different one of the plurality of data points from the first data set, said second processing further including:
for each of the plurality of dimensions, determining a plurality of combined keep values.

8. The apparatus of claim 7, wherein the plurality of analytical modules includes a chromatography module, an ion-mobility module, and a mass spectrometry module, and wherein the first data set is included in a raw data set generated as a result of performing an experiment to analyze a sample using at least the chromatography module and the mass spectrometry module.

9. A method of performing data compression comprising:
receiving a first data set including a plurality of data points in a plurality of dimensions, wherein each data point in the first data set has an associated intensity;
determining a second set of sums for the plurality of data points in the first data set, wherein, for each data point in the first data set, a corresponding sum of the second set is determined that is a sum of intensities associated with a first portion of data points, wherein the first portion of data points for which the intensities are summed for said each data point are included within a geometric shape centered on said each data point;
performing first processing to determine a final set of final combined keep values, wherein each of the final combined keep values in the final set corresponds to a different one of the plurality of data points in the first data set and denotes whether to keep or otherwise remove said different one of the plurality of data points from the first data set, said first processing further including:

determining a third set of initial keep values for the second set of sums, wherein for each sum in the second set corresponding to one of the data points of the first data set, a corresponding initial keep value of the third set denotes whether said each sum in the second set of sums exceeds a threshold; and for a first of the plurality of dimensions, determining a first plurality of first combined keep values using initial keep values including those of the third set, wherein each of the first plurality of first combined keep values is associated with a corresponding one of the data points of the first data set, wherein said each first combined keep value associated with said corresponding one data point of the first set represents a combination of initial keep values associated with data points which are included in a line segment that is oriented along said first dimension and is centered on said corresponding one of the data points of the first set; and for a second of the plurality of dimensions, determining a second plurality of second combined keep values using first combined keep values including the first plurality of first combined keep values, wherein each of the second plurality of second combined keep values is associated with a corresponding one of the data points of the first data set, wherein said each second combined keep value associated with said corresponding one data point of the first set represents a combination of first combined keep values associated with data points which are included in a line segment that is oriented along said second dimension and is centered on said corresponding one of the data points of the first set.

10. The method of claim 9, further comprising:
performing second processing in parallel for each final combined keep value in said final set corresponding to a different one of the plurality of data points in the first data set, wherein said second processing includes determining whether said each final combined keep value is greater than zero, and if not, determining that said different one of the plurality of data points is removed from the first set.

11. The method of claim 10, wherein said plurality of dimensions is two and the second plurality of second combined keep values is used as the final set of final combined keep values.

12. The method of claim 10, wherein said plurality of dimensions is three and the method further includes:
determining, using second combined keep values including the second plurality of second combined keep values, a third plurality of third combined keep values for a third of the plurality of dimensions, wherein said third plurality of third combined keep values is used as the final set of final combined keep values.

13. The method of claim 10, wherein said determining the first plurality of first combined keep values includes performing processing to determine, in parallel, at least a portion of the first plurality of first combined keep values for the first dimension, and wherein said determining the second plurality of second combined keep values includes performing processing to determine, in parallel, at least a portion of the second plurality of second combined keep values for the second dimension, and wherein the third set of keep values are determined in parallel in said step of determining the third set of keep values.

14. The method of claim 10, wherein the geometric shape is any of a rectangle and a rectangular prism.

15. The method of claim 10, wherein the plurality of dimensions of the first data set is at least two and includes a first dimension representing mass and a second dimension representing chromatographic retention time.

16. The method of claim 15, wherein the first data set includes data produced as a result of performing an experiment for analyzing a sample that includes performing a chromatographic separation and mass spectral analysis.

17. The method of claim 16, wherein the plurality of dimensions of the first data set is at least three and further includes a third dimension representing drift time.

18. The method of claim 17, wherein the experiment further includes performing ion mobility spectrometry.

19. The method of claim 16, wherein the first data set is a raw data set produced by an instrument used in performing the experiment.

20. The method of claim 16, wherein the first data set corresponds to a first mass sector having a first corresponding mass range, said first mass sector being one of a plurality of mass sectors included in a first scan pack of a plurality of scan packs, each of said plurality of scan packs including a plurality of scans of data generated from performing the experiment.

21. The method of claim 20, further comprising:
extracting, from the first scan pack of the plurality of scan packs, said plurality of mass sectors each having a corresponding mass range.

22. The method of claim 21, wherein each mass sector of the plurality of mass sectors is stored in a first memory of a computer and the method further comprising:
reading from the first memory one of the mass sectors of the plurality of mass sectors, wherein said reading is performed by executing code on a processing unit of the computer whereby the processing unit executes instructions serially,
copying said one mass sector into a second memory of a device, said device including a second processing unit that performs parallel processing, wherein said second memory is configured for use by said second processing unit when performing parallel processing and wherein said first memory is not configured for use by said second processing unit;
determining, using said second processing unit and said one mass sector stored in the second memory, which one or more data points of said one mass sector are removed from the first data set thereby generating a compressed form of data points of said one mass sector; and
copying the compressed form of the data points of said one mass sector from the second memory to the first memory.

23. The method of claim 22, wherein the second processing unit is a graphics processing unit.

24. The method of claim 22, wherein the second processing unit executes code that performs processing including said determining the second set of sums for the plurality of data points in the first data set, said determining the third set of keep values for the second set of sums, said first processing and said second processing.

25. The method of claim 10, wherein said determining the second set of sums for the plurality of data points in the first data set further includes:

determining, for each of the plurality of dimensions, a plurality of partial sums in parallel for data points of the first data set.

26. The method of claim 25, wherein said determining the second set of sums for the plurality of data points in the first data set further includes:
   determining, in parallel, a first plurality of first partial sums, wherein each of the first plurality of first partial sums is a first partial sum for a different one of the plurality of data points of the first set, wherein the first partial sum for said different one of the plurality of data points of the first set is a sum of intensities associated with data points of the first portion that are included in a line segment of the geometric shape centered on said each data point whereby the line segment is oriented along a first of the plurality of dimensions; and
   determining, in parallel, a second plurality of second partial sums using first partial sums including the first plurality of first partial sums, wherein each of the second plurality of second partial sums is a second partial sum for a different one of the plurality of data points of the first set, wherein the second partial sum for said different one of the plurality of data points of the first set is a sum of first partial sums associated with data points of the first portion that are included in a line segment of the geometric shape centered on said each data point whereby the line segment is oriented along a second of the plurality of dimensions.

27. The method of claim 26, wherein the plurality of dimensions is two and the second plurality of partial sums is the second set of sums.

28. The method of claim 26, wherein the plurality of dimensions is three and the method further includes:
   determining, in parallel, a third plurality of third partial sums using second partial sums including the second plurality of second partial sums, wherein each of the third plurality of third partial sums is a third partial sum for a different one of the plurality of data points of the first set, wherein the third partial sum for said different one of the plurality of data points of the first set is a sum of second partial sums associated with data points of the first portion that are included in a line segment of the geometric shape centered on said each data point whereby the line segment is oriented along a third of the plurality of dimensions, said third plurality of partial sums being used as the second set of sums.

29. The method of claim 10, wherein each of the plurality of combined keep values for said each dimension is determined by adding keep values.

30. The method of claim 10, wherein each of the plurality of combined keep values for said each dimension is determined by performing a logical OR operation of keep values.

31. An apparatus comprising:
   a plurality of analytical modules;
   a control unit in communication with the plurality of analytical modules, the control unit comprising a processor and a memory for storing a plurality of instructions which, when executed by the processor, causes execution of a method comprising:
   receiving a first data set including a plurality of data points in a plurality of dimensions, wherein each data point in the first data set has an associated intensity;
   determining a second set of sums for the plurality of data points in the first data set, wherein, for each data point in the first data set, a corresponding sum of the second set is determined that is a sum of intensities associated with a first portion of data points, wherein the first portion of data points for which the intensities are summed for said each data point are included within a geometric shape centered on said each data point;
   performing first processing to determine a final set of final combined keep values, wherein each of the final combined keep values in the final set corresponds to a different one of the plurality of data points in the first data set and denotes whether to keep or otherwise remove said different one of the plurality of data points from the first data set, said first processing further including:
      determining a third set of initial keep values for the second set of sums, wherein for each sum in the second set corresponding to one of the data points of the first data set, a corresponding initial keep value of the third set denotes whether said each sum in the second set of sums exceeds a threshold; and
      for a first of the plurality of dimensions, determining a first plurality of first combined keep values using initial keep values including those of the third set, wherein each of the first plurality of first combined keep values is associated with a corresponding one of the data points of the first data set, wherein said each first combined keep value associated with said corresponding one data point of the first set represents a combination of initial keep values associated with data points which are included in a line segment that is oriented along said first dimension and is centered on said corresponding one of the data points of the first set; and
      for a second of the plurality of dimensions, determining a second plurality of second combined keep values using first combined keep values including the first plurality of first combined keep values, wherein each of the second plurality of second combined keep values is associated with a corresponding one of the data points of the first data set, wherein said each second combined keep value associated with said corresponding one data point of the first set represents a combination of first combined keep values associated with data points which are included in a line segment that is oriented along said second dimension and is centered on said corresponding one of the data points of the first set.

32. The apparatus of claim 31, wherein the method further comprises:
   performing second processing in parallel for each final combined keep value in said final set corresponding to a different one of the plurality of data points in the first data set, wherein said second processing includes determining whether said each final combined keep value is greater than zero, and if not, determining that said different one of the plurality of data points is removed from the first set.

33. The apparatus of claim 32, wherein the plurality of analytical modules includes a chromatography module, an ion-mobility module, and a mass spectrometry module, and wherein the first data set is included in a raw data set generated as a result of performing an experiment to analyze a sample using at least the chromatography module and the mass spectrometry module.

34. The apparatus of claim 33, wherein the experiment includes performing, with respect to said sample, chromatographic separation using the chromatography module, ion mobility spectrometry using the ion-mobility module, and mass spectrometry using the mass-spectrometry module.

* * * * *